(12) United States Patent
Akiyama et al.

(10) Patent No.: US 11,217,617 B2
(45) Date of Patent: Jan. 4, 2022

(54) IMAGING ELEMENT AND SOLID-STATE IMAGING DEVICE

(71) Applicant: Sony Semiconductor Solutions Corporation, Kanagawa (JP)

(72) Inventors: Kentaro Akiyama, Kanagawa (JP); Takuma Matsuno, Kumamoto (JP); Takashi Terada, Kumamoto (JP); Tomohiro Yamazaki, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/615,884

(22) PCT Filed: Apr. 18, 2018

(86) PCT No.: PCT/JP2018/015969
§ 371 (c)(1),
(2) Date: Nov. 22, 2019

(87) PCT Pub. No.: WO2018/235416
PCT Pub. Date: Dec. 27, 2018

(65) Prior Publication Data
US 2020/0152683 A1 May 14, 2020

(30) Foreign Application Priority Data
Jun. 21, 2017 (JP) .............................. JP2017-121231

(51) Int. Cl.
*H01L 27/146* (2006.01)
*G02B 5/30* (2006.01)

(52) U.S. Cl.
CPC .................. *H01L 27/14625* (2013.01); *H01L 27/14621* (2013.01); *H01L 27/14623* (2013.01);
(Continued)

(58) Field of Classification Search
CPC ......... H01L 27/14625; H01L 27/14621; H01L 27/14623; H01L 27/14627;
(Continued)

(56) References Cited

U.S. PATENT DOCUMENTS 6,504,188 B1 * 1/2003 Maruyama ........ H01L 27/14627
257/222
8,759,742 B2 * 6/2014 Yokogawa ......... H04N 9/04559
250/225

(Continued)

FOREIGN PATENT DOCUMENTS

JP 2002-118245 A 4/2002
JP 2009-188316 A 8/2009
(Continued)

*Primary Examiner* — Vu A Vu
(74) *Attorney, Agent, or Firm* — Michael Best & Friedrich LLP

(57) ABSTRACT

An imaging element of the present disclosure includes: a photoelectric conversion section 21 provided in a substrate 30; a polarizer 50 formed over the photoelectric conversion section 21, with a single ground insulating layer 31 interposed therebetween; and a light shielding section 41A formed on an upper side of a peripheral region 21' around the photoelectric conversion section 21.

10 Claims, 63 Drawing Sheets

(52) U.S. Cl.
CPC ............... *H01L 27/14627* (2013.01); *H01L 27/14645* (2013.01); *H01L 27/14685* (2013.01); *G02B 5/3058* (2013.01)

(58) Field of Classification Search
CPC ......... H01L 27/14645; H01L 27/14685; H01L 27/14647; H01L 27/14612; H01L 27/14629; G02B 5/3058; G02B 5/201; H04N 5/369
USPC ....................................................... 257/432
See application file for complete search history.

(56) References Cited

U.S. PATENT DOCUMENTS

| | | | |
|---|---|---|---|
| 9,184,197 B2 * | 11/2015 | Kusaka | H04N 5/378 |
| 9,252,174 B2 * | 2/2016 | Tanaka | H01L 27/14621 |
| 2007/0188635 A1 * | 8/2007 | Yamaguchi | H01L 27/14627 |
| | | | 348/272 |

FOREIGN PATENT DOCUMENTS

| | | |
|---|---|---|
| JP | 2010-263158 A | 11/2010 |
| JP | 2016-164956 A | 9/2016 |
| JP | 2017-076684 A | 4/2017 |

* cited by examiner

FIG.19A
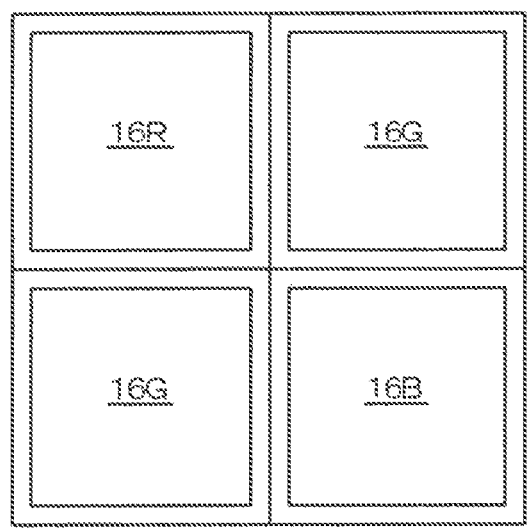
FIG.19B
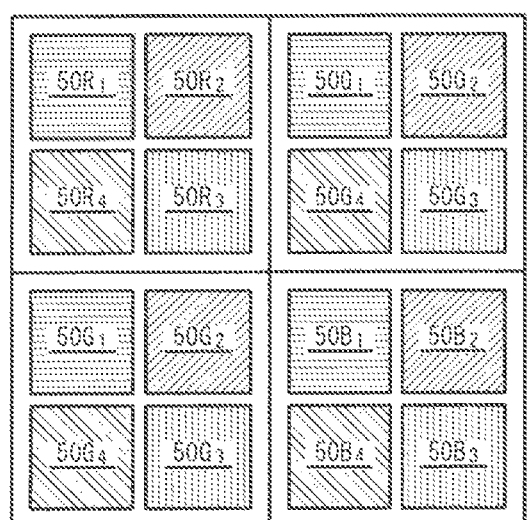
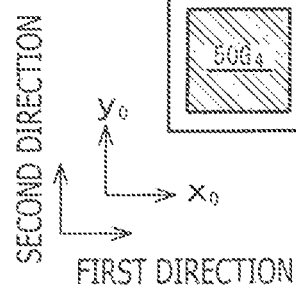

FIG.36

IMAGING ELEMENT AND SOLID-STATE IMAGING DEVICE

TECHNICAL FIELD

The present disclosure relates to an imaging element and a solid-state imaging device including such an imaging element.

BACKGROUND ART

A solid-state imaging device having a plurality of imaging elements (photoelectric conversion elements) provided with a wire grid polarizer (WGP) has been know, for example, from JP 2017-076684A. The imaging element includes, for example, a CCD (Charge Coupled Device) or a CMOS (Complementary Metal Oxide Semiconductor) image sensor. The wire grid polarizer has a line-and-space structure. The direction in which the line-and-space structure extends is referred to as "first direction" for convenience' sake, and the repetition direction of the line parts (the direction orthogonal to the first direction) is referred to as "second direction" for convenience' sake.

As a conceptual diagram is illustrated in FIG. 64, in the case where the formation pitch $P_0$ of the wire grid is significantly smaller than the wavelength of an incident electromagnetic wave, the electromagnetic wave vibrating in a plane parallel to the extending direction of the wire grid (the first direction) is selectively reflected or absorbed by the wire grid. Here, the distance between a line part and a line part (the distance or length of a space part along the second direction) is taken as the formation pitch $P_0$ of the wire grid. Then, as illustrated in FIG. 64, while a vertical polarized light component and a horizontal polarized light component are included in the electromagnetic wave (light) reaching the wire grid polarizer, the electromagnetic wave having passed through the wire grid polarizer is a linearly polarized light in which the vertical polarized light component is predominant. Paying attention to the visible light wavelength band, in the case where the formation pitch $P_0$ of the wire grid is significantly smaller than the effective wavelength $\lambda_{eff}$ of the electromagnetic wave incident on the wire grid polarizer, the polarized light component polarized along a plane parallel to the first direction is reflected or absorbed at the front surface of the wire grid. On the other hand, when the electromagnetic wave having the polarized light component polarized along a plane parallel to the second direction is incident on the wire grid, an electric field propagated on the front surface of the wire grid is transmitted (emitted) from the back surface of the wire grid while keeping the same wavelength as the incident wavelength and the same polarization orientation. Note that let the average refractive index obtained based on the materials present in the space part be $n_{ave}$, then the effective wavelength $\lambda_{eff}$ is represented by $(\lambda_0/n_{ave})$. The average refractive index $n_{ave}$ is a value obtained by summing up the products of the refractive index and the volume of the materials present in the space part and dividing the sum by the volume of the space part. In the case where the value of the wavelength ho is constant, as the value of $n_{ave}$ is smaller, the value of the effective wavelength $\lambda_{eff}$ is larger, and, therefore, the value of the formation pitch $P_0$ can be enlarged. In addition, an increase in the value of $n_{ave}$ leads to a lowering in transmittance and a lowering in extinction ratio of the wire grid polarizer.

Incidentally, the light incident on an outer peripheral portion of the wire grid polarizer is liable to leak into the adjacent imaging elements differing in polarization direction. When such a phenomenon is generated, extinction ratio of the wire grid polarizer is lowered. In JP 2017-076684A, for example, as illustrated in FIG. 9, a planarization layer 45 and a ground insulating layer 46 are formed over a photoelectric conversion region (light receiving region) 41, and a wire grid polarizer 50 is formed over the ground insulating layer 46. In addition, a light shielding layer 47 is formed over the planarization layer 45.

CITATION LIST

Patent Literature

[PTL 1]
JP 2017-076684A

SUMMARY

Technical Problem

However, even in the above-mentioned structure in JP 2017-076684A, light may leak into the adjacent imaging elements, in some cases.

Accordingly, it is an object of the present disclosure to provide an imaging element having a configuration and structure such that leaking of light into adjacent imaging elements (polarization crosstalk) can be securely prevented, and a solid-state imaging device including such imaging elements.

Solution to Problem

In order to achieve the above object, the present disclosure provides an imaging element including:
    a photoelectric conversion section provided in a substrate;
    a polarizer formed over the photoelectric conversion section, with a single ground insulating layer interposed therebetween; and
    a light shielding section (which is referred to as "first light shielding section" for convenience' sake in some cases) formed on an upper side of a peripheral region around the photoelectric conversion section.

In order to achieve the above object, the present disclosure provides a solid-state imaging device including:
    a plurality of imaging elements arranged in a two-dimensional matrix,
    in which each of the imaging elements includes
    a photoelectric conversion section provided in a substrate,
    a polarizer formed over the photoelectric conversion section, with a single ground insulating layer interposed therebetween, and
    a light shielding section (first light shielding section) formed on an upper side of a peripheral region around the photoelectric conversion section.

Advantageous Effects of Invention

In the imaging element of the present disclosure or the imaging element of the present disclosure provided in the solid-state imaging device of the present disclosure (these will hereinafter be generically referred to as "the imaging elements of the present disclosure"), the polarizer is formed over the photoelectric conversion section with the single ground insulating layer interposed therebetween; therefore, the distance between the polarizer and the photoelectric conversion section can be minimized, and, as a result, leaking of light into the adjacent imaging elements (polarization crosstalk) can be prevented more securely. Note that the effects described herein are illustrative and are not limitative, and additional effects may be present.

BRIEF DESCRIPTION OF DRAWINGS

FIGS. 19A and 19B are schematic partial plan views of wavelength selecting means (color filter layer) and a wire grid polarizer in the solid-state imaging device of Example 1.

Figure 36:
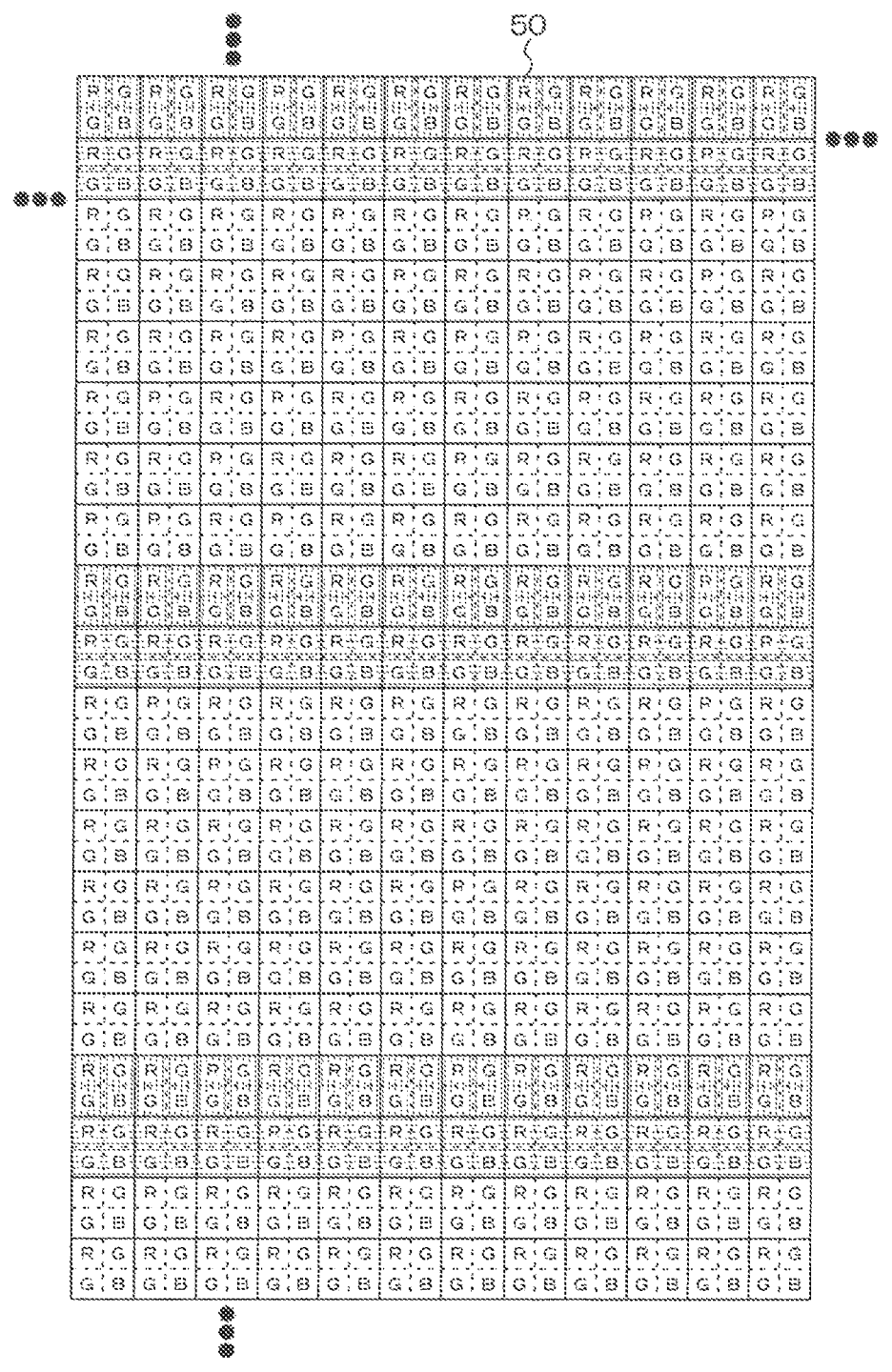

FIG. 36 is a plan layout drawing of a modification of photoelectric conversion elements having a Bayer array.

[FIG. 62]

FIG. 63 is a schematic partial perspective view of a modification of a wire grid polarizer constituting the stacked type imaging element of the present disclosure or the imaging element of the present disclosure or the like.

FIG. 64 is a conceptual diagram for explaining light transmitted through a wire grid polarizer and the like.

DESCRIPTION OF EMBODIMENTS

Figure 1:
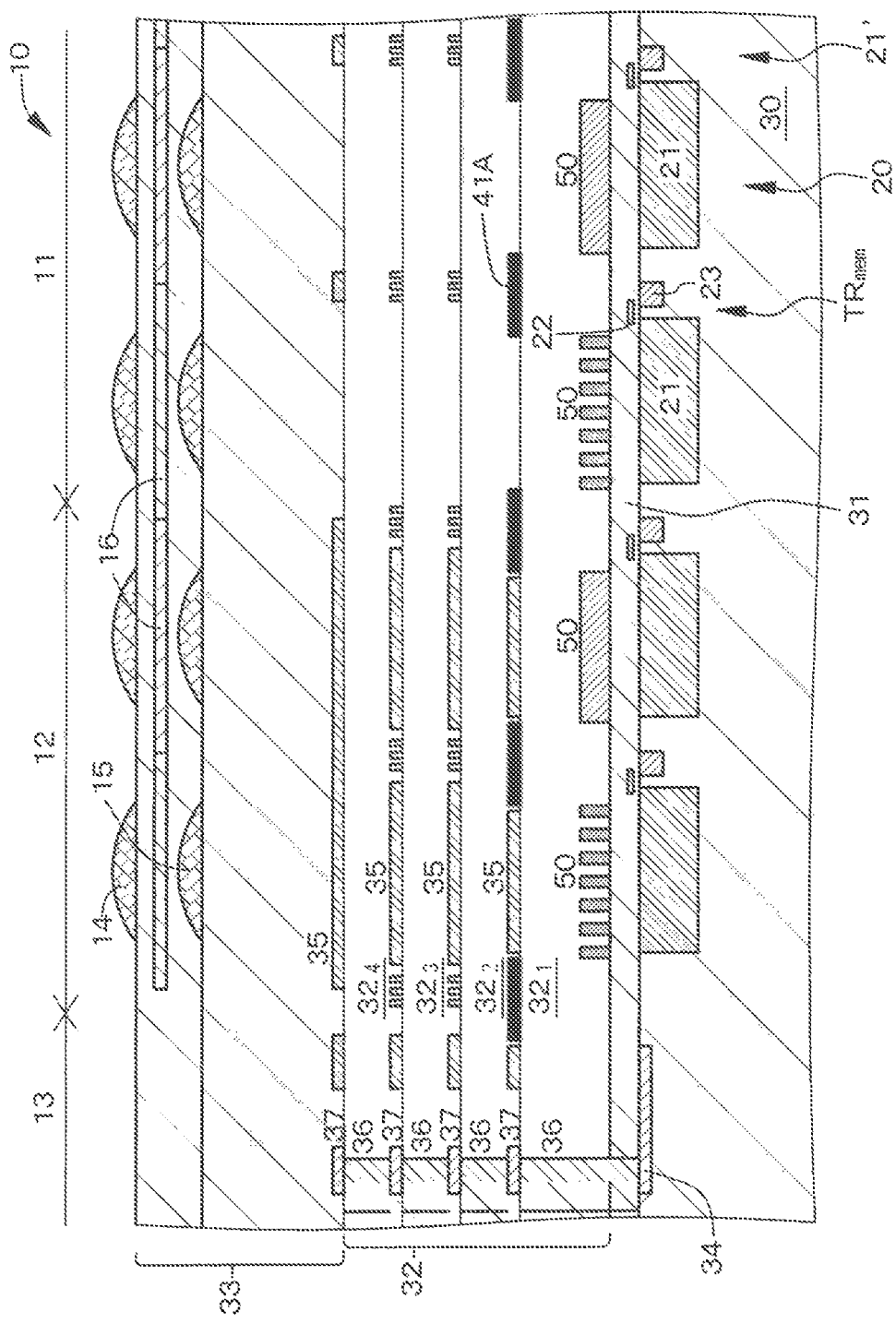
FIG. 1 is a schematic partial sectional view of an imaging element and a solid-state imaging device of Example 1.

The present disclosure will be described below based on Examples, but the present disclosure is not limited to the Examples, and various numerical values and materials in the Examples are illustrative. Note that description will be made in the following order.
1. General description of imaging element of the present disclosure and solid-state imaging device of the present disclosure
2. Example 1 (imaging element of the present disclosure and solid-state imaging device of the present disclosure)
3. Example 2 (modification of Example 1)
4. Example 3 (another modification of Example 1)
5. Example 4 (modification of Examples 1 to 3, second light shielding section)
6. Example 5 (modification of Example 4, third light shielding section)
7. Example 6 (modification of Examples 1 to 5, back illumination type imaging element)
8. Example 7 (modification of Examples 1 to 6, stacked type imaging element)
9. Example 8 (application example to moving body)
10. Example 9 (application example to moving body)
11. Example 10 (application example to in-vivo information acquisition system)
12. Others General Description of Imaging Element of the Present Disclosure and Solid-State Imaging Device of the Present Disclosure In a solid-state imaging device of the present disclosure, a plurality of imaging elements is arranged in a two-dimensional matrix pattern. For convenience' sake, one of arranging directions of the imaging elements is referred to as "$x_0$ direction" whereas the other of the arranging directions is referred to as "$y_0$ direction." It is preferable that the $x_0$ direction and the $y_0$ direction are orthogonal to each other. The $x_0$ direction is a so-called row direction or a so-called column direction, whereas the $y_0$ direction is a so-called column direction or a so-called row direction.

In the imaging elements of the present disclosure, a mode may be adopted in which a second light shielding section extending inside a substrate along a thickness direction of the substrate from a front surface of the substrate is further provided in a peripheral region around a photoelectric conversion section. Besides, in such a mode, a mode can be adopted in which a third light shielding section formed in the substrate in parallel to the front surface of the substrate from a tip portion of the second light shielding section extending inside the substrate is further provided. Here, "the front surface of the substrate" refers to that surface of the substrate on which light is incident. In addition, "parallel to the front surface of the substrate" does not mean strictly parallel to the front surface of the substrate, but means a parallel state taking into account variability in forming the third light shielding section; for example, as an angle between the front surface of the substrate and the third light shielding section formed in the substrate may be, for example, 0 to 10 degrees. It is sufficient if the depth from the front surface of the substrate to the third light shielding section formed in the substrate is determined in consideration of the wavelength of light (inclusive of not only visible light but also infrared light) to be absorbed by the photoelectric conversion section, since a region of the substrate from the front surface of the substrate to the third light shielding section substantially serves as the photoelectric conversion section.

Further, in the imaging elements of the present disclosure inclusive of the above-described various preferred modes, the polarizer may include a wire grid polarizer.

Further, in the imaging elements of the present disclosure inclusive of the above-described various preferred modes, the light shielding section (first light shielding section) formed on an upper side of a peripheral region around the photoelectric conversion section (A) may include an extension portion (a frame section described later) of the polarizer, or (B) may include a non-light-transmitting metallic film [for example, chromium (Cr), copper (Cu), aluminum (Al), tungsten (W), gold (Au), silver (Ag), platinum (Pt)] or a non-light-transmitting resin material layer [for example, a polyimide resin] which is formed on the ground insulating layer or on an upper side of the ground insulating layer (incidentally, in this case, the metallic film may be caused to function as wiring or the like), or (C) may include an insulating material which is formed in a region of the ground insulating layer over the peripheral region around the photoelectric conversion section and which has a refractive index smaller than the refractive index of the material constituting the ground insulating layer, or (D) may include a non-light-transmitting metallic material layer or alloy material layer [for example, chromium (Cr), copper (Cu), aluminum (Al), tungsten (W), gold (Au), silver (Ag), platinum (Pt)] or a non-light-transmitting resin material layer [for example, a polyimide resin] which is formed over the peripheral region around the photoelectric conversion section.

Further, in the imaging elements of the present disclosure inclusive of the above-described various preferred modes, the material constituting the second light shielding section or the third light shielding section preferably includes a metal, an alloy, a metallic nitride or a metallic silicide, specific examples of which include at least one material selected from the group including tungsten (W), titanium (Ti), tantalum (Ta), nickel (Ni), molybdenum (Mo), chromium (Cr), copper (Cu), aluminum (Al), gold (Au), silver (Ag), platinum (Pt), Ir (iridium), platinum-iridium, titanium nitride (TiN) and a tungsten-silicon compound, or a non-light-transmitting resin (for example, polyimide resin).

Alternatively, in the imaging elements of the present disclosure inclusive of the above-described various preferred modes, the material constituting the second light shielding section and the material constituting the third light shielding section may be the same material.

Further, in the solid-state imaging device of the present disclosure inclusive of the above-described preferred modes and configurations, a semiconductor substrate may be formed with a memory section which is connected to the photoelectric conversion section and momentarily stores an electric charge generated in the photoelectric conversion section. By this, a so-called global shutter system can be easily realized. Here, the global shutter system is a function of basically simultaneously starting exposure of all pixels and simultaneously finishing the exposure of all pixels. Here, the term all pixels refers to all the pixels in a part appearing as an image, excluding dummy pixels and the like. In addition, a system in which if time difference or distortion of images is sufficiently small such as not to matter, a region of global exposure is moved while performing global exposure in units of a plurality of rows (for example, several tens of rows) instead of performing exposure of all pixels simultaneously is also included in the global shutter system. Besides, a system of performing global exposure not on all the pixels in a part appearing as an image but on pixels in a predetermined region is also included in the global shutter system.

The polarizer may be common for a plurality of imaging elements. Specifically, the polarizer may be common for all the imaging elements constituting the solid-state imaging device, or, in the case where the imaging elements constituting the solid-state imaging device are divided such as to belong to a plurality of blocks, the polarizer may be common for each block.

The wire grid polarizer preferably has a line-and-space structure. Specifically, for example, the wire grid polarizer may have a form in which a plurality of stacked structures of at least a light reflection layer and a light absorbing layer which are belt-like in shape (the light absorbing layer is located on the light incidence side) is separately arranged side by side. Alternatively, the wire grid polarizer may have a form in which a plurality of stacked structures of a light reflection layer, an insulating film and a light absorbing layer which are belt-like in shape (the light absorbing layer is located on the light incidence side) is separately arranged side by side. In this case, a configuration in which the light reflection layer and the light absorbing layer of the stacked structure are separated by the insulating film (namely, a configuration in which the insulating film is formed over the whole part of a top surface of the light reflection layer, and the light absorbing layer is formed over the whole part of a top surface of the insulating film) may be adopted, or a configuration in which the insulating film is partly cut out and the light reflection layer and the light absorbing layer are in contact with each other in the cut-out areas of the insulating film may be adopted.

In this way, a line part of the wire grid polarizer can include a stacked structure in which a light reflection layer including a first conductive material, an insulating film, and a light absorbing layer including a second conductive material are stacked from the side opposite to the light incidence side. With such a configuration, the whole region of the light absorbing layer and the light reflection layer can be held at a predetermined potential, resulting in that generation of electric discharge can be securely prevented at the time of forming the wire grid polarizer. Alternatively, the wire grid polarizer may have a configuration in which the insulating film is omitted and the light absorbing layer and the light reflection layer are stacked from the light incidence side. Here, the wire grid polarizer including such a stacked structure can be manufactured based on the steps of: for example, (A) for example, after forming a photoelectric conversion section, providing a light reflection layer forming layer including a first conductive material and electrically connected to a substrate or the photoelectric conversion section on an upper side of the photoelectric conversion section, then (B) providing an insulating film forming layer over the light reflection layer forming layer, and providing a light absorbing layer forming layer including a second conductive material and partly in contact with the light reflection layer forming layer over the insulating film forming layer, and thereafter (C) patterning the light absorbing layer forming layer, the insulating film forming layer and the light reflection layer forming layer, to obtain a wire grid polarizer in which a plurality of line parts of a light reflection layer, an insulating film and a light absorbing layer which are belt-like in shape is separately arranged side by side. Note that there may be adopted a mode in which in step (B), the light absorbing layer forming layer including the second conductive material is provided in a state in which the light reflection layer forming layer is set at a predetermined potential through the substrate or the photoelectric conversion section, and in step (C), the light absorbing layer forming layer, the insulating film forming layer and the light reflection layer forming layer are patterned in a state in which the light reflection layer forming layer is set to a predetermined potential through the substrate and the photoelectric conversion section.

In addition, a configuration may be adopted in which a ground film is formed under the light reflection layer, whereby roughness of the light reflection layer forming layer and the light reflection layer can be improved. Examples of the material constituting the ground film (barrier metal layer) include Ti, TiN and a stacked structure of Ti/TiN.

Hereinafter, the stacked structure constituting the wire grid polarizer will sometimes be referred to as "first stacked structure" for convenience' sake, whereas the stacked structure constituting an extension portion of the wire grid polarizer or a non-light-transmitting part of the wire grid polarizer will sometimes be referred to as "second stacked structure" for convenience' sake.

The light reflection layer (or the light reflection layer forming layer) may include a metallic material, an alloy material or a semiconductor material, and the light absorbing layer may include a metallic material, an alloy material or a semiconductor material. Specifically, example of an inorganic material constituting the light reflection layer (light reflection layer forming layer) include metallic materials such as aluminum (Al), silver (Ag), gold (Au), copper (Cu), platinum (Pt), molybdenum (Mo), chromium (Cr), titanium (Ti), nickel (Ni), tungsten (W), iron (Fe), silicon (Si), germanium (Ge), and tellurium (Te), alloy materials including these metals and semiconductor materials.

Examples of the material constituting the light absorbing layer (or the light absorbing layer forming layer) include metallic materials, alloy materials and semiconductor materials which have an extinction ratio k of not zero, namely, which have a light-absorbing action. Specific examples include metallic materials such as aluminum (Al), silver (Ag), gold (Au), copper (Cu), molybdenum (Mo), chromium (Cr), titanium (Ti), nickel (Ni), tungsten (W), iron (Fe), silicon (Si), germanium (Ge), tellurium (Te) and tin (Sn), alloy materials including these metals, and semiconductor materials. Also, the examples include silicide materials such as $FeSi_2$ (particularly, $\beta$-$FeSi_2$), $MgSi_2$, $NiSi_2$, $BaSi_2$, $CrSi_2$, and $CoSi_2$. Especially, as the material constituting the light absorbing layer (light absorbing layer forming layer), there may be used aluminum or its alloy or a semiconductor material including $\beta$-$FeSi_2$ or germanium or tellurium, whereby a high contrast (high extinction ratio) can be obtained in a visible light region. Note that for providing a polarization characteristic in other wavelength bands than visible light, for example, in infrared region, it is preferable to use silver (Ag), copper (Cu), gold (Au) or the like as the material constituting the light absorbing layer (light absorbing layer forming layer). These metals have a resonance wavelength in the vicinity of the infrared region.

The light reflection layer forming layer and the light absorbing layer forming layer can be formed based on a known method such as various chemical vapor phase growth methods (CVD methods), coating methods, various physical vapor phase growth methods (PVD methods) including a sputtering method and a vacuum deposition method, a sol-gel method, a plating method, an MOCVD method, and an MBE method. In addition, examples of a patterning method for the light reflection layer forming layer and the light absorbing layer forming layer include a combination of lithography technique and etching technique (for example, anisotropic dry etching technique using a carbon tetrachloride gas, a sulfur hexafluoride gas, a trifluoromethane gas, xenon difluoride gas or the like, physical etching technique), so-called lift-off technique, and so-called self-aligned double patterning technique using a side wall mask. Examples of the lithography technique include photolithography techniques (lithography technique using g line or i line of high-pressure mercury lamp, KrF excimer laser, ArF excimer laser, EUV or the like as a light source, and liquid immersion lithography techniques, electron beam lithography techniques, and X-ray lithography). Alternatively, the light reflection layer and the light absorbing layer can be formed based on a fine processing technique by extra short time pulsed laser such as femtosecond layer, or a nanoimprint method.

Examples of the material constituting the insulating film (or the insulating film forming layer) include insulating materials which are transparent to incident light and do not have a light absorbing characteristic. Specific examples of the material include $SiO_X$-based materials (materials constituting a silicon-based oxide film) such as silicon oxide ($SiO_2$), NSG (non-doped silicate glass), BPSG (boron phosphorus silicate glass), PSG, BSG, PbSG, AsSG, SbSG, and SOG (spin-on-glass), SiN, silicon oxynitride (SiON), SiOC, SiOF, SiCN, low dielectric coefficient insulating materials (for example, fluorocarbon, cycloperfluorocarbon polymer, benzocyclobutene, cyclic fluoro-resin, polytetrafluoroethylene, amorphous tetrafluoroethylene, polyaryl ether, aryl fluoride ether, polyimide fluoride, organic SOG, parylene, fullerene fluoride, amorphous carbon), polyimide resin, fluoro-resin, Silk (a trademark of The Dow Chemical Co., a coating-type low dielectric coefficient interlayer insulating film material), and Flare (a trademark of Honeywell Electronic Materials Co., a polyallyl ether (PAE)-based material), which may be used either singly or in combination as required. Alternatively, the examples also include organic insulating materials (organic polymers) exemplified by straight chain hydrocarbons having at one end thereof a functional group capable of bonding to a control electrode such as polymethyl methacrylate (PMMA); polyvinyl phenol (PVP); polyvinyl alcohol (PVA); polyimide; polycarbonate (PC); polyethylene terephthalate (PET); silanol derivatives (silane coupling agents) such as polystyrene; N-2-(aminoethyl)-3-aminopropyltrimethoxysilane (AEAPTMS), 3-mercaptopropyltrimethoxysilane (MPTMS), and octadecyltrichlorosilane (OTS); novolak type phenol resins; fluoro-resins; octadecane thiol, and dodecyl isocyanate, and combinations thereof. The insulating film forming layer can be formed based on a known method such as various CVD methods, coating methods, various PVD methods inclusive of a sputtering method and a vacuum deposition method, various printing method such as a screen printing method, and a sol-gel method. The insulating film functions as a ground layer for the light absorbing layer, and is formed for the purpose of adjusting the phases of polarized light which is reflected by the light absorbing layer and polarized layer which is transmitted through the light absorbing layer and reflected by the light reflection layer, enhancing extinction ratio and transmittance by an interference effect, and reducing reflectance. Therefore, the insulating film desirably has such a thickness that the phase of light is shifted by one half of wavelength by one reciprocation, whereby polarized light wave (for example, TE wave) on one side reflected by the light absorbing layer is attenuated by cancelling each other through interference with polarized light wave (for example, TE wave) on one side reflected by the light reflection layer. In such a manner, the polarized light wave (for example, TE wave) on one side can be selectively attenuated. It is to be noted, however, that the light absorbing layer absorbs reflected light, since it has a light absorbing effect. Therefore, even where the thickness of the insulating film is not optimized as aforementioned, enhancement of extinction ratio and contrast can be realized. Accordingly, in practice, it is sufficient if the thickness of the insulating film is determined based on the balance between desired polarization characteristics and actual manufacturing steps; an example of the thickness may be $1\times10^{-9}$ m to $1\times10^{-7}$ m, preferably $1\times10^{-8}$ m to $8\times10^{-8}$ m. In addition, the refractive index of the insulating film is preferably greater than 1.0, and is preferably equal to or less than 2.5, which is not limitative.

Incidentally, light is incident from the light absorbing layer. By utilizing four actions of light transmission, reflection, interference and selective light absorption of polarized light wave by optical anisotropy, the wire grid polarizer attenuates a polarized light wave having an electric field component parallel to a first direction (either one of TE wave/S wave or TM wave/P wave) and transmits a polarized light wave having an electric field component parallel to a second direction (the other of TE wave/S wave and TM wave/P wave). In other words, polarized light wave (for example, TE wave) on one side is attenuated by the selective light absorbing action of polarized light wave due to the optical anisotropy of the light absorbing layer. In other words, the belt-shaped light reflection layers function as a polarizer, and reflect the polarized light wave (for example, TE wave) on one side transmitted through the light absorbing layer and the insulating film. The extending direction (first direction) of the belt-shaped light reflection layers coincides with a polarization orientation in which extinction is to be generated, and the repetition direction (second direction) of the belt-shaped light reflection layers coincides with a polarization orientation in which transmission is to be generated. In other words, the light reflection layers have a function as a polarizer, attenuate the polarized light wave (either one of TE wave/S wave or TM wave/P wave) having an electric field component parallel in a direction parallel to the extending direction of the light reflection layers, among the light incident on the wire grid polarizer, and transmit the polarized light wave (the other of the TE wave/S wave and TM wave/P wave) having an electric field component in a direction orthogonal to the extending direction of the light reflection layers (the repetition direction of the belt-shaped light reflection layers). The extending direction of the light reflection layers is a light absorption axis of the wire grid polarizer, and the direction orthogonal to the extending direction (second direction) of the light reflection layers is a light transmission axis of the wire grid polarizer. The second direction can be made to be parallel to $x_0$ direction or $y_0$ direction.

The length of the line-and-space structure along the first direction may be the same as the length along the first direction of a region where photoelectric conversion is substantially conducted by the imaging element (photoelectric conversion region), or may be the same as the length of the imaging element, or may be an integer times the length of the imaging element along the first direction, but these are non-limitative.

In the wire grid polarizer including the above-mentioned various preferred modes and configurations, a protective film (referred to as "first protective film," for convenience' sake) may be formed over the wire grid polarizer, and the space parts of the wire grid polarizer may be gaps. Specifically, the upper side of the space parts may be covered with the first protective film, and the space parts may be at least filled with air. Such a wire grid polarizer will be referred to as "the wire grid polarizer of the first configuration" for convenience' sake. With the space parts of the wire grid polarizer thus being gaps, the value of average refractive index $n_{ave}$ can be reduced, resulting in that it is possible to realize an enhanced transmittance and an enhanced extinction ratio of the wire grid polarizer. In addition, the value of formation pitch $P_0$ can be enlarged, and, therefore, an enhanced yield in manufacture of the wire grid polarizer can be realized. The first protective film may be formed over the wire grid polarizer, whereby an imaging element and a solid-state imaging device high in reliability can be provided, and the provision of the first protective film makes it possible to enhance reliability, such as moisture resistance, of the wire grid polarizer. It is sufficient if the thickness of the first protective film is a thickness in such a range as not to influence polarization characteristics. Since the reflectance for incident light varies depending on the optical thickness of the first protective film (refractive index×film thickness of the first protective film), it is sufficient if the material and thickness of the first protective film are determined in consideration of these factors. The material constituting the first protective film is desirably a material which has a refractive index of equal to or less than 2 and an extinction ratio of nearly zero. Examples of the material include insulating materials such as $SiO_2$, SiON, SiN, SiC, SiOC and SiCN including TEOS-$SiO_2$, and metallic oxides such as aluminum oxide ($AlO_X$), hafnium oxide ($HfO_X$), zirconium oxide ($ZrO_X$) and tantalum oxide ($TaO_X$) Alternative examples include perfluorodecyltrichlorosilane and octadecyltrichlorosilane. The first protective film can be formed by a known process such as various CVD methods, coating methods, various PVD methods inclusive of a sputtering method and a vacuum deposition method, and a sol-gel method. With the first protective film thus formed such as to cover the wire grid polarizer, it is possible to block moisture and organic matters in the atmosphere, and to securely restrain the generation of such problems as corrosion or abnormal precipitation of, for example, the metallic material constituting the wire grid polarizer. Besides, it is possible to realize enhancement of long-term reliability of the imaging element, and to provide an imaging element provided, on an on-chip basis, with a wire grid polarizer having higher reliability.

In the wire grid polarizer of the first configuration, a second protective film may be formed between the wire grid polarizer and the first protective film, and let the refractive index of the material constituting the first protective film be $n_1$ and let the refractive index of the material constituting the second protective film be $n_2$, then $$n_1 > n_2$$

may be satisfied. With $n_1 > n_2$ satisfied, the value of the average refractive index $n_{ave}$ can be reduced assuredly.

Here, it is preferable that the first protective film includes SiN and the second protective film includes $SiO_2$ or SiON.

In the wire grid polarizer of the first configuration including the above-mentioned various preferred modes and configurations, a third protective film may be formed on side surfaces of the line parts that face the space parts of the wire grid polarizer. In other words, the space parts are filled with air, and, in addition, the third protective films are present at the space parts. Here, the material constituting the third protective film is desirably a material which has a refractive index of equal to or less than 2 and an extinction ratio of nearly zero. Examples of the material include insulating materials such as $SiO_2$, SiON, SiN, SiC, SiOC and SiCN inclusive of $TEOS-SiO_2$, and metallic oxides such as aluminum oxide ($AlO_X$), hafnium oxide ($HfO_X$), zirconium oxide ($ZrO_X$), and tantalum oxide ($TaO_X$) Alternative examples include perfluorodecyltrichlorosilane and octadecyltrichlorosilane. The third protective film can be formed by a known process such as various CVD methods, coating methods, various CVD methods inclusive of a sputtering method and a vacuum deposition method, and a sol-gel method. It is to be noted, however, that the use of a so-called ALD method (Atomic Layer Deposition method) or an HDP-CVD method (high density plasma chemical vapor deposition method) is more preferable. With the ALD method adopted, a thin third protective film can be conformally formed over the wire grid polarizer; from the viewpoint of forming a thinner third protective film over side surfaces of the line parts, however, the adoption of the HDP-CVD method is more preferred. Alternatively, the space parts may be filled with a material for constituting the third protective film, and the third protective film may be provided with gaps, pores, voids or the like, whereby the refractive index of the third protective film as a whole can be lowered.

When the metallic material or alloy material (hereinafter sometimes referred to as "the metallic material or the like") constituting the wire grid polarizer comes into contact with the outside air, deposition of moisture or organic matter from the outside air deteriorates the corrosion resistance of the metallic material or the like, whereby the long-term reliability of the imaging elements of the present disclosure may be deteriorated. Particularly, when moisture is deposited on the line parts of the metallic material or the like—the insulating material—the metallic material or the like, the moisture with $CO_2$ and $O_2$ dissolved therein may act as an electrolyte, and a local cell may be formed between the two kinds of metals. If such a phenomenon is generated, a reduction reaction such as hydrogen generation proceeds on the cathode (positive electrode) side, and an oxidation reaction proceeds on the anode (negative electrode side), whereby abnormal precipitation of the metallic material or the like or a change in the shape of the wire grid polarizer is generated. As a result, the originally expected performance of the wire grid polarizer or the imaging elements of the present disclosure may be spoiled. For example, in the case where aluminum (Al) is used as the light reflection layer, abnormal precipitation of aluminum as represented by the following chemical formula may be generated. However, if the first protective film is formed and if the third protective film is formed, generation of such a problem can be avoided.

$$Al \rightarrow Al^{3+} + 3e^-$$

$$Al^{3+} + 3OH^- \rightarrow Al(OH)_3$$

In addition, in the wire grid polarizer including the above-mentioned various preferred modes and configurations, a mode may be adopted in which a frame section surrounding the wire grid polarizer is provided, the frame section and the line parts of the wire grid polarizer are connected to each other, and the frame section has the same structure as that of the line part of the wire grid polarizer. Such a wire grid polarizer will be referred to as "the wire grid of the second configuration" for convenience' sake. Specifically, the frame section is a stacked structure which includes at least a light reflection layer and a light absorbing layer, for example, includes a light reflection layer, an insulating film and a light absorbing layer, and may include a so-called solid film structure (second stacked structure) which is not provided with a line-and-space structure. Note that though depending on the function required of the frame section (or in the case where a light shielding function as a first light shielding section is unnecessary), if the stacked structure does not function as a wire grid polarizer, a line-and-space structure like that of the wire grid polarizer may be provided. In other words, a structure may be provided in which the formation pitch $P_0$ of the wire grid is sufficiently larger than the effective wavelength of the incident electromagnetic wave. Though not limitative, the frame section is preferably disposed surrounding the wire grid polarizer provided correspondingly to the imaging element, in the manner of a picture frame.

Thus, the frame section and the line parts of the wire grid polarizer are connected to each other, and the frame section has the same structure as that of the line part of the wire grid polarizer, whereby it is possible to solve a problem that exfoliation is generated at the part of an outer peripheral portion of the wire grid polarizer corresponding to the four corners of the imaging element in the solid-state imaging device of the present disclosure, a problem that a difference is generated between the structure of the outer peripheral portion of the wire grid polarizer and the structure of a central portion of the wire grid polarizer and the performance of the wire grid polarizer is thereby lowered, and a problem that the light incident on the outer peripheral portion of the wire grid polarizer is liable to leak into the adjacent imaging elements which differ in polarization direction; as a result, a solid-state imaging device high in reliability can be provided. Moreover, the frame section can constitute a first light shielding section extending from the wire grid polarizer.

In addition, in the wire grid polarizer including the above-mentioned various preferred modes and configurations, a configuration may be adopted in which extension portions of the light reflection layer and the light absorbing layer are electrically connected to the substrate or the photoelectric conversion section. With the extension portion of the light reflection layer thus electrically connected to the substrate or the photoelectric conversion section, it is possible to securely avoid the generation of a problem in which at the time of forming the wire grid polarizer, the light reflection layer forming layer or the light absorbing layer forming layer is electrostatically charged and a kind of electric discharge is generated, thereby damaging the wire grid polarizer or the photoelectric conversion section. In some cases, a configuration may be adopted in which the insulating film is formed over the whole part of a top surface of the light reflection layer, and the light absorbing layer is formed over the whole part of a top surface of the insulating film. By such a configuration, generation of electric discharge can be securely prevented, since the whole region of the light absorbing layer and the light reflection layer is electrically connected to the substrate or the photoelectric conversion section. Alternatively, in some cases, a configuration may be adopted in which the insulating film is omitted, and the light reflection layer and the light absorbing layer are stacked from the side opposite to the light incidence side.

The region or regions in which the substrate or the photoelectric conversion section and the extension portions (or the light reflection layer forming layer and the light absorbing layer forming layer) of the light reflection layer and the light absorbing layer are electrically connected may be located in an imaging region, or may be located in an optical black pixel region (OPB) provided at the outer periphery of the imaging region, or may be located in a peripheral region provided outside the imaging region. Note that in the case where the region or regions in which the substrate or the photoelectric conversion section and the extension portions (or the light reflection layer forming layer and the light absorbing layer forming layer) of the light reflection layer and the light absorbing layer are electrically connected is or are located in the imaging region or located in the optical black pixel region (OPB), the region or regions may be provided for each imaging element, or may be provided at one location for a plurality of imaging elements, or may be provided at one location for all the imaging element; in addition, the region or regions may be provided at one location for one imaging element, or may be provided at a plurality of locations for one imaging element. Besides, in the case where the region or regions is or are located in the peripheral region, the region or regions may be provided at one location or provided at a plurality of locations.

A mode may be adopted in which the frame section constituting the first light shielding section is formed between the imaging element and the imaging element, and the extension portions of the light reflection layer and the light absorbing layer are in contact with (are connected to) the first light shielding section. Here, the length of the light reflection layer in contact with the frame section (first light shielding section) may be equal to the length of a photoelectric conversion region which is a region for substantially performing photoelectric conversion of the imaging element (the length of an edge of the photoelectric conversion region), or may be in the range from one half the length of the photoelectric conversion region to the length of the photoelectric conversion region. With such a mode adopted, generation of color mixing from the adjacent imaging elements can also be prevented. In addition, the region in which the light reflection layer forming layer and the light absorbing layer forming layer contact each other may be a region which is located between the imaging element and the imaging element and is located at at least one location of the four corners of the imaging element. A mode may be adopted in which the frame section constituting the first light shielding section is formed also in the peripheral region, and the light reflection layer and the light absorbing layer are in contact with the frame section. In addition, in the case where the extension portion of the light reflection layer and the light reflection layer forming layer are electrically connected to the substrate, for example, it is sufficient if a high-concentration impurity region, a metallic layer, an alloy layer, a wiring layer or the like is formed at the connection portion of the substrate.

In the peripheral region, formation of a polarizer is unnecessary. The peripheral region is preferably occupied by the same structure (second stacked structure) as the frame section. If the frame section or the peripheral region does not function as a polarizer, a line-and-space pattern may be provided like the wire grid polarizer. In other words, a structure in which formation pitch $P_0$ of wire grids is sufficiently larger than the effective wavelength of the incident electromagnetic wave may be provided.

The solid-state imaging device of the present disclosure including the above-described preferred modes and configurations has the effective pixel region where an imaging element group is provided and the peripheral region located outside the effective pixel region. In this case, a mode may be adopted in which an on-chip microlens (first microlens) is formed on the upper side of each imaging element in the effective pixel region, and a mode may be adopted in which an on-chip microlens is formed over a range from the upper side of the effective pixel region to the upper side of the peripheral region. In addition, a sub on-chip microlens (inner microlens, OPA, second microlens) may be provided on the upper side of the polarizer and on the lower side of the on-chip microlens (first microlens). In some cases, a mode may be adopted in which two imaging elements of the present disclosure constitute an imaging element block, and one on-chip microlens is formed on the upper side of the imaging element block.

In the solid-state imaging device of the present disclosure including the above-described preferred modes and configurations, the plurality of imaging elements may include imaging elements having a photoelectric conversion section sensitive to white light. Alternatively, the plurality of imaging elements may include an imaging element unit which includes an imaging element having a photoelectric conversion section sensitive to red light, an imaging element having a photoelectric conversion section sensitive to green light, and an imaging element having a photoelectric conversion section sensitive to blue light. Alternatively, the plurality of imaging elements may include an imaging element unit which includes an imaging element having a photoelectric conversion section sensitive to red light, an imaging element having a photoelectric conversion section sensitive to green light, an imaging element having a photoelectric conversion section sensitive to blue light, and an imaging element having a photoelectric conversion section sensitive to white light. In such a configuration, a color filter layer (wavelength selecting means) may be disposed on the light incidence side as compared to the polarizer. By adopting such a configuration, optimization of the wire grid polarizer can be realized independently in the wavelength band of transmitted light in each wire grid polarizer, and a further lower reflectance can be realized in the whole part of visible light region. A planarization film is preferably formed between the wire grid polarizer and the wavelength selecting means. In the case where the main on-chip microlens is disposed on the upper side of the sub on-chip microlens (OPA), the wavelength selecting means (color filter layer) may be disposed between the sub on-chip microlens and the main on-chip microlens.

Examples of the color filter layer (wavelength selecting means) include filter layers that transmit a specific wavelength, the specific wavelength being not limited to red, green and blue, but including, in some cases, cyan, magenta, yellow and the like. The color filter layer may include not only an organic material-based color filter layer using an organic compound such as a pigment or a dye, but also a thin film of an inorganic material such as a photonic crystal, a wavelength selecting element based on application of plasmon (a color filter layer having a conductor lattice structure in which a conductor thin film is provided with a lattice form hole structure. See, for example, JP 2008-177191A), and amorphous silicon.

In the solid-state imaging device of the present disclosure, the angle formed between the arrangement direction of the plurality of imaging elements and the first direction may be, for example, a combination of the imaging element having an angle of 0 degrees and the imaging element having an angle of 90 degrees, or may be a combination of the imaging element having an angle of 0 degrees, the imaging element having an angle of 45 degrees, the imaging element having an angle of 90 degrees and the imaging element having an angle of 135 degrees.

Alternatively, in the solid-state imaging device of the present disclosure including the above-described various preferred modes and configurations, a mode may be adopted in which the polarizer includes four polarizer segments of a first polarizer segment, a second polarizer segment, a third polarizer segment and a fourth polarizer segment arranged in a 2×2 pattern (in other words, two polarizer segments are arranged in the $x_0$ direction, and two polarizer segments are arranged in the $y_0$ direction), the polarization orientation in which light is to be transmitted by the first polarizer segment is a degrees, the polarization orientation in which light is to be transmitted by the second polarizer segment is ($\alpha$+45) degrees, the polarization orientation in which light is to be transmitted by the third polarizer segment is ($\alpha$+90) degrees, and the polarization orientation in which light is to be transmitted by the fourth polarizer segment is ($\alpha$+135) degrees. Here, examples of the value of $\alpha$ include "0," which is not limitative. The photoelectric conversion sections corresponding to the first polarizer segment, the second polarizer segment, the third polarizer segment and the fourth polarizer segment are sensitive to light of the same color.

Alternatively, in the solid-state imaging device of the present disclosure, imaging element units each including four imaging elements of a first imaging element, a second imaging element, a third imaging element and a fourth imaging element arranged in a 2×2 pattern may be arranged in a two-dimensional matrix pattern to form a solid-state imaging device. A mode may be adopted in which in each imaging element unit, the first imaging element has a photoelectric conversion section sensitive to red light, the second imaging element has a photoelectric conversion section sensitive to green light, the third imaging element has a photoelectric conversion section sensitive to blue light, and the fourth imaging element has a photoelectric conversion section sensitive to white light or green light.

Here, in each imaging element unit, a mode may be adopted in which the fourth imaging element has a polarizer, whereas the first imaging element, the second imaging element and the third imaging element does not have any polarizer, or a mode may be adopted in which the first imaging element, the second imaging element, the third imaging element and the fourth imaging element have a polarizer. A mode may be adopted in which in each imaging element unit, the polarizers have the same polarization orientation, or, further, a mode may be adopted in which in this case, the polarization orientations of the polarizers in the adjacent imaging element units are different.

Alternatively, in each imaging element unit, a mode may be adopted in which the first imaging element has a photoelectric conversion section sensitive to red light, the second imaging element has a photoelectric conversion section sensitive to green light, the third imaging element has a photoelectric conversion section sensitive to blue light, the fourth imaging element has a photoelectric conversion section sensitive to white light or green light, an imaging element unit group includes four imaging element units of a first imaging element unit, a second imaging element unit, a third imaging element unit and a fourth imaging element unit arranged in a 2×2 pattern (in other words, two imaging element units are arranged in the $x_0$ direction, and two imaging element units are arranged in the $y_0$ direction), the polarization orientation in which light is to be transmitted by the first polarizer possessed by the first imaging element unit is a degrees, the polarization orientation in which light is to be transmitted by the second polarizer possessed by the second imaging element unit is ($\alpha$+45) degrees, the polarization orientation in which light is to be transmitted by the third polarizer possessed by the third imaging element unit is ($\alpha$+90) degrees, and the polarization orientation in which light is to be transmitted by the fourth polarizer possessed by the fourth imaging element unit is ($\alpha$+135) degrees.

Alternatively, in each imaging element unit, a configuration may be adopted in which the first imaging element has a photoelectric conversion section sensitive to red light, the second imaging element has a photoelectric conversion section sensitive to green light, the third imaging element has a photoelectric conversion section sensitive to blue light, the fourth imaging element has a photoelectric conversion section sensitive to white light or green light, the polarizer provided on the light incidence side of the fourth imaging element includes four polarizer segments of a 4-1th polarizer segment, a 4-2th polarizer segment, a 4-3th polarizer segment and a 4-4th polarizer segment which are arranged in a 2×2 pattern (in other words, which have two polarizer segments arranged in the $x_0$ direction, and two polarizer segments arranged in the $y_0$ direction), the polarization orientation in which light is to be transmitted by the 4-1th polarizer segment is α degrees, the polarization orientation in which light is to be transmitted by the 4-2th polarizer segment is (α+45) degrees, the polarization orientation in which light is to be transmitted by the 4-3th polarizer segment is (α+90) degrees, and the polarization orientation in which light is to be transmitted by the 4-4th polarizer segment is (α+135) degrees.

In such a configuration, further, a configuration may be adopted in which each imaging element unit has polarizers on the respective light incidence sides of the first imaging element, the second imaging element and the third imaging element, the polarizer provided on the light incidence side of the first imaging element includes four polarizer segments of a 1-1th polarizer segment, a 1-2th polarizer segment, a 1-3th polarizer segment and a 1-4th polarizer segment which are arranged in a 2×2 pattern (in other words, which have two polarizer segments arranged in the $x_0$ direction, and two polarizer segments arranged in the $y_0$ direction), the polarization orientation in which light is to be transmitted by the 1-1th polarizer segment is β degrees, the polarization orientation in which light is to be transmitted by the 1-2th polarizer segment is (β+45) degrees, the polarization orientation in which light is to be transmitted by the 1-3th polarizer segment is (β+90) degrees, the polarization orientation in which light is to be transmitted by the 1-4th polarizer segment is (R+135) degrees, the polarizer provided on the light incidence side of the second imaging element includes four polarizer segments of a 2-1th polarizer segment, a 2-2th polarizer segment, a 2-3th polarizer segment and a 2-4th polarizer segment which are arranged in a 2×2 pattern (in other words, which have two polarizer segments arranged in the $x_0$ direction, and two polarizer segments arranged in the $y_0$ direction), the polarization orientation in which light is to be transmitted by the 2-1th polarizer segment is γ degrees, the polarization orientation in which light is to be transmitted by the 2-2th polarizer segment is (γ+45) degrees, the polarization orientation in which light is to be transmitted by the 2-3th polarizer segment is (γ+90) degrees, the polarization orientation in which light is to be transmitted by the 2-4th polarizer segment is (γ+135) degrees, the polarizer provided on the light incidence side of the third imaging element includes four polarizer segments of a 3-1th polarizer segment, a 3-2th polarizer segment, a 3-3th polarizer segment and a 3-4th polarizer segment which are arranged in a 2×2 pattern (in other words, which has two polarizer segments arranged in the $x_0$ direction, and two polarizer segments arranged in the $y_0$ direction), the polarization orientation in which light is to be transmitted by the 3-1th polarizer segment is δ degrees, the polarization orientation in which light is to be transmitted by the 3-2th polarizer segment is (δ+45) degrees, the polarization orientation in which light is to be transmitted by the 3-3th polarizer segment is (δ+90) degrees, and the polarization orientation in which light is to be transmitted by the 3-4th polarizer segment is (δ+135) degrees.

As the values of α, β, γ and δ, an angle formed with the $y_0$ direction of "0 degrees" may be mentioned as an example. In addition, it is preferable that α=β=γ=δ, though not limitative.

The imaging element formed on the substrate may be of a back illumination type, or may be of a front illumination type. Examples of the substrate include a silicon semiconductor substrate, and compound semiconductor substrates such as an InGaAs substrate.

The imaging elements of the present disclosure may be a stacked type imaging element in which a plurality of photoelectric conversion sections is stacked.

By the solid-state imaging device of the present disclosure, a single plate type color solid-state imaging device can be configured.

All the imaging elements constituting the solid-state imaging device of the present disclosure may include a polarizer, or part of the imaging elements may include a polarizer.

In the solid-state imaging device of the present disclosure, color filter layers are used, as aforementioned. Examples of the arrangement (array) of the imaging elements in such a solid-state imaging device include, in addition to the Bayer array, interline array, G stripe RB mosaic array, G stripe RB full mosaic array, complementary mosaic array, stripe array, diagonal stripe array, primary chroma array, field sequential chroma array, frame sequential chroma array, MOS array, improved MOS array, frame-interleaved array, and field-interleaved array. Here, one imaging element constitutes one pixel (or sub-pixel).

For example, in the case of the Bayer array, as aforementioned, one imaging element unit (one pixel) may include four imaging elements of the present disclosure. A red color filter layer, a green color filter layer and a blue color filter layer may be disposed respectively in three sub-pixel regions of the 2×2 sub-pixel regions, no color filter layer may be disposed in the remaining one sub-pixel region in which a green color filter layer is to be disposed intrinsically, and a wire grid polarizer may be disposed in the remaining one sub-pixel region (white sub-pixel region). Alternatively, in the case of the Bayer array, a red color filter layer, a green color filter layer and a blue color filter layer may be disposed respectively in three sub-pixel regions of the 2×2 sub-pixel regions, and a green color filter layer and a wire grid polarizer may be disposed in the remaining one sub-pixel region. In the case where color separation or spectroscopy is not a purpose, or in the case where an imaging element itself is an imaging element sensitive to a specific wavelength, the color filter layers may be unnecessary. In addition, in a sub-pixel region in which a color filter layer (wavelength selecting means) is not disposed, a transparent resin layer may be formed in place of a color filter layer, for securing flatness with the sub-pixel regions in which color filter layers are disposed. Specifically, the imaging element may include a combination of a red light imaging element sensitive to red light, a green light imaging element sensitive to green light and a blue light imaging element sensitive to blue light with a near infrared light imaging element or infrared light imaging element sensitive to near infrared rays or infrared rays, or may be a solid-state imaging device that obtain a monochromic image, or may be a solid-state imaging device that obtains a combination of a monochromic image and an image based on near infrared rays or infrared rays.

The pixel region in which a plurality of imaging elements is arranged of the present disclosure includes a plurality of pixels regularly arranged in a two-dimensional array. The pixel region normally includes an effective pixel region that actually receives light, amplifies a signal charge generated by photoelectric conversion, and reads it out into a drive circuit, and a black reference pixel region (also called optical black pixel region (OPB)) for outputting optical black which serves as a reference of black level, as aforementioned. The black reference pixel region is usually disposed in an outer peripheral portion of the effective pixel region. Further, the peripheral region is usually disposed in an outer peripheral portion of the black reference pixel region. The black reference pixel region may be light-shielded, whereby improvement of dark current characteristics in the black reference pixel region can be realized. In the case of light-shielding the black reference pixel region, for example, it is sufficient if a structure (second stacked structure) similar to the frame section is formed on the upper side of the black reference pixel region, for example, over the ground insulating layer. In the effective pixel region, normally, light is actually received, a signal charge generated by photoelectric conversion is amplified, and is read out into the drive circuit. In addition, in the black reference pixel region (OPB), optical black serving as a reference of black level is outputted.

In the imaging element of the present disclosure including the above-described various preferred modes and configurations, irradiation with light is conducted, photoelectric conversion is generated in the photoelectric conversion section, and holes and electrons are subjected to carrier separation.

Examples of the material constituting the ground insulating layer include not only inorganic insulating materials exemplified by metallic oxide high dielectric constant insulating materials such as silicon oxide-based materials; silicon nitride ($SiN_Y$); and aluminum oxide ($Al_2O_3$), but also organic insulating materials (organic polymers) exemplified by polymethyl methacrylate (PMMA); polyvinyl phenol (PVP); polyvinyl alcohol (PVA); polyimides; polycarbonate (PC); polyethylene terephthalate (PET); polystyrene; silanol derivatives (silane coupling agents) such as N-2-(aminoethyl)-3-aminopropyltrimethoxysilane (AEAPTMS), 3-mercaptopropyltrimethoxysilane (MPTMS), and octadecyltrichlorosilane (OTS); novolak type phenol resins; fluoro-resins; and straight chain hydrocarbons having at an end a functional group capable of bonding to a control electrode such as octadecanethiol and dodecyl isocyanate, and combinations of these materials. Examples of the silicon oxide-based materials include silicon oxide ($SiO_X$), BPSG, PSG, BSG, AsSG, PbSG, silicon oxynitride (SiON), and SOG (spin-on-glass), and low dielectric constant insulating materials (for example, polyaryl ether, cycloperfluorocarbon polymer and benzocyclobutene, cyclic fluoro-resins, polytetrafluoroethylene, aryl fluoride ether, polyimide fluoride, amorphous carbon, organic SOG). Alternatively, examples of the material constituting the ground insulating layer include the materials mentioned above as materials constituting the insulating film. In addition, the imaging element further includes various interlayer insulating layers and insulating material films other than the above, and it is sufficient if the material for constituting the various interlayer insulating layers and insulating material films is selected, as required, from these material constituting the ground insulating layer.

In the imaging elements and the solid-state imaging device, a drive circuit and wiring for driving the imaging elements are provided. The configurations or structures of a floating diffusion layer, a transfer transistor, an amplifying transistor, a reset transistor and a selection transistor constituting a control section that controls operations of the photoelectric conversion section may be similar to the configurations or structures of a floating diffusion layer, a transfer transistor, an amplifying transistor, a reset transistor and a selection transistor in the conventional art. Drive circuits for driving these transistors may also have known configurations or structures. If necessary, a shutter for controlling the incidence of light on the imaging element may be disposed, and an optical cut filter may be provided according to the purpose of the solid-state imaging device.

For example, in the case of stacking the solid-state imaging device with a read-out integrated circuit (ROIC), a drive substrate formed with the read-out integrated circuit and connection sections including copper (Cu) and the imaging elements formed with connection sections are laid over each other such that the connection sections make contact with each other, and the connection sections are joined to each other, whereby the stacking can be realized, or the connection sections may be jointed together by use of solder bumps or the like.

Examples of the imaging elements of the present disclosure include a CCD element, a CMOS image sensor, a CIS (Contact Image Sensor), a CMD (Charge Modulation Device) type signal amplification type image sensor. From the solid-state imaging device of the present disclosure, it is possible to configure, for example, a digital still camera, a video camera, a camcorder, a monitoring camera, an on-vehicle camera, a smartphone camera, a user interface camera for game, and a biometric authentication camera. Besides, an imaging device can be configured which can simultaneously acquire polarization information in addition to normal imaging. In addition, an imaging device can be configured that picks up a stereoscopic image.

Example 1

Figure 13:
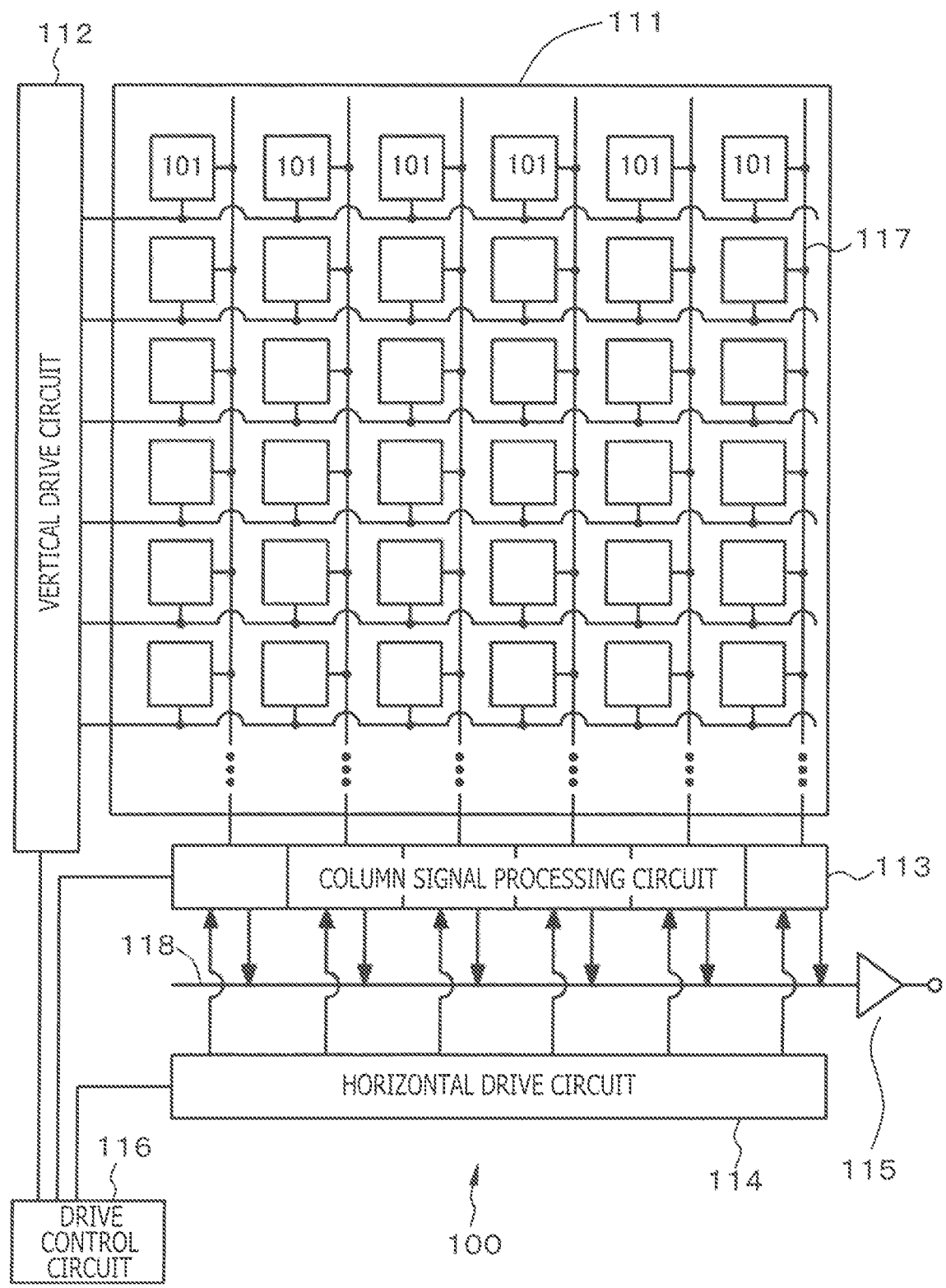
FIG. 13 is a conceptual diagram of the solid-state imaging device of Example 1.
Figure 14:
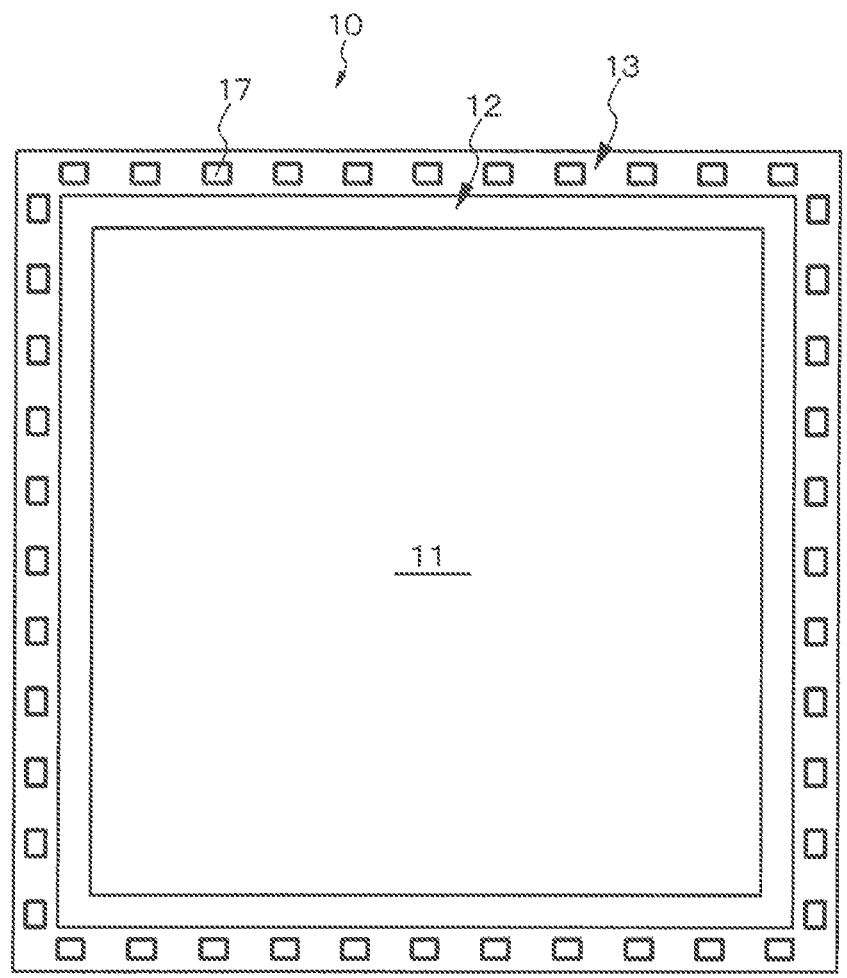
FIG. 14 is a figure schematically depicting a layout of an effective pixel region, an optical black pixel region and a peripheral region in the solid-state imaging device of Example 1.
Figure 15:
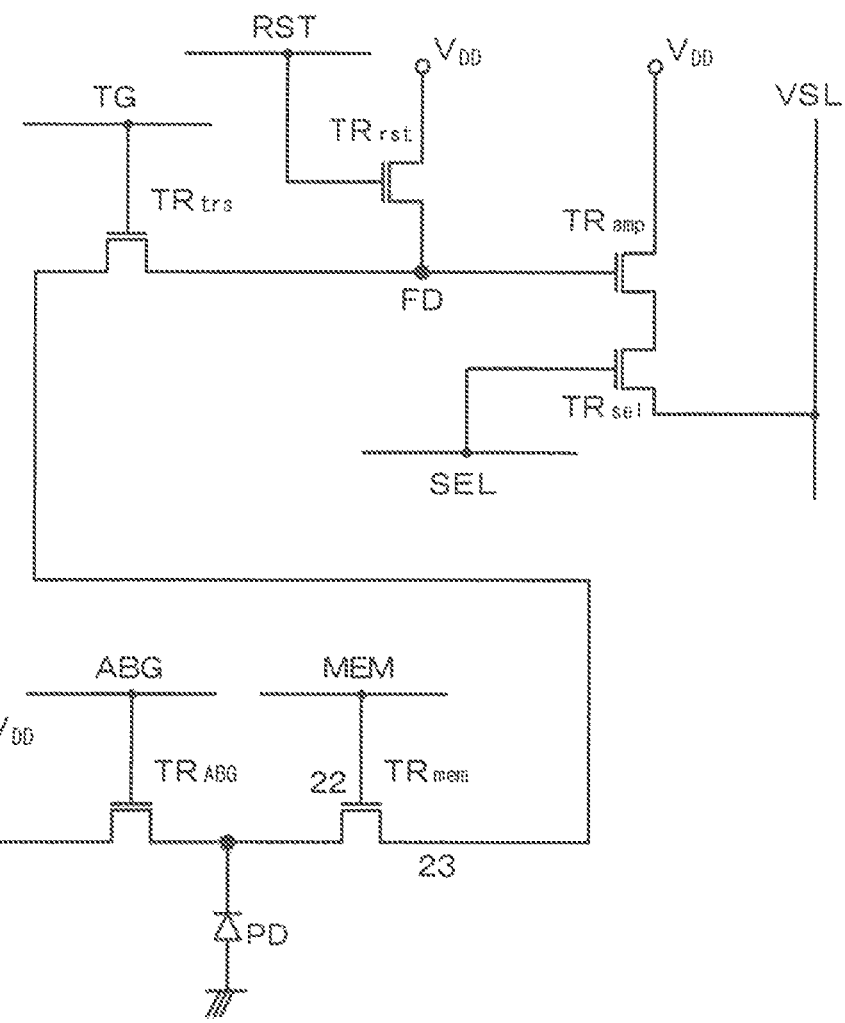
FIG. 15 is an equivalent circuit diagram of the imaging element of Example 1.
Figure 16:
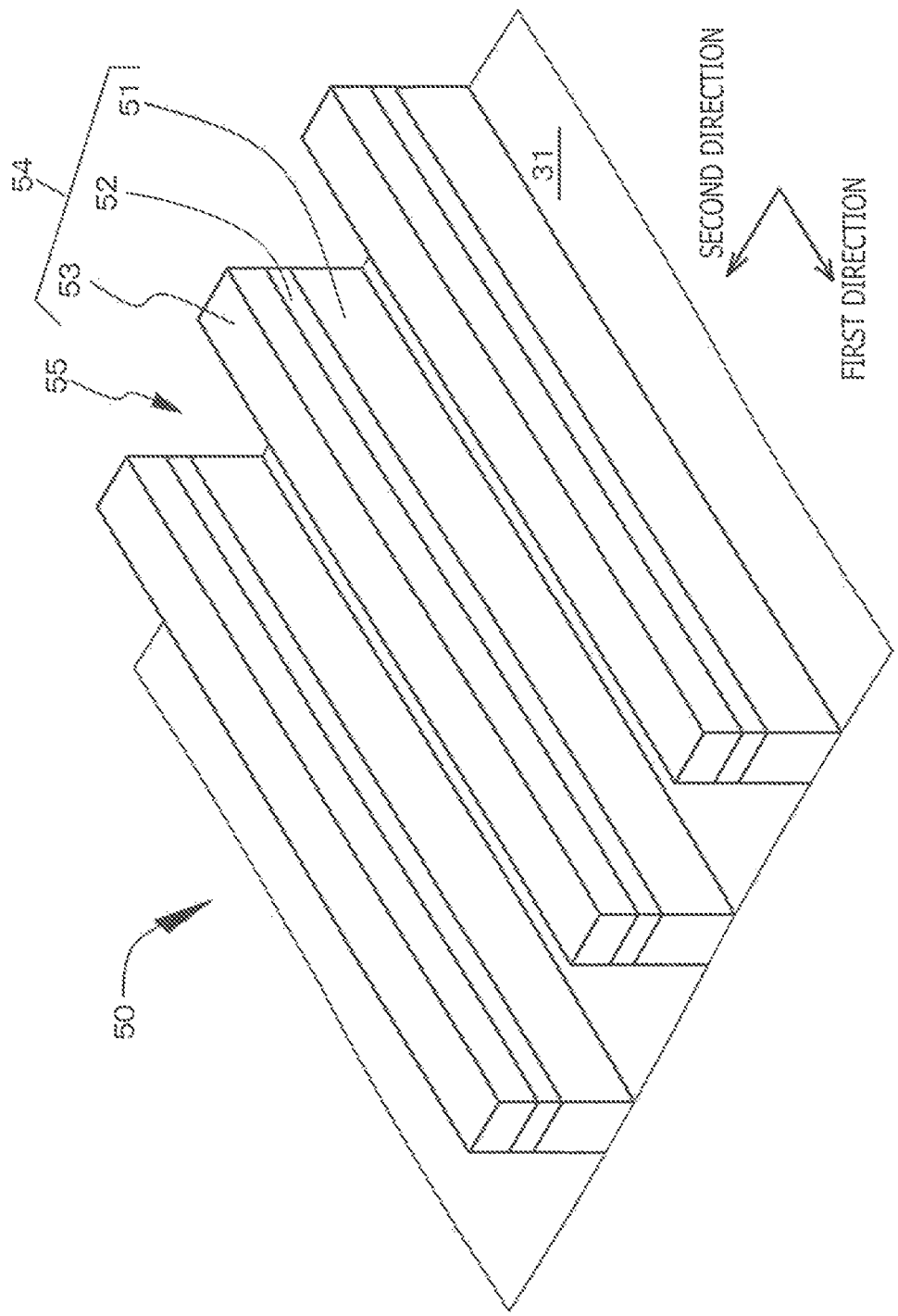
FIG. 16 is a schematic perspective view of a wire grid polarizer constituting the imaging element of Example 1.
Figure 17A:
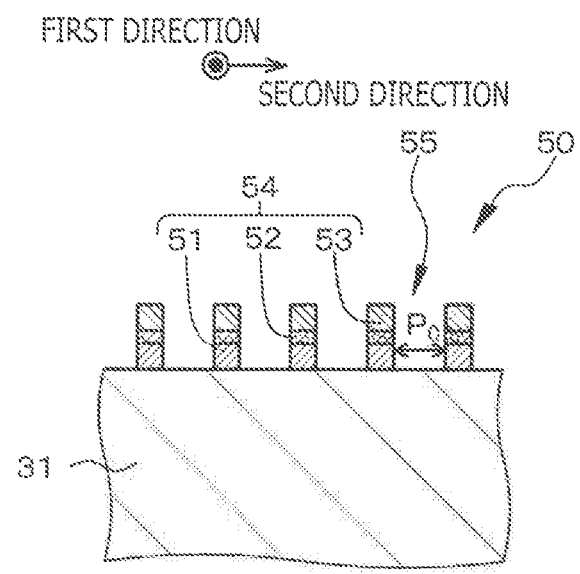
FIGS. 17A and 17B are schematic partial end views of a wire grid polarizer constituting the imaging element of the present disclosure and a modification.
Figure 20:
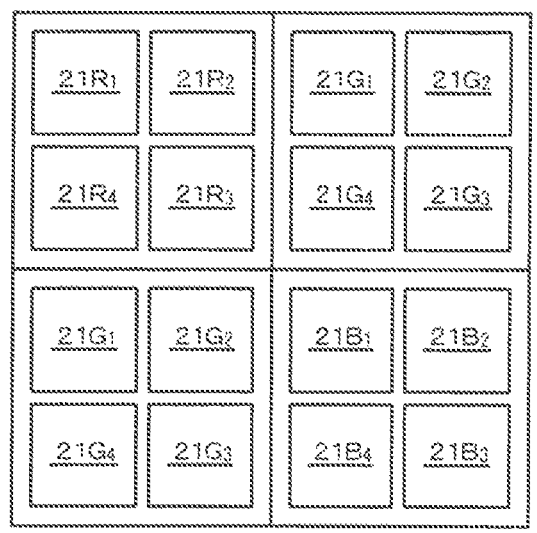
FIG. 20 is a schematic partial plan view of a photoelectric conversion section in the solid-state imaging device of Example 1.

Example 1 relates to the imaging element (photoelectric conversion element) of the present disclosure and the solid-state imaging device of the present disclosure. A partial sectional view of the solid-state imaging device including the imaging elements of Example 1 is depicted in FIG. 1, and a conceptual diagram of the solid-state imaging device of Example 1 is illustrated in FIG. 13. In addition, a layout of an effective pixel region, an optical black pixel region and a peripheral region in the solid-state imaging device of Example 1 is schematically depicted in FIG. 14, and an equivalent circuit diagram of the imaging element in the solid-state imaging device of Example 1 is illustrated in FIG. 15. Further, a schematic perspective view of a wire grid polarizer constituting the imaging element of Example 1 is depicted in FIG. 16, a schematic partial end view of the wire grid polarizer in the imaging element of Example 1 is illustrated in FIG. 17A, schematic partial plan views of wavelength selecting means (color filter layer) and the wire grid polarizer in the imaging element of Example 1 are depicted in FIGS. 19A and 19B, and a schematic partial plan view of a photoelectric conversion section in the imaging element of Example 1 is illustrated in FIG. 20.

An imaging element 20 of Example 1 includes:

a photoelectric conversion section 21 provided in a substrate (silicon semiconductor substrate) 30;

a polarizer (specifically, a wire grid polarizer 50) formed over the photoelectric conversion section 21, with a single ground insulating layer 31 interposed therebetween; and a light shielding section (first light shielding section 41A) formed on an upper side of a peripheral region 21' around the photoelectric conversion section 21.

In addition, a solid-state imaging device 10 of Example 1 includes a plurality of imaging elements arranged in a two-dimensional matrix pattern, each of the imaging elements including the imaging element 20 of Example 1. In Example 1 and Examples 2 to 5 to be described later, the imaging element is of the front illumination type.

Here, in Example 1, a first light shielding section 41A includes a non-light-transmitting metallic film [for example, chromium (Cr), copper (Cu), aluminum (Al), tungsten (W), gold (Au), silver (Ag), platinum (Pt)] formed on an upper side of a ground insulating layer 31, and functions as wiring or the like. The first light shielding section 41A is formed over a first interlayer insulating layer 32$_1$ formed above the ground insulating layer 31. Note that alternatively, the first light shielding section 41A may include a non-light-transmitting resin material layer [for example, a polyimide resin].

In addition, an optical black pixel region (OPB) 12 is provided between an effective pixel region 11 and a peripheral region 13, and a wire grid polarizer 50 is formed over a range from the effective pixel region 11 to the optical black pixel region 12. A pad section 17 is provided in a top surface region of the peripheral region 13. The pad section 17 is connected to an external circuit or an external wiring by a wire bonding method, for example.

Besides, the silicon semiconductor substrate 30 is formed with a memory section TR$_{mem}$ that is connected to the photoelectric conversion section 21 and temporarily stores an electric charge generated in the photoelectric conversion section 21. The memory section TR$_{mem}$ includes the photoelectric conversion section 21, a gate section 22, a channel forming region, and a high-concentration impurity region 23. The gate section 22 is connected to a memory selection line MEM. In addition, the high-concentration impurity region 23 is formed in the silicon semiconductor substrate 30, while spaced from the photoelectric conversion section 21, by a known method. The first light shielding section 41A is formed on an upper side of the high-concentration impurity region 23. Specifically, the high-concentration impurity region 23 is covered with the first light shielding section 41A, whereby incidence of light on the high-concentration impurity region 23 is inhibited. The provision of the memory section TR$_{mem}$ that temporarily stores an electric charge makes it possible to easily realize a so-called global shutter system.

A transfer transistor TR$_{trs}$ depicted in FIG. 15 includes a gate section connected to a transfer gate line TG, a channel forming region, a source/drain region on one side which is connected to the high-concentration impurity region 23 (or which shares a region with the high-concentration impurity region 23), and a source/drain region on the other side which constitute a floating diffusion layer FD.

A reset transistor TR$_{rst}$ illustrated in FIG. 15 includes a gate section, a channel forming region, and source/drain regions. The gate section of the reset transistor TR$_{rst}$ is connected to a reset line RST, the source/drain region on one side of the reset transistor TR$_{rst}$ is connected to a power source V$_{DD}$, and the source/drain region on the other side functions also as the floating diffusion layer FD.

An amplifying transistor TR$_{amp}$ depicted in FIG. 15 includes a gate section, a channel forming region, and source/drain regions. The gate section is connected to a source/drain region (floating diffusion layer FD) on the other side of the reset transistor TR$_{rst}$ through a wiring layer. In addition, the source/drain region on one side is connected to the power source V$_{DD}$.

A selection transistor TR$_{sel}$ depicted in FIG. 15 includes a gate section, a channel forming region, and source/drain regions. The gate section is connected to a selection line SEL. The source/drain region on one side shares a region with a source/drain region on the other side constituting an amplifying transistor Tr$_{amp}$, whereas the source/drain region on the other side is connected to a signal line (data output line) VSL (117).

The photoelectric conversion section 21 is connected to a source/drain region on one side of a charge discharge control transistor TR$_{ABG}$. A gate section of the charge discharge control transistor TR$_{ABG}$ is connected to a charge discharge control transistor control line ABG, whereas a source/drain region on the other side is connected to the power source V$_{DD}$.

A series of operations such as charge accumulation, resetting operation and charge transfer of the photoelectric conversion section 21 are similar to a series of operations such as charge accumulation, resetting operation and charge transfer of a conventional imaging element, and, therefore, detailed descriptions thereof will be omitted.

The photoelectric conversion section 21, the memory section TR$_{mem}$, the transfer transistor TR$_{trs}$, the reset transistor TR$_{rst}$, the amplifying transistor Tr$_{amp}$, the selection transistor TR$_{sel}$ and the charge discharge control transistor TR$_{ABG}$ are covered with the ground insulating layer 31. A wiring layer 35 and a contact pad section 37 are formed over the ground insulating layer 31. The contact pad section 37 is connected to a wiring section 34 formed on the silicon semiconductor substrate 30 through a contact hole 36.

The ground insulating layer 31 including the wire grid polarizer 50, the wiring layer 35 and the contact pad section 37 are covered with the first interlayer insulating layer 32$_1$. A wiring layer 35 and a contact pad section 37 are formed over the first interlayer insulating layer 32$_1$, and this contact pad section 37 is connected to the contact pad section 37 formed over the ground insulating layer 31 through a contact hole 36. The first light shielding section 41A is provided over the first interlayer insulating layer 32$_1$.

The first light shielding section 41A, the first interlayer insulating layer 32$_1$, the wiring layer 35 and the contact pad section 37 are covered with a second interlayer insulating layer 32$_2$. A wiring layer 35 and a contact pad section 37 are formed over the second interlayer insulating layer 32$_2$, and this contact pad section 37 is connected to the contact pad section 37 formed over the first interlayer insulating layer 32$_1$ through a contact hole 36.

The second interlayer insulating layer 32$_2$, the wiring layer 35 and the contact pad section 37 are covered with a third interlayer insulating layer 32$_3$. A wiring layer 35 and a contact pad section 37 are formed over the third interlayer insulating layer 32$_3$, and this contact pad section 37 is connected to the contact pad section 37 formed over the second interlayer insulating layer 32$_2$ through a contact hole 36.

The third interlayer insulating layer 32$_3$, the wiring layer 35 and the contact pad section 37 are covered with a fourth interlayer insulating layer 32$_4$. A wiring layer 35 and a contact pad section 37 are formed over the fourth interlayer insulating layer 32$_4$, and this contact pad section 37 is connected to the contact pad section 37 formed over the third interlayer insulating layer 32$_3$ through a contact hole 36.

The fourth interlayer insulating layer 32$_4$, the wiring layer 35 and the contact pad section 37 are covered with a first planarization film. In the drawing, the first interlayer insulating layer 32$_1$, the second interlayer insulating layer 32$_2$, the third interlayer insulating layer 32$_3$ and the fourth interlayer insulating layer 32$_4$ are collectively denoted by reference sign 32, and hatching of each interlayer insulating layer is omitted. While four wiring layers are depicted in the illustrated example, this is not limitative, and the number of the wiring layers is arbitrary.

A sub on-chip microlens (OPA) 15 is disposed over a region of the first planarization film which region is located on an upper side of the photoelectric conversion section 21. In addition, the first planarization film and the sub on-chip microlens (OPA) 15 are covered with a second planarization film. Wavelength selecting means (specifically, for example, a color filter layer) 16 is formed over a region of the second planarization film which region is located on an upper side of the photoelectric conversion section 21. Further, the second planarization film and the wavelength selecting means 16 are covered with a third planarization film. A main on-chip microlens 14 is disposed over a region of the third planarization film which region is located on an upper side of the photoelectric conversion section 21. In the drawing, the first planarization film, the second planarization film and the third planarization film are collectively denoted by reference sign 33.

The wire grid polarizer 50 has a line-and-space structure. Line parts 54 of the wire grid polarizer 50 each include a stacked structure (first stacked structure) in which a light reflection layer 51 including a first conductive material (specifically, aluminum (Al)), an insulating film 52 including $SiO_2$, and a light absorbing layer 53 including a second conductive material (specifically, tungsten (W)) are stacked, from the side opposite to the light incidence side (from the imaging element side in Example 1). The insulating film 52 is formed over the whole part of a top surface of the light reflection layer 51, and the light absorbing layer 53 is formed over the whole part of a top surface of the insulating film 52. Specifically, the light reflection layer 51 includes aluminum (Al) whose thickness is 150 nm, the insulating film 52 includes $SiO_2$ whose thickness is 25 nm or 50 nm, and the light absorbing layer 53 includes tungsten (W) whose thickness is 25 nm. The light reflection layer 51 has a function as a polarizer, attenuates a polarized light wave having an electric field component in a direction parallel to the extending direction (first direction) of the light reflection layer 51, of the light which is incident on the wire grid polarizer 50, and transmits a polarized light wave having an electric field component in a direction (second direction) orthogonal to the extending direction of the light reflection layer 51. The first direction is a light absorption axis of the wire grid polarizer 50, and the second direction is a light transmission axis of the wire grid polarizer 50. A ground film including Ti, TiN, or a stacked structure of Ti/TiN is formed between the ground insulating layer 31 and the light reflection layer 51, but the ground film is omitted from illustration.

Figure 62A:
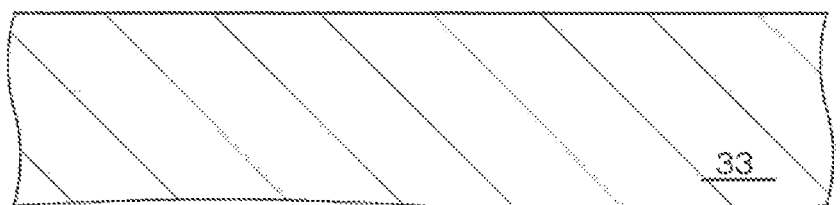
FIGS. 62A, 62B, 62C and 62D are schematic partial end views of a ground insulating layer and the like for explaining a method of manufacturing a wire grid polarizer constituting the solid-state imaging device of example 1.
Figure 62B:
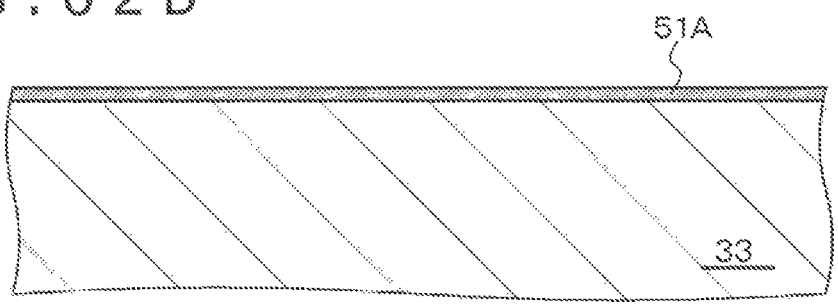
Figure 62C:
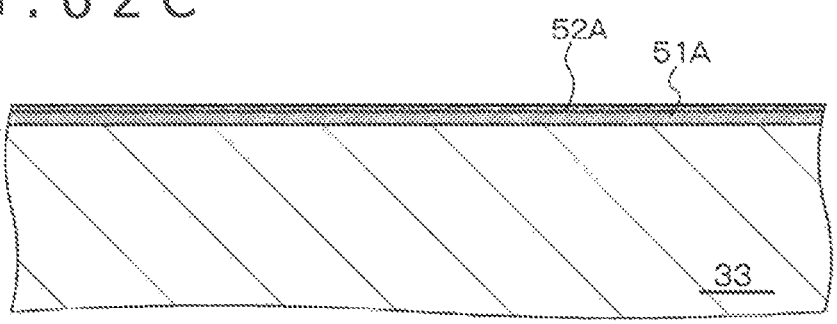
Figure 62D:
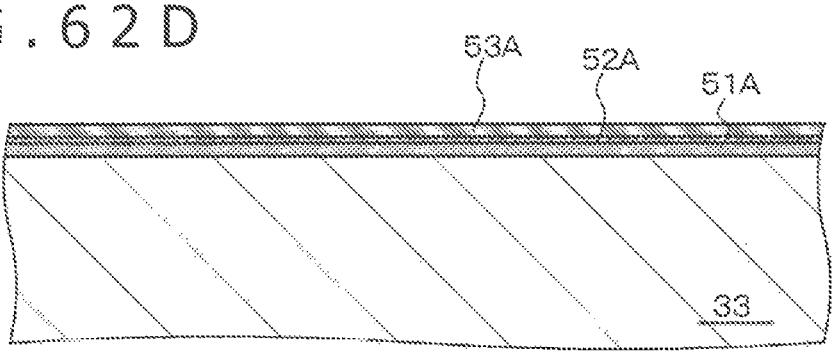

The wire grid polarizer 50 can be produced by the following method. The ground film (not illustrated) including Ti, TiN, or a stacked structure of Ti/TiN, and a light reflection layer forming layer 51A including the first conductive material (specifically, aluminum) are provided over the ground insulating layer 31 based on a vacuum deposition method (see FIGS. 62A and 62B). Next, an insulating film forming layer 52A is provided over the light reflection layer forming layer 51A, and a light absorbing layer forming layer 53A including the second conductive material is provided over the insulating film forming layer 52A. Specifically, the insulating film forming layer 52A including $SiO_2$ is formed over the light reflection layer forming layer 51A based on a CVD method (see FIG. 62C). Then, the light absorbing layer forming layer 53A including tungsten (W) is formed over the insulating film forming layer 52A by a sputtering method. In this way, a structure depicted in FIG. 62D can be obtained.

Thereafter, the light absorbing layer forming layer 53A, the insulating film forming layer 52A and the light reflection layer forming layer 51A and, further, the ground film are patterned based on lithography technique and dry etching technique, whereby it is possible to obtain the wire grid polarizer 50 having the line-and-space structure in which a plurality of line parts (stacked structures) 54 of belt-shaped light reflection layer 51, insulating film 52 and light absorbing layer 53 is arranged side by side while spaced from one another. Thereafter, it is sufficient if the first interlayer insulating layer $32_1$ is formed such as to cover the wire grid polarizer 50 based on a CVD method.

An imaging element group includes a plurality of imaging element units. An imaging element unit including a plurality of imaging elements has a Bayer array. As schematic partial plan views of the wavelength selecting means (color filter layer) and the wire grid polarizer in the solid-state imaging device of Example 1 are depicted in FIGS. 19A and 19B and a schematic partial plan view of the imaging element is depicted in FIG. 20, of the four imaging element units, the first imaging element unit includes four red light photoelectric conversion sections 21R ($21R_1$, $21R_2$, $21R_3$, $21R_4$) that absorb red light (light of 620 nm to 750 nm), and wavelength selecting means (color filter layers) 16R and wire grid polarizers 50R ($50R_1$, $50R_2$, $50R_3$, $50R_4$) for these imaging elements. Polarization orientations in which light is to be transmitted by these wire grid polarizers $50R_1$, $50R_2$, $50R_3$ and $50R_4$ are α degrees, (α+45) degrees, (α+90) degrees, and (α+135) degrees. The second imaging element unit and the fourth imaging element unit each include four green light photoelectric conversion sections 21G ($21G_1$, $21G_2$, $21G_3$, $21G_4$) that absorb green light (light of 495 nm to 570 nm), and wavelength selecting means (color filter layers) 16G, and wire grid polarizers 50G ($50G_1$, $50G_2$, $50G_3$, $50G_4$) for these imaging elements. Polarization orientations in which light is to be transmitted by these wire grid polarizers $50G_1$, $50G_2$, $50G_3$ and $50G_4$ are α degrees, (α+45) degrees, (α+90) degrees and (α+135) degrees. The third imaging element unit includes four blue light photoelectric conversion sections 21B ($21B_1$, $21B_2$, $21B_3$, $21B_4$) that absorb blue light (light of 425 nm to 495 nm), and wavelength selecting means (color filter layers) 16B and wire grid polarizers 50B ($50B_1$, $50B_2$, $50B_3$, $50B_4$) for these imaging elements. Polarization orientations in which light is to be transmitted by these wire grid polarizers $50B_1$, $50B_2$, $50B_3$ and $50B_4$ are α degrees, (α+45) degrees, (α+90) degrees and (α+135) degrees. As the value of α, an angle formed with the $y_0$ direction of "0 degrees" may be mentioned as an example. While the wire grid polarizer 50 is hatched, the direction orthogonal to the extending direction of the hatching lines indicates the polarization orientation in which light is to be transmitted by the wire grid polarizer 50.

From the solid-state imaging device of Example 1, there may be configured, for example, a digital still camera, a video camera, a camcorder, a monitoring camera, an on-vehicle camera (vehicle-mounted camera), a smartphone camera, a user interface camera for game, and a biometric authentication camera.

FIG. 13 depicts a conceptual diagram of the solid-state imaging device of Example 1. The solid-state imaging device 100 of Example 1 includes an imaging region (effective pixel region) 111 in which imaging elements 101 are arranged in a two-dimensional array, and a vertical drive circuit 112, column signal processing circuits 113, a horizontal drive circuit 114, an output circuit 115, a drive control circuit 116 and the like which are disposed in a peripheral region 13 and serve as drive circuits (peripheral circuits) for the imaging region 111. These circuits may include known circuits, or may naturally be configured by using other circuit configurations (for example, various circuits used in conventional CCD imaging devices and CMOS imaging devices). In FIG. 13, reference signs "101" for the imaging elements 101 are presented in only one row.

The drive control circuit 116 generates a clock signal and control signals serving as basis of operations of the vertical drive circuit 112, the column signal processing circuit 113 and the horizontal drive circuit 114, based on a vertical synchronizing signal, a horizontal synchronizing signal and a master clock. Then, the clock signal and the control signals thus generated are inputted to the vertical drive circuit 112, the column signal processing circuit 113 and the horizontal drive circuit 114.

The vertical drive circuit 112 includes, for example, a shift register, and performs selective scanning of the imaging elements 101 in the imaging region 111 sequentially in the vertical direction on a row basis. Then, a pixel signal (image signal) based on a current (signal) generated according to the amount of light received at each imaging element 101 is sent to the column signal processing circuit 113 through signal lines (data output lines) 117, VSL.

The column signal processing circuits 113 are disposed, for example, on the basis of each column of the imaging elements 101, and subject a one row amount of image signals outputted from the imaging elements 101 to signal processing such as noise removal and signal amplification on an imaging element basis by a signal from a black reference pixel (formed in the periphery of the effective pixel region, though not illustrated). At an output stage of the column signal processing circuit 113, a horizontal selection switch (not illustrated) is provided in the state of being connected between the output stage and a horizontal signal line 118.

The horizontal drive circuit 114 includes, for example, a shift register, sequentially outputs horizontal scanning pulses, thereby to sequentially select the individual ones of the column signal processing circuit 113, and outputs signals from the individual ones of the column signal processing circuits 113 to the horizontal signal line 118.

The output circuit 115 subjects signals sequentially supplied from individual ones of the column signal processing circuits 113 through the horizontal line 118 to signal processing, and outputs the processed signals.

In the imaging element or the solid-state imaging device of Example 1, the polarizer is formed over the photoelectric conversion section, with a single ground insulating layer interposed therebetween. Therefore, the distance between the wire grid polarizer and the photoelectric conversion section can be set as short as possible, and, as a result, leaking-in of light to the adjacent imaging elements (polarization crosstalk) can be prevented more securely. In addition, since the wire grid polarizer is an absorption type wire grid polarizer that has a light absorbing layer, it is low in reflectance, so that influences of stray light, flare and the like on images can be mitigated.

In the solid-state imaging device of Example 1, the wire grid polarizer is provided, and, therefore, a solid-state imaging device can be realized which can simultaneously acquire polarization information in addition to normal imaging. In other words, a polarizing and separating function for spatially polarizing and separating polarization information of incident light can be imparted to the solid-state imaging device. Specifically, since light intensity, polarized light component intensity and polarization direction can be obtained at each imaging element (photoelectric conversion element), it is possible, for example, to process image data based on polarization information, after imaging. For example, by subjecting a part of an image of a sky or a windowpane, a part of an image of a water surface and the like to a desired processing, a polarized light component can be emphasized or reduced. Alternatively, a polarized light component and a non-polarized light component can be separated from each other, whereby improvement of contrast of images and removal of unrequired information can be performed. Note that specifically, for example, by prescribing an imaging mode at the time of imaging by use of the solid-state imaging device, such a processing can be performed. Further, by use of the solid-state imaging device, glare onto a windowpane can be removed, and, by adding polarization information to image information, the boundary (outline) between a plurality of objects can be made clearer. Alternatively, detection of the state of a road surface and detection of an obstacle on a road surface can also be performed. Further, imaging of a pattern reflecting birefringence of an object, measurement of a retardation distribution, acquisition of a polarization microscope image, acquisition of a surface shape of an object, measurement of a surface property of an object, detection of a moving body (vehicle or the like), meteorological observation such as measurement of cloud distribution, and applications to various fields are possible. In addition, a solid-state imaging device can be realized which picks up a stereoscopic image.

Figure 17B:
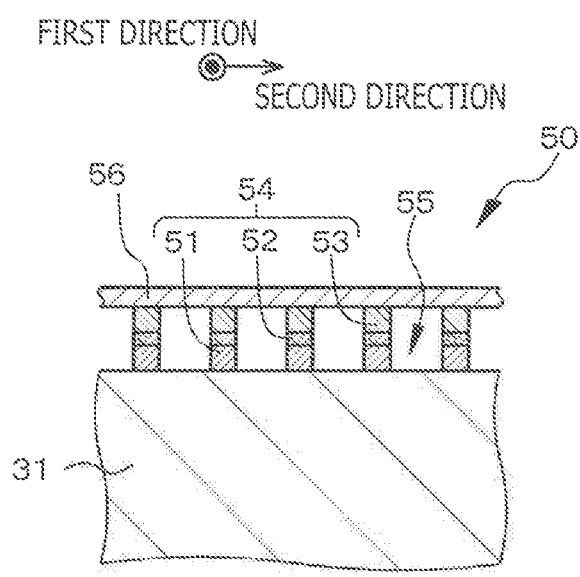

As a modification of the wire grid polarizer 50, as depicted in a schematic partial end view in FIG. 17B, a configuration may be mentioned in which a protective film (first protective film) 56 is formed over the wire grid polarizer 50, and space parts 55 of the wire grid polarizer 50 are voids. In other words, the space parts 55 are partly or entirely filled with air. In Example 1, specifically, the space parts 55 are entirely filled with air.

Figure 18A:
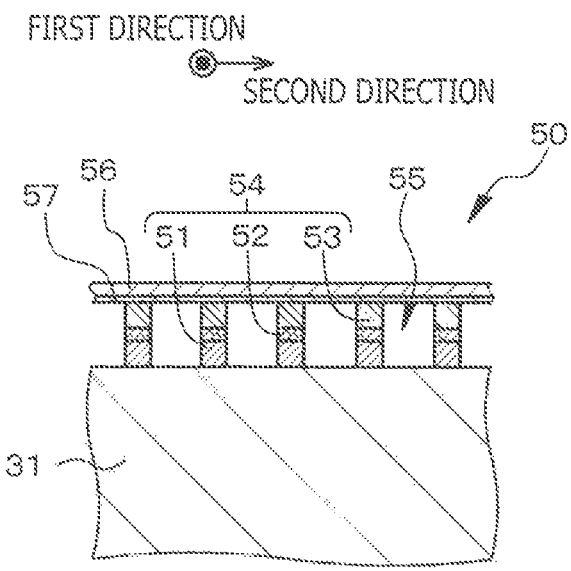
FIGS. 18A and 18B are schematic partial end views of a wire grid polarizer constituting the imaging element of the present disclosure and a modification.

In addition, as a schematic partial end view is depicted in FIG. 18A, a second protective film 57 may be formed between the wire grid polarizer 50 and the first protective film 56. Let the refractive index of the material constituting the first protective film 56 be $n_1$, and let the refractive index of the material constituting the second protective film 57 be $n_2$, then $$n_1 > n_2$$

is satisfied. Here, for example, the first protective film 56 includes SiN ($n_1$=2.0), and the second protective film 57 includes $SiO_2$ ($n_2$=1.46). While a bottom surface (a surface facing the ground insulating layer 31) of the second protective film 57 is depicted in a flat state in the drawing, the bottom surface of the second protective film 57 may be projected toward the space parts 55, or the bottom surface of the second protective film 57 may be recessed toward the first protective film 56, or may be recessed in a wedge shape.

To obtain such a structure, the wire grid polarizer 50 having the line-and-space structure is obtained, after which the second protective film 57 including $SiO_2$ is formed on the whole surface based on a CVD method. The upper side of the space part 55 located between the line part 54 and the line part 54 is covered with the second protective film 57. Next, the first protective film 56 including SiN is formed over the second protective film 57 based on a CVD method. With the first protective film 56 including SiN, an imaging element high in reliability can be obtained. It is to be noted, however, that since SiN has a comparatively high relative dielectric constant, the second protective film 57 including $SiO_2$ is formed, so as to realize a lowering in average refractive index $n_{ave}$.

With the space parts of the wire grid polarizer thus being voids (specifically, being filled with air), the value of the average refractive index $n_{ave}$ can be reduced; as a result, it is possible to realize enhancement of transmittance of the wire grid polarizer and enhancement of extinction ratio. In addition, since the value of formation pitch $P_0$ can be enlarged, enhancement of yield in manufacture of the wire grid polarizer can be realized. Moreover, with the first protective film formed over the wire grid polarizer, it is possible to provide an imaging element and a solid-state imaging device which are high in reliability.

The wire grid polarizer may have a structure in which the insulating film is omitted, namely, a structure in which the light reflection layer (including aluminum, for example) and the light absorbing layer (including tungsten, for example) are stacked from the side opposite to the light incidence side. Alternatively, the wire grid polarizer may include a single conductive light shielding material layer. Examples of the material constituting the conductive light shielding material layer include conductive materials having a low complex refractive index in a wavelength region to which the imaging element is sensitive, such as aluminum (Al), copper (Cu), gold (Au), silver (Ag), platinum (Pt), tungsten (W) or alloys containing these metals.

Figure 18B:
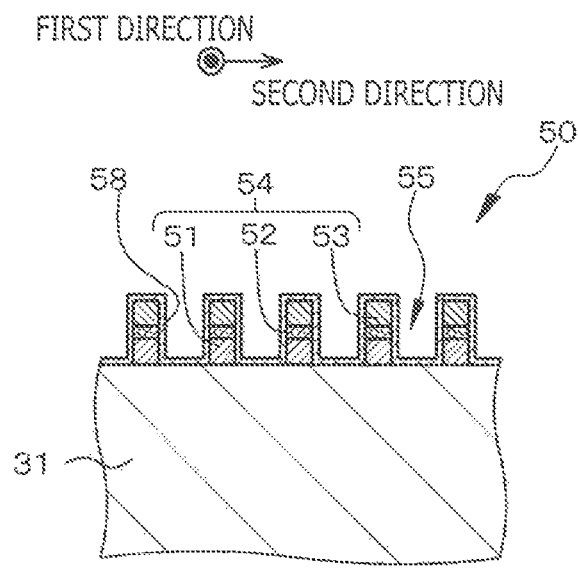

In some cases, as a schematic partial end view of the wire grid polarizer is depicted in FIG. 18B, a third protective film 58 including $SiO_2$, for example, may be formed on side surfaces of the line parts 54 that face the space part 55. In other words, the space parts 55 are filled with air, and the third protective film 58 is present at the space parts. The third protective film 58 is formed, for example, based on an HDP-CVD method, whereby the third protective film 58 which is thinner can be conformally formed on the side surfaces of the line parts 54.

Example 2

Figure 2:
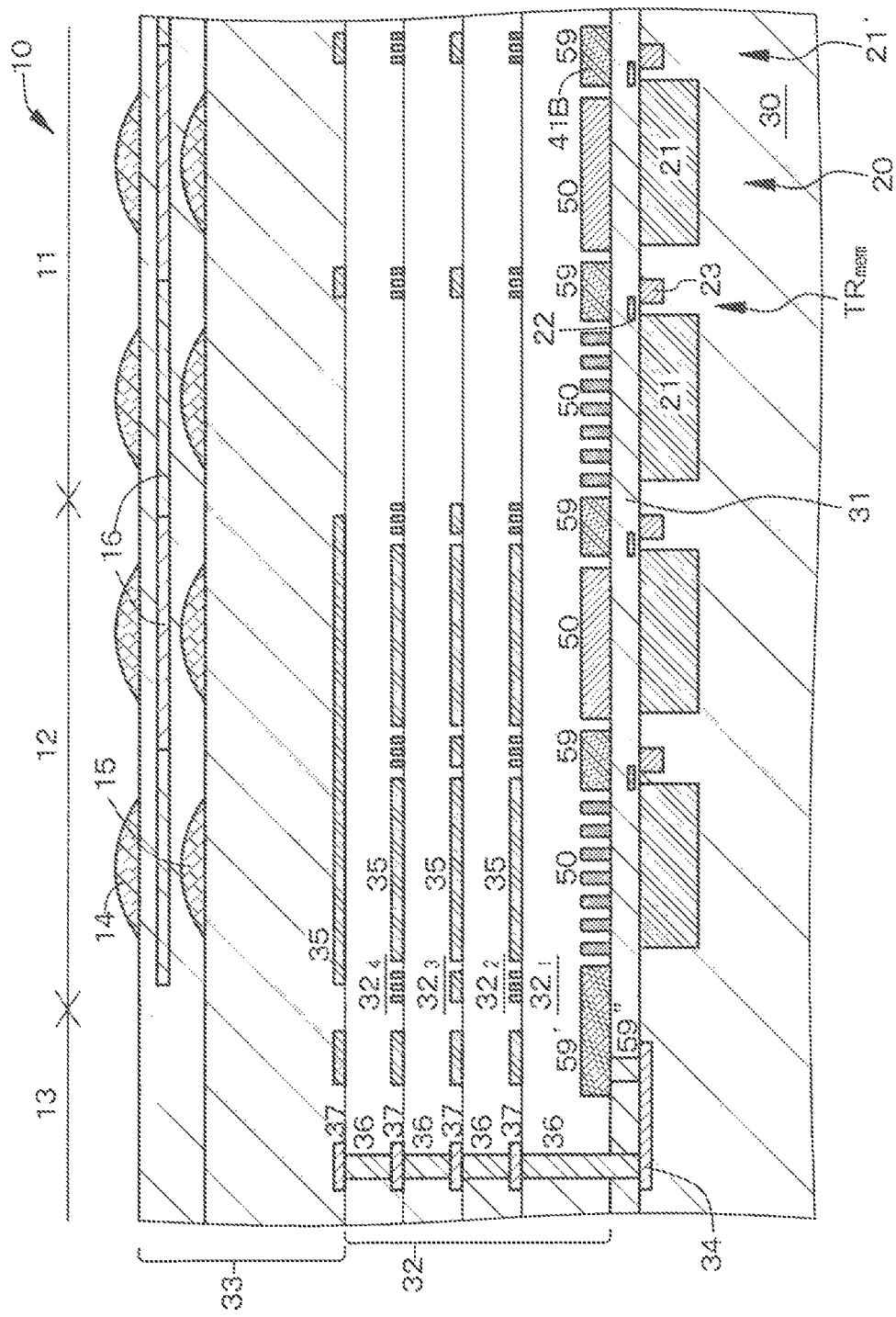
FIG. 2 is a schematic partial sectional view of an imaging element and a solid-state imaging device of Example 2.
Figure 3:
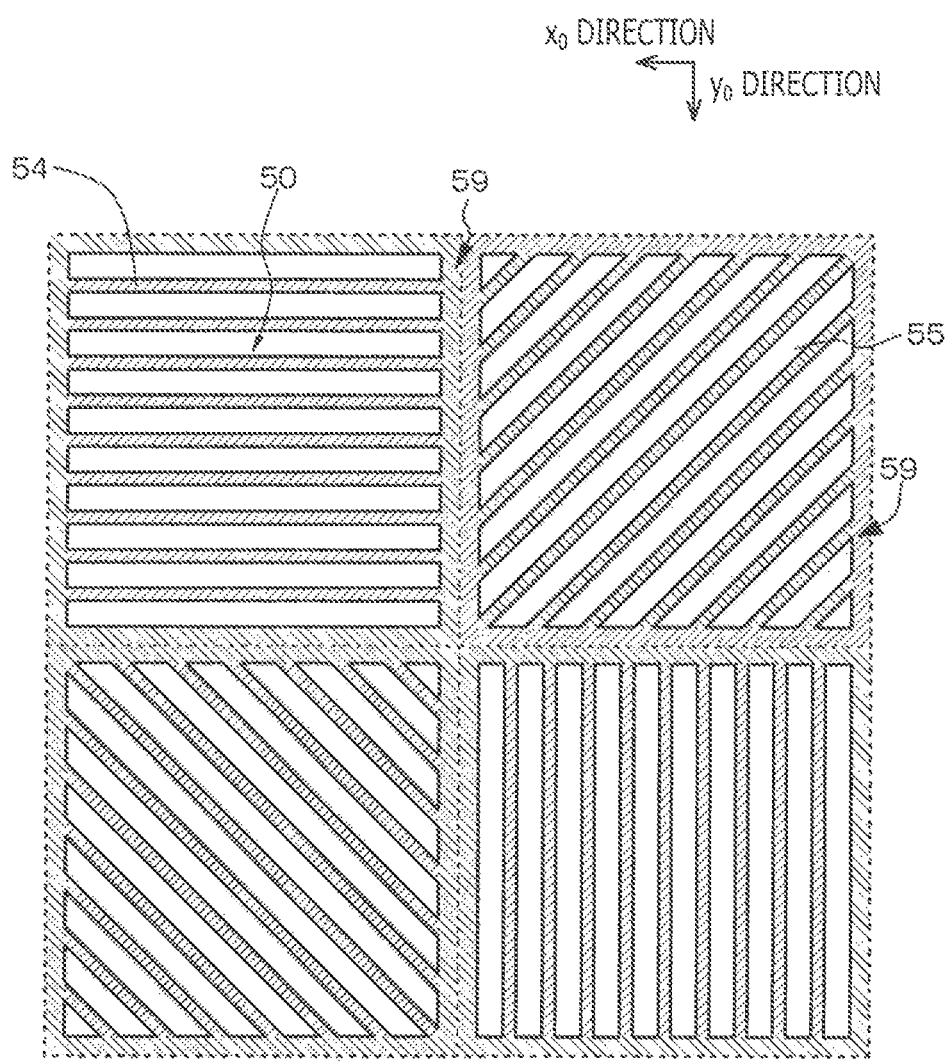
FIG. 3 is a schematic partial plan view of a wire grid polarizer in the imaging element of Example 2.

Example 2 is a modification of Example 1. As a partial sectional view of a solid-state imaging device including imaging elements of Example 2 is depicted in FIG. 2, first light shielding sections 41B formed on an upper side of peripheral regions 21' around photoelectric conversion sections 21 include frame sections 59 which are extension portions of the polarizers (wire grid polarizers 50). Specifically, as depicted in a schematic partial plan view in FIG. 3, the frame sections 59 surrounding the wire grid polarizers 50 are provided, and the frame sections 59 and the line parts 54 of the wire grid polarizers 50 are connected to each other. The frame section 59 has the same structure as that of the line part 54 of the wire grid polarizer 50, and functions as a first light shielding section 41B. In other words, the frame section 59 includes the second stacked structure including the light reflection layer 51, the insulating film 52 and the light absorbing layer 53, except that the space parts 55 are not provided.

A light shielding region 59' having the same structure as that of the frame section 59 may be formed in the optical black pixel region (OPB) 12. In addition, the wire grid polarizer 50, the frame section 59 and the light shielding region 59' may be connected through a contact hole 59" to a wiring section 34 provided in a silicon semiconductor substrate 30, whereby it is ensured that at the time of forming the wire grid polarizers, electrostatic charging of the wire grid polarizers can be securely prevented, and a problem of damaging of the wire grid polarizers or the imaging elements can be avoided assuredly.

In the imaging element of Example 2, with the frame sections and the line parts of the wire grid polarizers connected to each other, and with the frame section made to have the same structure at that of the line part of the wire grid polarizer, it is possible to stably form a wire grid polarizer which is homogenous and uniform. Therefore, it is possible to solve a problem that exfoliation is generated at a part of an outer peripheral portion of the wire grid polarizer corresponding to the four corners of the imaging element, a problem that a difference is generated between the structure of an outer peripheral portion of the wire grid polarizer and the structure of a central portion of the wire grid polarizer and that the performance of the wire grid polarizer itself is thereby lowered, and a problem that the light incident on the outer peripheral portion of the wire grid polarizer is liable to leak into the adjacent imaging elements differing in polarization direction, and it is possible to provide an imaging element and a solid-state imaging device which are high in reliability.

Except for the above-mentioned points, the configurations and structures of the imaging element and the solid-state imaging device of Example 2 may be similar to the configurations and structures of the imaging element and the solid-state imaging device described above in Example 1, and, therefore, detailed descriptions thereof are omitted. Note that the first light shielding section described in Example 2 and the first light shielding section described in Example 1 may be combined with each other.

Example 3

Figure 4:
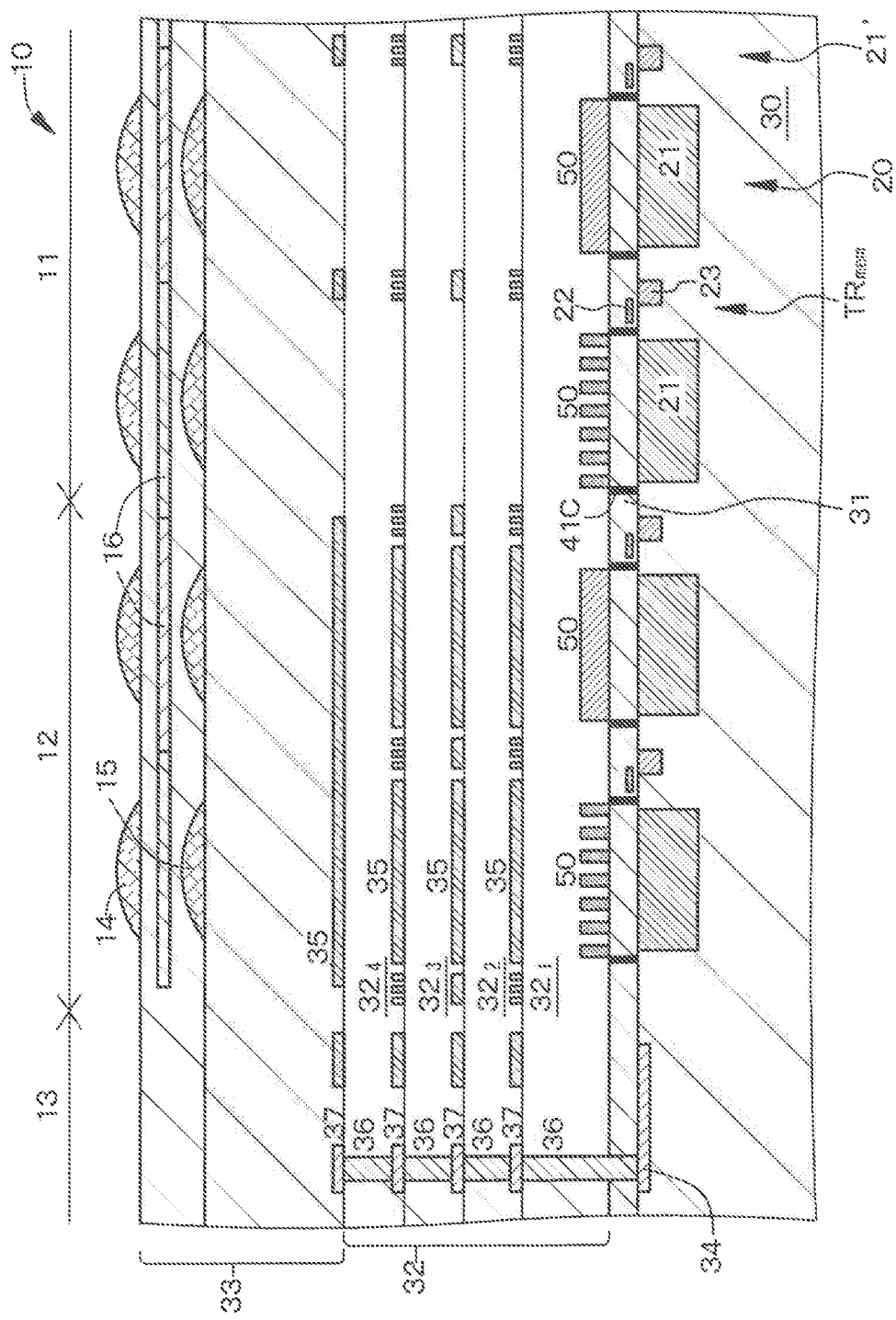
FIG. 4 is a schematic partial sectional view of an imaging element and a solid-state imaging device of Example 3.

Example 3 is also a modification of Example 1. As a partial sectional view of a solid-state imaging device including imaging elements of Example 3 is depicted in FIG. 4, first light shielding sections 41C formed on an upper side of peripheral regions 21' around photoelectric conversion sections 21 are formed in a region of a ground insulating layer 31 over the peripheral regions 21' around the photoelectric conversion sections 21, and include an insulating material which has a refractive index lower than the refractive index of the material constituting the ground insulating layer 31.

Except for the above-mentioned points, the configurations and structures of the imaging element and the solid-state imaging device of Example 3 may be similar to the configurations and structures of the imaging element and the solid-state imaging device described above in Example 1, and, therefore, detailed descriptions thereof are omitted. Note that the first light shielding section described in Example 3 and the first light shielding section described in Example 2 may be combined with each other; the first light shielding section described in Example 3 and the first light shielding section described in Example 1 may be combined with each other; or the first light shielding section described in Example 3 and the first light shielding sections described in Examples 1 and 2 may be combined with one another.

Figure 5:
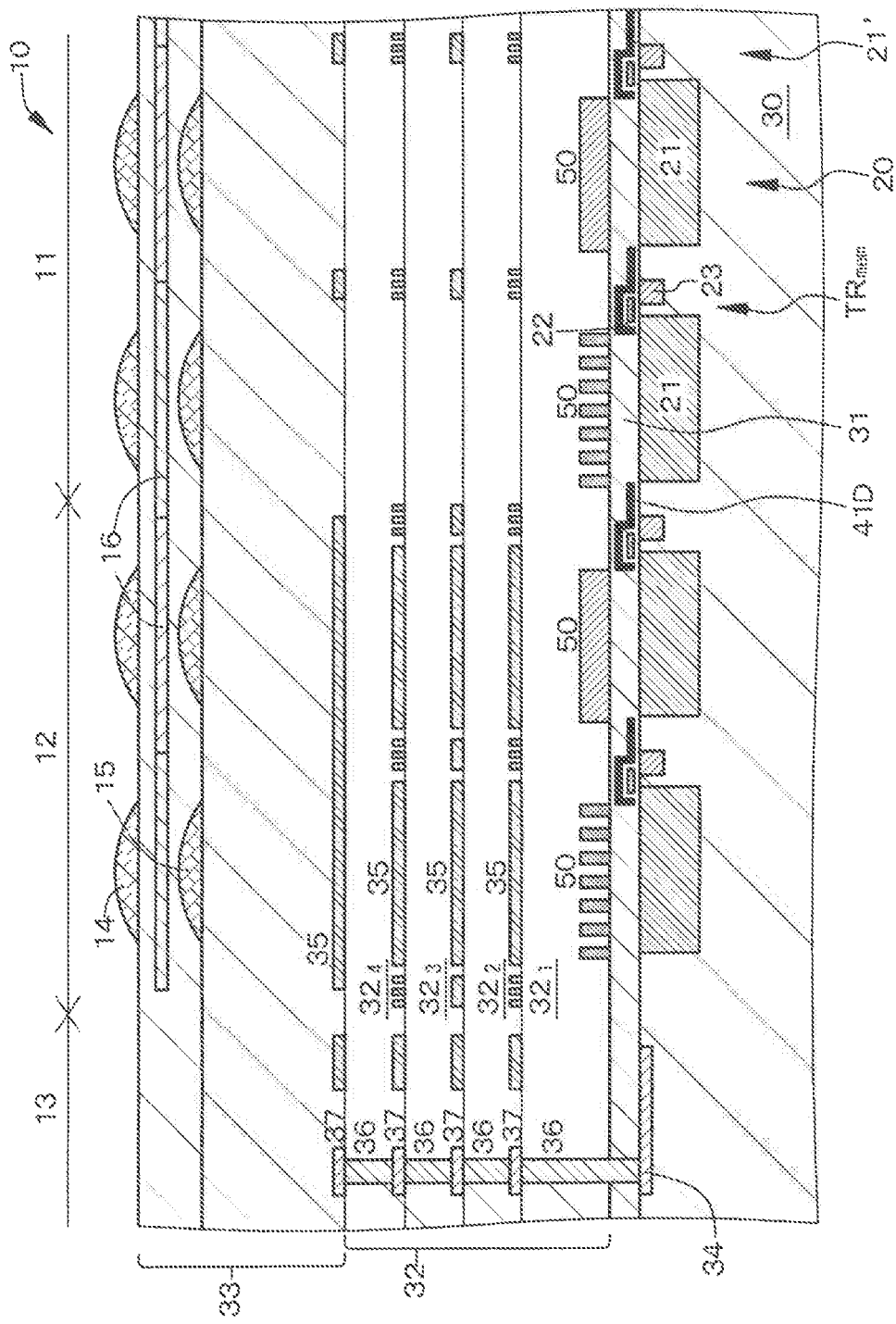
FIG. 5 is a schematic partial sectional view of a modification of the imaging element and the solid-state imaging device of Example 3.

Note that as a partial sectional view of the solid-state imaging device including the imaging elements is illustrated in FIG. 5, first light shielding sections 41D including a non-light-transmitting metallic material layer or alloy material layer [for example, chromium (Cr), copper (Cu), aluminum (Al), tungsten (W), gold (Au), silver (Ag), platinum (Pt)] or a non-light-transmitting resin material layer [for example, polyimide resin] may be formed over the peripheral regions 21' around the photoelectric conversion sections 21.

Example 4

Figure 6:
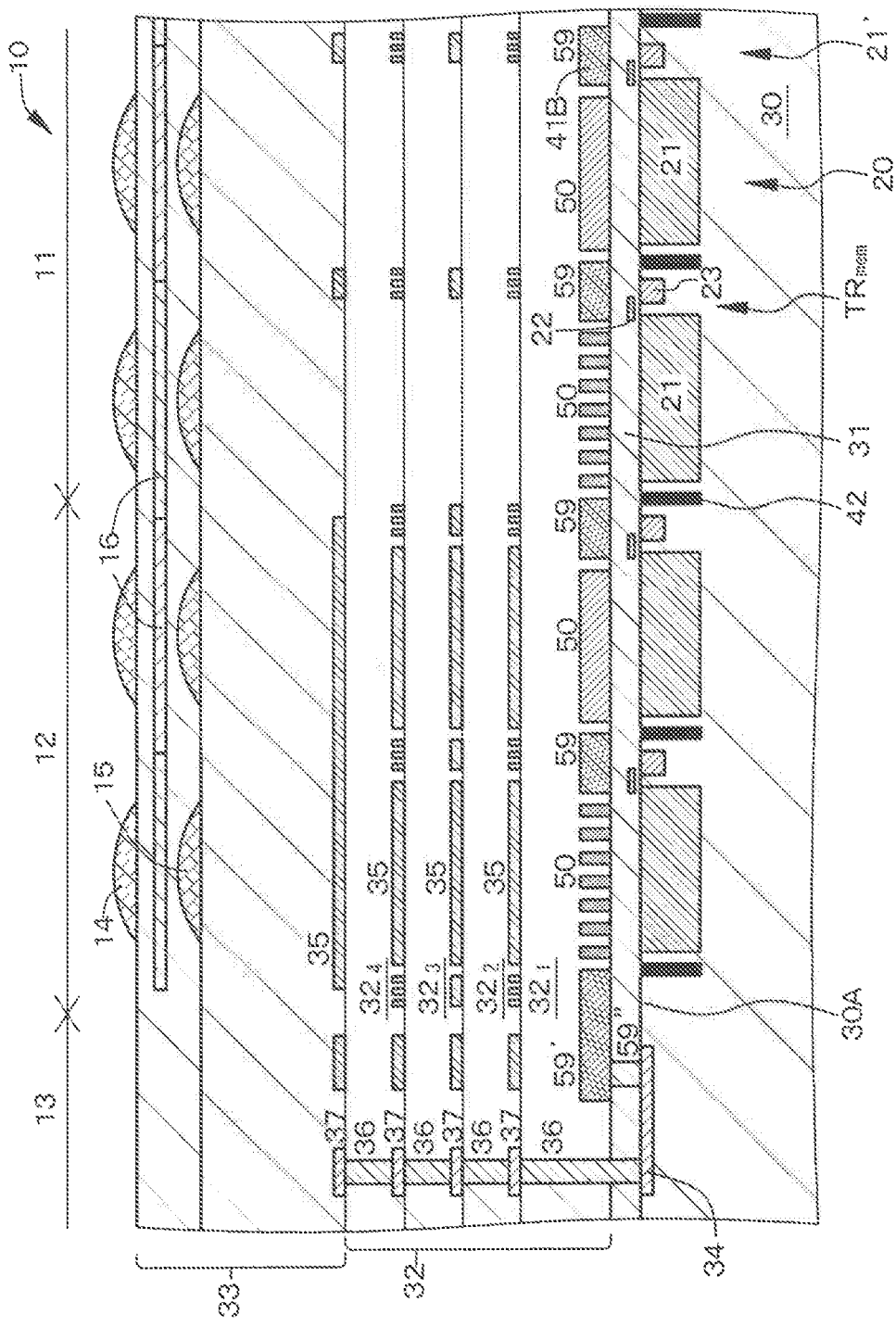
FIG. 6 is a schematic partial sectional view of an imaging element and a solid-state imaging device of Example 4.

Example 4 is a modification of Examples 1 to 3. As a partial sectional view of a solid-state imaging device including imaging elements of Example 4 as a modification of Example 2 is illustrated in FIG. 6, second light shielding sections 42 extending inside a substrate (silicon semiconductor substrate) 30 in the thickness direction of the substrate 30 from a front surface 30A of the substrate 30 are further provided in peripheral regions 21' around photoelectric conversion sections 21. The material constituting the second light shielding sections 42 includes a metal, an alloy, a metallic nitride, a metallic silicide or a non-light-transmitting resin, and specifically includes tungsten (W), for example.

To form the second light shielding sections 42, the substrate 30 is formed with grooves in regions where the second light shielding sections 42 are to be formed. Then, an insulating material layer may be formed on side surfaces and bottom surfaces of the grooves, after which the grooves may be filled with tungsten based on a CVD method, for example.

With the second light shielding sections 42 thus provided, leaking-in of light into the adjacent imaging elements (polarization crosstalk) can be prevented more securely, and a higher extinction ratio can be obtained. First light shielding sections may be made to be the first light shielding sections 41A, 41C and 41D described in Example 1 or 3. A similar point is applicable also to Examples 5 and 6 described below.

Example 5

Figure 7:
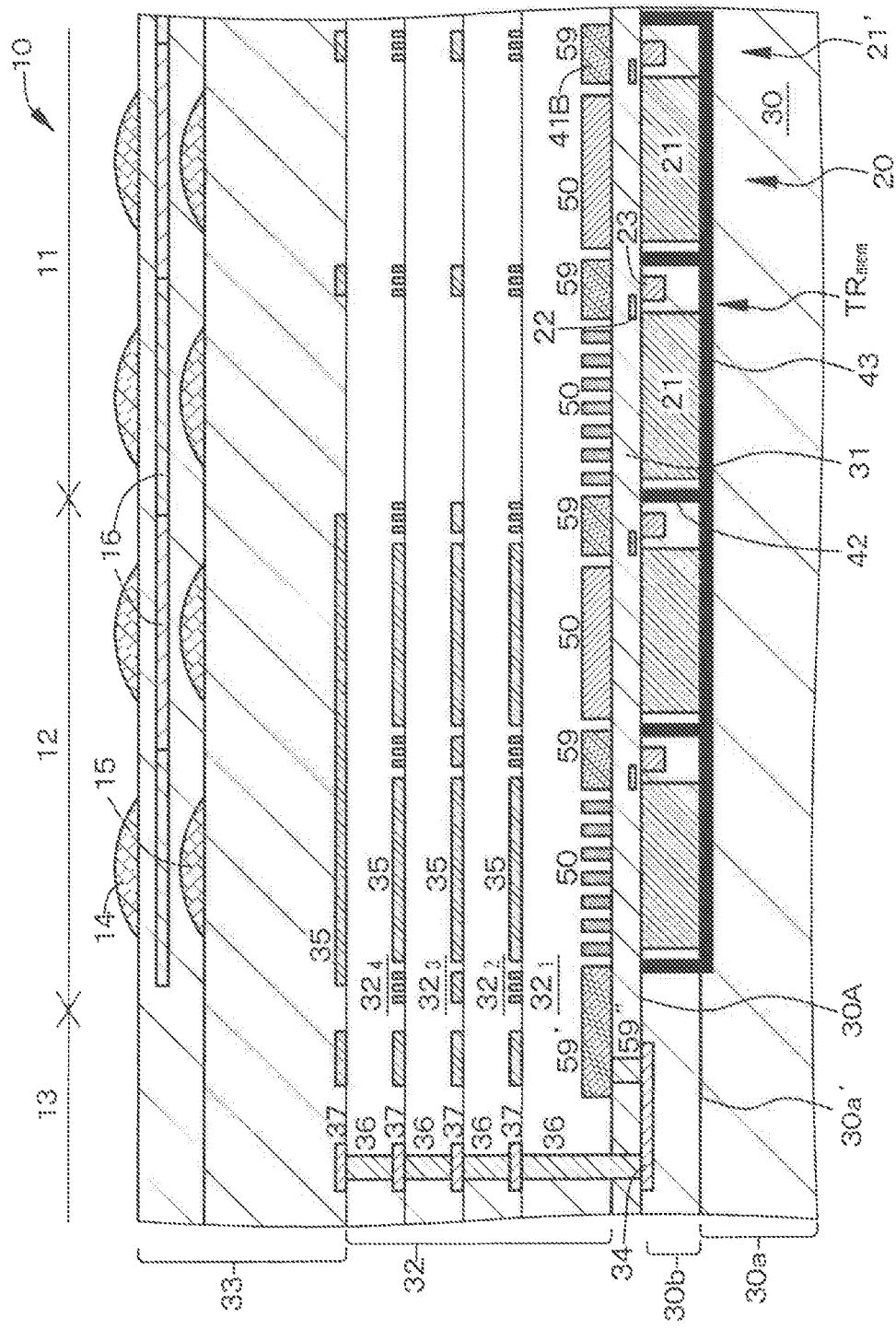
FIG. 7 is a schematic partial sectional view of an imaging element and a solid-state imaging device of Example 5.

Example 5 is a modification of Example 4. As a partial sectional view of a solid-state imaging device including imaging elements of Example 5 as a modification of Example 2 is illustrated in FIG. 7, a third light shielding section 43 formed in a substrate (silicon semiconductor substrate) 30 in parallel to a front surface 30A of the substrate 30 from tip portions of second light shielding sections 42 extending inside the substrate 30 is further provided. The material constituting the third light shielding section 43 includes a metal, an alloy, a metallic nitride, a metallic silicide or a non-light-transmitting resin, and specifically includes tungsten (W), for example. In other words, in Example 5, the material constituting the second light shielding sections 42 and the material constituting the third light shielding section 43 are the same material. It is sufficient if the depth from the front surface 30A of the substrate 30 to the third light shielding section 43 formed inside the substrate 30 is determined in consideration of the wavelength of light (including not only visible light but also infrared light) to be absorbed by the photoelectric conversion section 21, since that region of the substrate which ranges from the front surface 30A of the substrate 30 to the third light shielding section 43 serves as the photoelectric conversion section 21.

With the third light shielding section thus provided, leaking-in of light into the adjacent imaging elements (polarization crosstalk) can be prevented more securely, and a further higher extinction ratio can be obtained.

The third light shielding section 43 can be formed, for example, based on a method described below. A semiconductor substrate 30a depicted in FIG. 7 is formed with various transistors, wiring and the like. Then, a so-called sacrificing layer is formed on a top surface 30a' of the semiconductor substrate 30a. Thereafter, a semiconductor layer 30b is formed over the top surface 30a' of the semiconductor substrate 30a and the sacrificing layer, and the photoelectric conversion section 21 is formed in the semiconductor layer 30b. Note that the semiconductor substrate 30a and the semiconductor layer 30b are collectively referred to as the substrate (silicon semiconductor substrate) 30. Then, to form the second light shielding sections 42, the substrate 30 is formed with grooves in the regions (the regions of the semiconductor layer 30b) in which the second light shielding sections 42 are to be formed. An insulating material layer is formed on side surfaces of the grooves, and then the sacrificing layer is removed through the grooves based on a wet etching method. Thereafter, for example, the region of the semiconductor substrate 30a deprived of the sacrificing layer and the grooves are filled with tungsten based on a CVD method, whereby the third light shielding section 43 and the second light shielding sections 42 can be obtained. It is to be noted, however, that the method for forming the third light shielding section 43 and the second light shielding sections 42 is not limited to such a method.

Example 6

Figure 8:
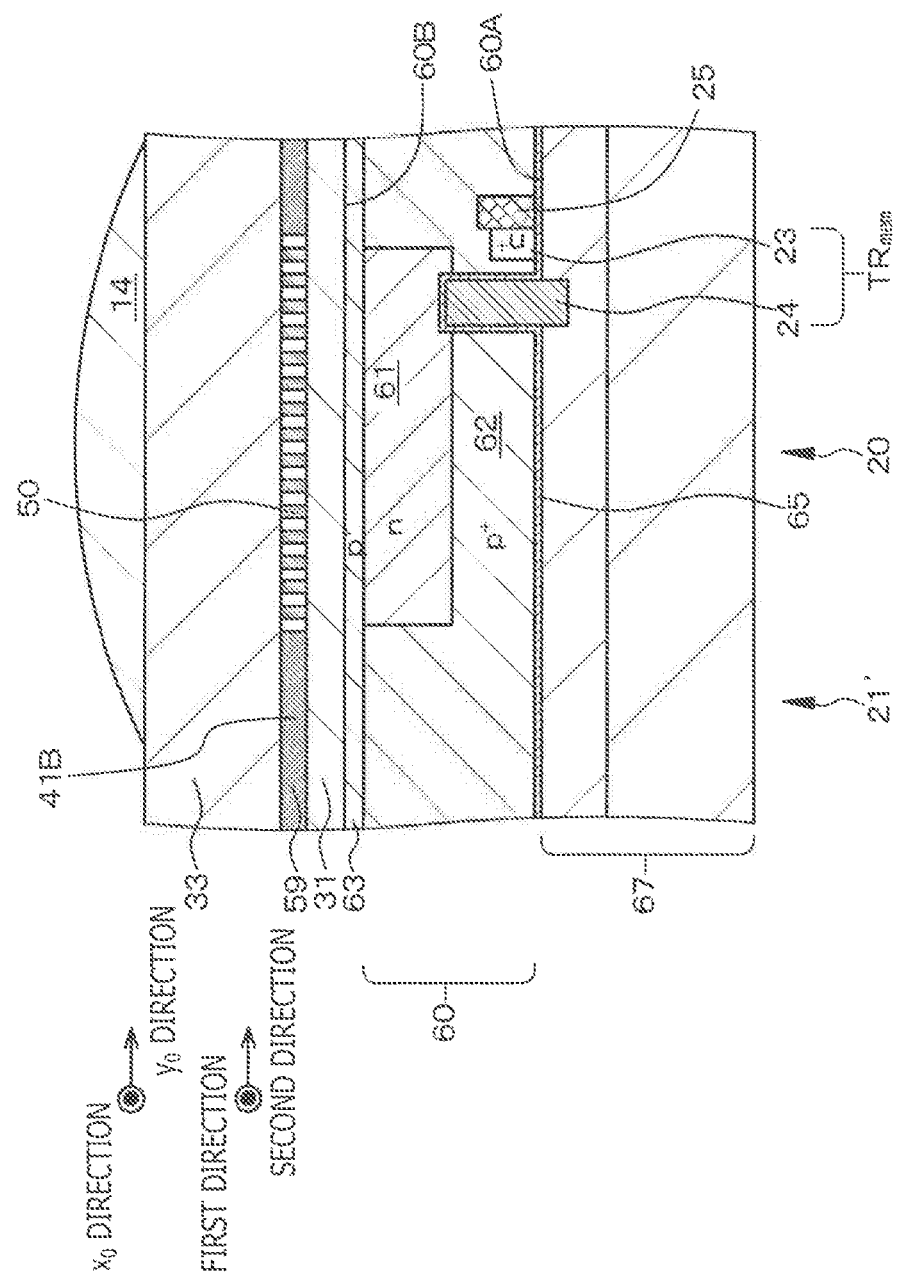
FIG. 8 is a schematic partial sectional view of an imaging element and a solid-state imaging device of Example 6, which is a modification of Example 2.

Example 6 is a modification of Examples 1 to 5. In Example 6, an imaging element includes a back illumination type imaging element. A schematic partial sectional view of the imaging element of Example 6 is illustrated in FIG. 8. Note that in FIG. 8 or in FIGS. 9 to 12 described later, sub on-chip microlenses (OPA) and wavelength selecting means are provided at a first planarization film, a second planarization film and a third planarization film (denoted by reference sign 33), but these are omitted from illustration. In addition, in the example depicted in FIG. 8, first light shielding section include the first light shielding sections 41B in Example 2.

In the imaging element of Example 6, a photoelectric conversion section 61 includes an n-type semiconductor region provided in a semiconductor substrate 60. The photoelectric conversion section 61 including the n-type semiconductor region is surrounded by a p-type semiconductor region 62. A gate section 24 of a memory section $TR_{mem}$ including a vertical type transistor extends to the photoelectric conversion section 61, and is connected to a memory selection line MEM. In addition, a high-concentration impurity region 23 is provided in a region of the semiconductor substrate 60 in the vicinity of the gate section 24 of the memory section $TR_{mem}$. An electric charge generated in the photoelectric conversion section 61 is accumulated in the high-concentration impurity region 23 by way of a transfer channel formed along the gate section 24. Further, a transfer transistor $TR_{trs}$, a reset transistor $TR_{rst}$, an amplifying transistor $Tr_{amp}$ and a selection transistor $TR_{sel}$ constituting a control section for the photoelectric conversion section 61 are provided on a first surface (front surface) 60A side of the semiconductor substrate 60.

A $p^+$ layer 63 is provided between the photoelectric conversion section 61 and the front surface 60A of the semiconductor substrate 60, to restrain generation of a dark current. An oxide film 65 is formed on a second surface (back surface) 60B side of the semiconductor substrate 60.

Over the $p^+$ layer 63, there are disposed a ground insulating layer 31, a wire grid polarizer 50 including a first light shielding section 41B (frame section 59), a first planarization film, a sub on-chip microlens (OPA), a second planarization film, wavelength selecting means (specifically, known color filter layers), a third planarization film, and a main on-chip microlens 14.

The imaging element of Example 6 can be produced, for example, by the following method. First, an SOI substrate is prepared. A first silicon layer is formed over a surface of the SOI substrate based on an epitaxial growth method, and a $p^+$ layer 63 and a photoelectric conversion section (n-type semiconductor region) 61 are formed over the first silicon layer. Next, a second silicon layer is formed over the first silicon layer based on an epitaxial growth method, and an element separation region 25 and an oxide film 65 are formed on the second silicon layer. In addition, the second silicon layer is formed with various transistors and the like constituting a control section for the imaging element, then a wiring layer (not illustrated), an interlayer insulating layer 67 and various wirings are further formed thereover, and the interlayer insulating layer 67 and a support substrate (not illustrated) are adhered to each other. Thereafter, the SOI substrate is removed, to expose the first silicon layer. The surface of the second silicon layer corresponds to the front surface 60A of the semiconductor substrate 60, and the surface of the first silicon layer corresponds to the back surface 60B of the semiconductor substrate 60. In addition, the first silicon layer and the second silicon layer are collectively expressed as the semiconductor substrate 60. Next, the ground insulating layer 31, the wire grid polarizer 50 including the first light shielding section 41B (frame section 59), the first planarization film, the sub on-chip microlens (OPA), the second planarization film, the wavelength selecting means (specifically, for example, a known color filter layer), the third planarization film, and the main on-chip microlens 14 are formed over the $p^+$ layer 63. By these operations, the imaging element of Example 6 can be obtained.

Figure 9:
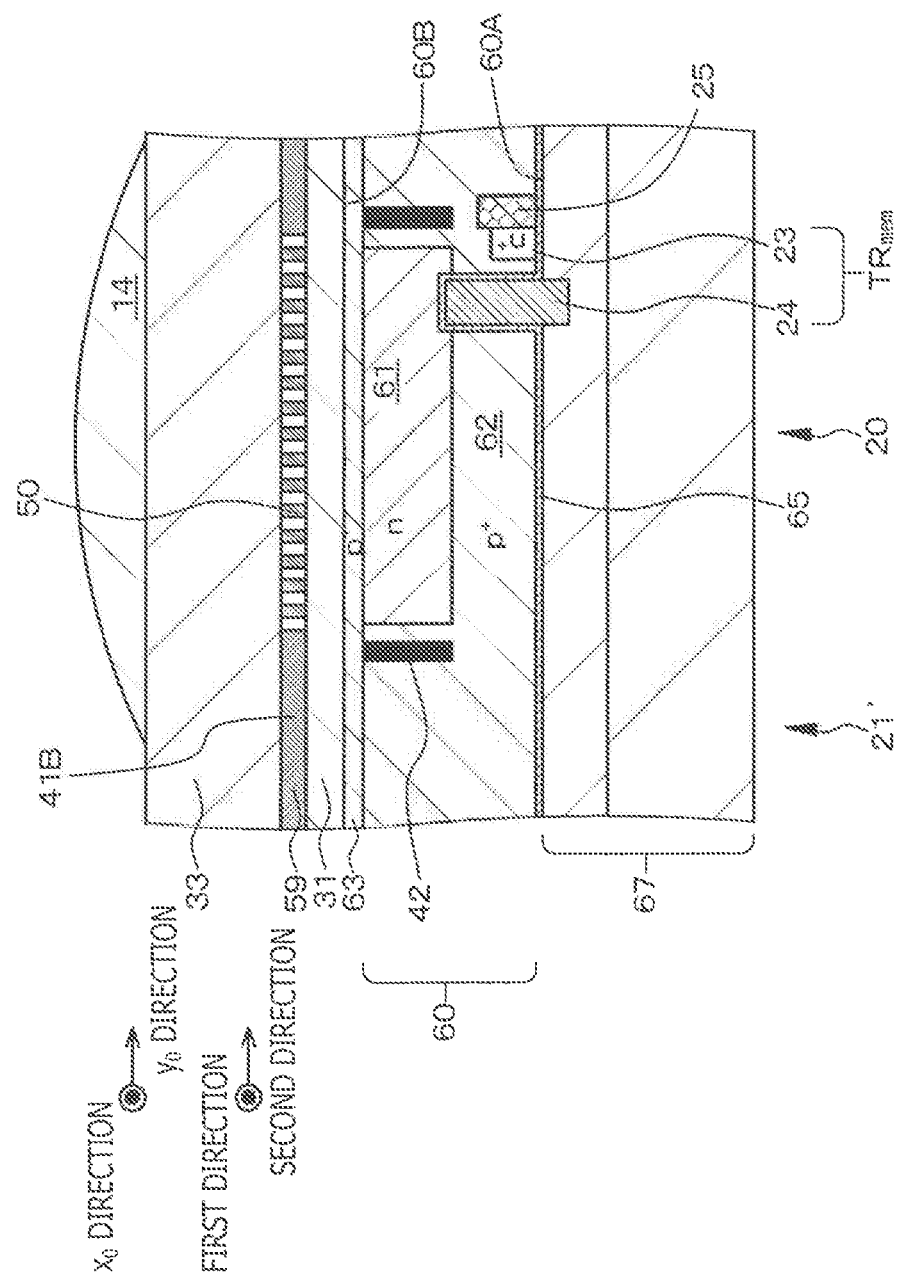
FIG. 9 is a schematic partial sectional view of a modification of the imaging element and the solid-state imaging device of Example 6, which is a modification of Example 2.

While a schematic partial sectional view of a modification of the imaging element of Example 6 is illustrated in FIG. 9, the second light shielding section 42 described in Example 4 is provided in this modification. In addition, while a schematic partial sectional view of another modification of the imaging element of Example 6 is depicted in FIG. 10, the second light shielding section 42 described in Example 4 and the third light shielding section 43 described in Example 5 are provided in this modification.

Figure 10:
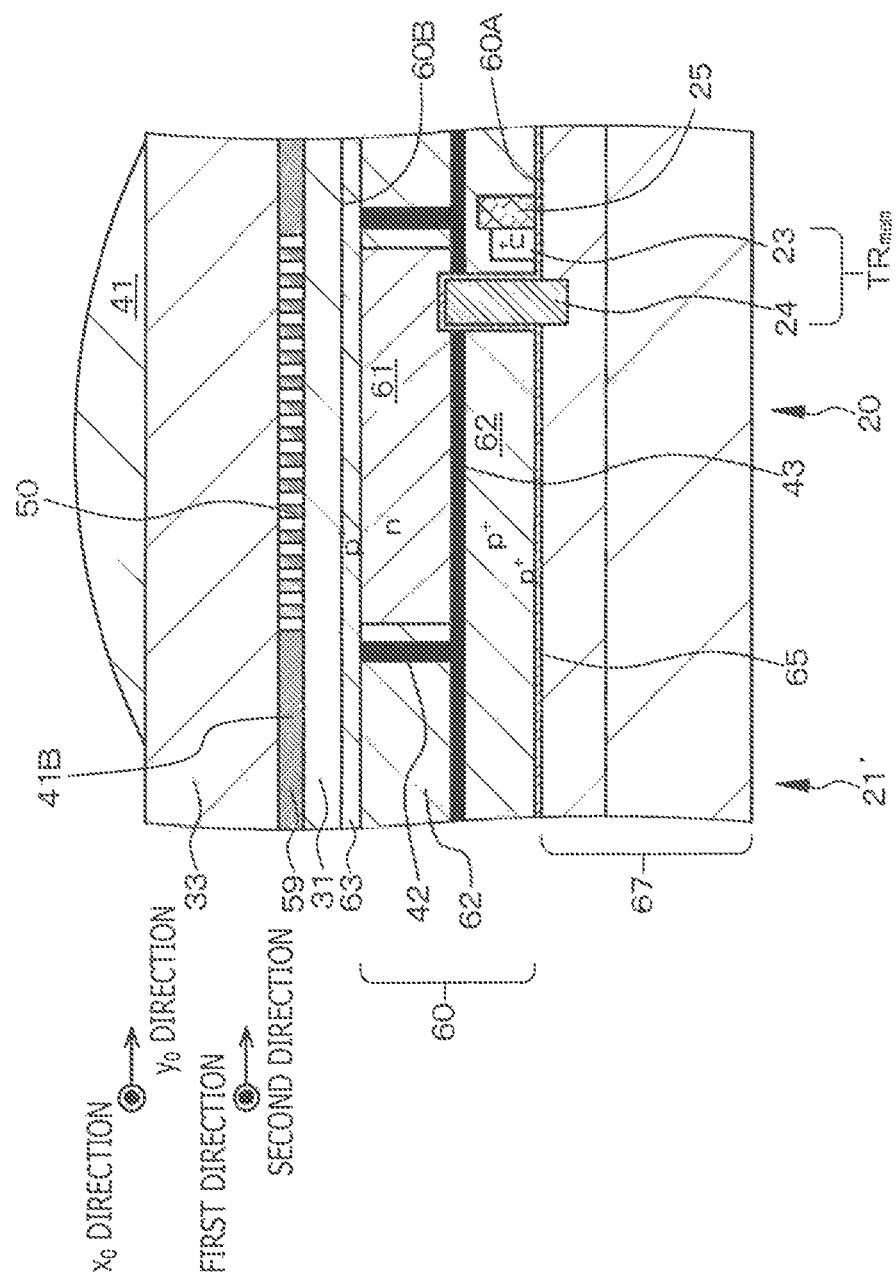
FIG. 10 is a schematic partial sectional view of an imaging element and a solid-state imaging device of Example 6, which is a modification of Example 5.

The modification of the imaging element of Example 6 depicted in FIG. 10 can be produced, for example, by the following method. First, an SOI substrate is prepared. A first silicon layer is formed on a surface of the SOI substrate based on an epitaxial growth method, a $p^+$ layer 63 and a photoelectric conversion section (n-type semiconductor region) 61 are formed in the first silicon layer, and, further, a so-called sacrificing layer is formed in regions in which to form a second light shielding section 42 and a third light shielding section 43. Next, a second silicon layer is formed over the first silicon layer based on an epitaxial growth method, and an element separation region 25 and an oxide film 65 are formed over the second silicon layer. In addition, the second silicon layer is formed with various transistors and the like for constituting a control section for the imaging element, and, further, a wiring layer (not illustrated), an interlayer insulating layer 67 and various wirings are formed thereover, after which the interlayer insulating layer 67 and a support substrate (not illustrated) are adhered to each other. Thereafter, the SOI substrate is removed, to expose the first silicon layer. Then, after the sacrificing layer is removed, for example, the region of the first silicon layer deprived of the SOI substrate is filled with tungsten based on a CVD method, whereby the third light shielding section 43 and the second light shielding section 42 can be obtained. Thereafter, a ground insulating layer 31, a wire grid polarizer 50 including a first light shielding section 41B (frame section 59), a first planarization film, a sub on-chip microlens (OPA), a second planarization film, wavelength selecting means (specifically, for example, a known color filter layer), a third planarization film, and a main on-chip microlens 14 are formed over the $p^+$ layer 63. By these operations, imaging element of the modification of Example 6 can be obtained. It is to be noted, however, that the method for forming the third light shielding section 43 and the second light shielding section 42 is not limited to such a method.

In Example 6, also, the first light shielding section may be the first light shielding section 41A, 41C, 41D described in Example 1 or Example 3. In addition, the second light shielding section 42 and the third light shielding section 43 described in Examples 4 and 5 are also applicable.

Example 7

Figure 11:
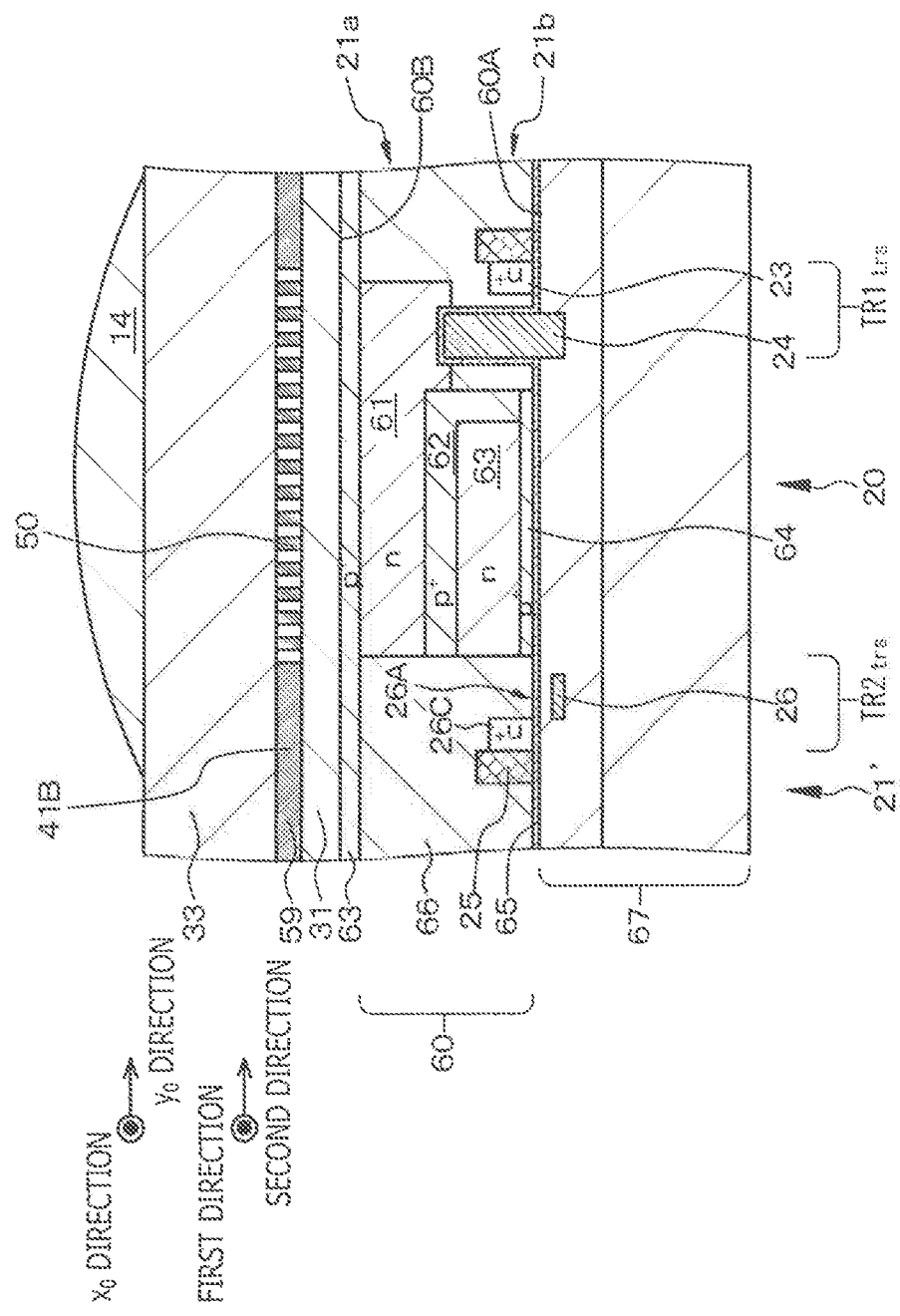
FIG. 11 is a schematic partial sectional view of an imaging element and a solid-state imaging device of Example 7, which is a modification of Example 2.
Figure 21A:
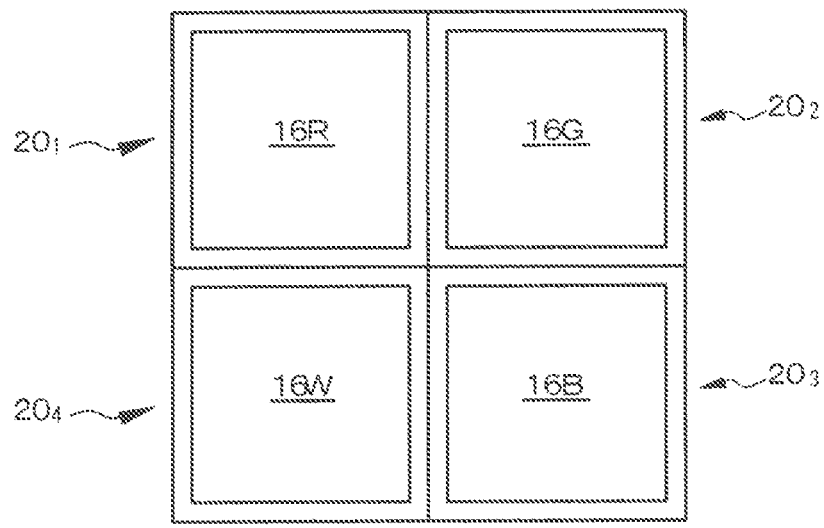
FIGS. 21A and 21B are respectively a schematic layout drawing of color filter layers and the like constituting a red light imaging element, a green light imaging element, a blue light imaging element and a white light imaging element in Example 7, and a schematic layout drawing of wire grid polarizers.
Figure 21B:
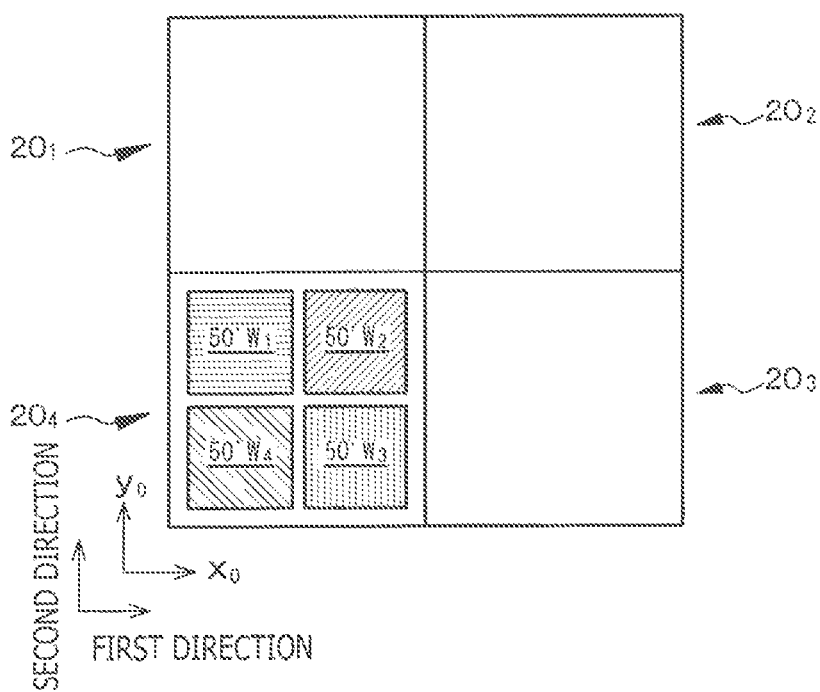
Figure 22A:
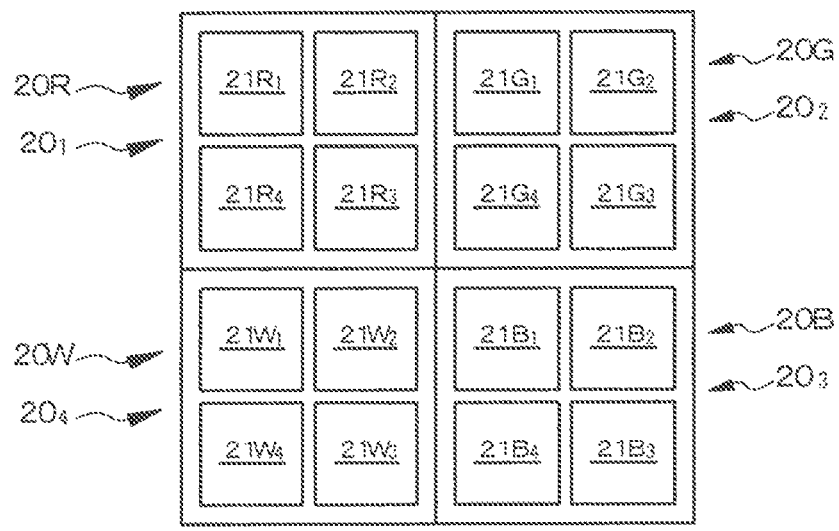
FIGS. 22A and 22B are respectively a schematic layout drawing of upper-layer photoelectric conversion sections constituting the red light imaging element, the green light imaging element, the blue light imaging element and the white light imaging element in Example 7, and a schematic layout drawing of lower-layer photoelectric conversion sections.
Figure 22B:
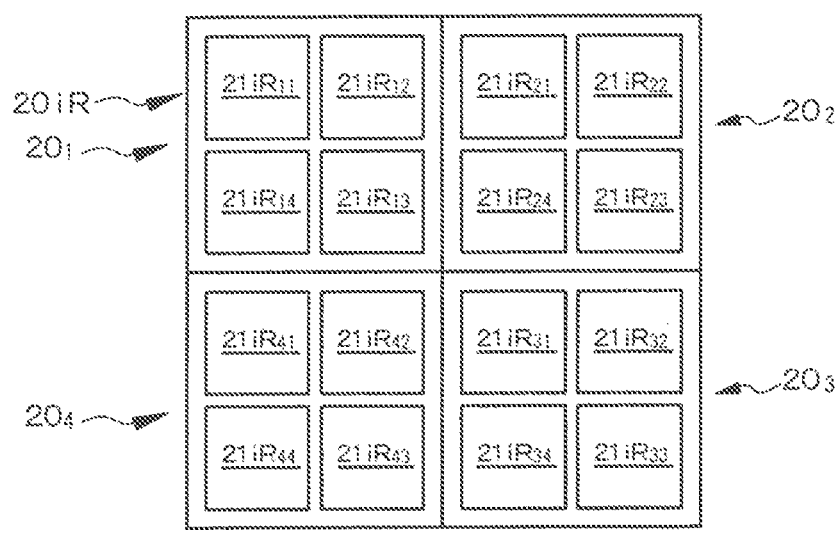

Example 7 is a modification of Examples 1 to 6, and two photoelectric conversion sections are stacked in Example 7. In other words, the imaging element of Example 7 includes a back illumination type stacked type imaging element. A schematic partial sectional view of a stacked type photoelectric conversion section of Example 7 as a modification of Example 2 is illustrated in FIG. 11, a schematic layout drawing of color filter layers and the like for constituting a red light imaging element, a green light imaging element, a blue light imaging element and a white light imaging element is depicted in FIG. 21A, a schematic layout drawing of a wire grid polarizer is illustrated in FIG. 21B, a schematic layout drawing of an upper-layer photoelectric conversion section is depicted in FIG. 22A, and a schematic layout drawing of a lower-layer photoelectric conversion section is illustrated in FIG. 22B. Note that only part of transistors are illustrated in FIG. 11.

The stacked type imaging element of Example 7 includes a wire grid polarizer 50 including a first light shielding section 41B (frame section 59), and a plurality of stacked photoelectric conversion sections 21*a* and 21*b*. The wire grid polarizer 50 and the plurality of photoelectric conversion sections 21*a* and 21*b* are stacked in a state in which the wire grid polarizer 50 is disposed on the light incidence side as compared to the plurality of photoelectric conversion sections 21*a* and 21*b*.

In addition, a solid-state imaging device of Example 7 has a configuration in which imaging element units each including four imaging elements of a first imaging element $20_1$, a second imaging element $20_2$, a third imaging element $20_3$ and a fourth imaging element $20_4$ arranged in a 2×2 pattern are arranged in a two-dimensional matrix, in which each of the imaging element units is further provided with a wire grid polarizer 50W at least on the light incidence side of the fourth imaging element $20_4$.

In Example 7, the plurality of photoelectric conversion sections includes a photoelectric conversion section 21W sensitive to white light, and a photoelectric conversion section 21iR sensitive to near infrared light. Here, the photoelectric conversion section 21W constitutes an upper-layer photoelectric conversion section 21*a*, while the photoelectric conversion section 21iR constitutes a lower-layer photoelectric conversion section 21*b*. A photoelectric conversion section 21R sensitive to red light, a photoelectric conversion section 21G sensitive to green light, and a photoelectric conversion section 21B sensitive to blue light are formed at the same level as the photoelectric conversion section 21W sensitive to white light. In addition, no wire grid polarizer is provided on an upper side of the photoelectric conversion section 21R sensitive to red light, the photoelectric conversion section 21G sensitive to green light and the photoelectric conversion section 21B sensitive to blue light, whereas the photoelectric conversion section 21iR sensitive to near infrared light is provided on a lower side of them.

Since color filter layers 16R, 16G and 16B are provided, the photoelectric conversion section 21R, the photoelectric conversion section 21G, the photoelectric conversion section 21B and the photoelectric conversion section 21W may be the same in configuration and structure, and these photoelectric conversion sections 21R, 21G and 21B preferably include a photoelectric conversion section capable of photoelectric conversion of while wavelength region of visible light. In addition, the configuration and the structure of the photoelectric conversion section 21iR are also the same. Near infrared light is transmitted through the color filter layers 16R, 16G and 16B. Though not limitative, it is sufficient if the photoelectric conversion sections 21R, 21G, 21B and 21W include an organic photoelectric conversion material or, for example, a silicon layer having a thickness of approximately 3 µm, whereas the photoelectric conversion section 21iR includes an organic photoelectric conversion material or, for example, a silicon layer having a thickness of approximately 4 µm. This can be similarly applied also to various modifications of Example 7 which will be described later.

Besides, in the imaging element of Example 7, the wire grid polarizer 50W has a configuration in which four polarizer segments of a first polarizer segment $50'W_1$, a second polarizer segment $50'W_2$, a third polarizer segment $50'W_3$ and a fourth polarizer segment $50'W_4$ are arranged in a 2×2 pattern. Of these four polarizer segments, two polarizer segments are arrayed in the $x_0$ direction, and two polarizer segments are arrayed in the $y_0$ direction. The polarization orientation in which light is to be transmitted by the first polarizer segment $50'W_1$ is α degrees, the polarization orientation in which light is to be transmitted by the second polarizer segment $50'W_2$ is (α+45) degrees, the polarization orientation in which light is to be transmitted by the third polarizer segment $50'W_3$ is (α+90) degrees, and the polarization orientation in which light is to be transmitted by the fourth polarizer segment $50'W_4$ is (α+135) degrees. As the value of α, an angle formed with the $y_0$ direction of "0 degrees" was adopted.

Here, the imaging element of Example 7 depicted in FIG. 11 is a back illumination type imaging element. Specifically, in an example illustrated in FIGS. 21A, 21B, 22A and 22B, a first imaging element $20_1$ includes a red color filter layer 16R [see FIG. 21A], four upper-layer photoelectric conversion sections 21a (red light photoelectric conversion sections $21R_1$, $21R_2$, $21R_3$ and $21R_4$) [see FIG. 22A] disposed on a lower side of the red color filter layer 16R, and lower-layer photoelectric conversion sections 21b (near infrared light photoelectric conversion sections $21iR_{11}$, $21iR_{12}$, $21iR_{13}$ and $21iR_{14}$) [see FIG. 22B] disposed respectively on a lower side of the upper-layer photoelectric conversion sections 21a.

In addition, a second imaging element $20_2$ includes a green color filter layer 16G (see FIG. 21A), four upper-layer photoelectric conversion sections 21a (green light photoelectric conversion sections $21G_1$, $21G_2$, $21G_3$ and $21G_4$) disposed on a lower side of the green color filter layer 16G, and lower-layer photoelectric conversion sections 21b (near infrared light photoelectric conversion sections $21iR_{21}$, $21iR_{22}$, $21iR_{23}$ and $21iR_{24}$) disposed respectively on a lower side of the upper-layer photoelectric conversion sections 21a.

Further, a third imaging element $20_3$ includes a blue color filter layer 16B (see FIG. 21A), four upper-layer photoelectric conversion sections 21a (blue light photoelectric conversion sections $21B_1$, $21B_2$, $21B_3$ and $21B_4$) disposed on a lower side of the blue color filter layer 16B, and lower-layer photoelectric conversion sections 21b (near infrared light photoelectric conversion sections $21iR_{31}$, $21iR_{32}$, $21iR_{33}$ and $21iR_{34}$) disposed respectively on a lower side of the upper-layer photoelectric conversion sections 21a.

Besides, a fourth imaging element $20_4$ includes a transparent resin layer 16W (see FIG. 21A), four polarizer segments $50'W_1$, $50'W_2$, $50'W_3$ and $50'W_4$ disposed on a lower side of the transparent resin layer 16W, upper-layer photoelectric conversion sections 21a (white light photoelectric conversion sections $21W_1$, $21W_2$, $21W_3$ and $21W_4$) disposed respectively on a lower side of the four wire grid polarizers, and lower-layer photoelectric conversion sections 21b (near infrared light photoelectric conversion sections $21iR_{41}$, $21iR_{44}$, $21iR_{43}$ and $21iR_{44}$) disposed respectively on a lower side of the upper-layer photoelectric conversion sections 21a.

In other words, the first imaging element $20_1$ includes a photoelectric conversion section sensitive to red light and a photoelectric conversion section sensitive to near infrared light, the second imaging element $20_2$ includes a photoelectric conversion section sensitive to green light and a photoelectric conversion section sensitive to near infrared light, the third imaging element $20_3$ includes a photoelectric conversion section sensitive to blue light and a photoelectric conversion section sensitive to near infrared light, the fourth imaging element $20_4$ includes a photoelectric conversion section sensitive to white light and a photoelectric conversion section sensitive to near infrared light, wire grid polarizers provided on the light incidence side of the fourth imaging element $20_4$ include four polarizer segments of a 4-1th wire grid polarizer (polarizer segment) $50'W_1$, a 4-2th wire grid polarizer (polarizer segment) $50'W_2$, a 4-3th wire grid polarizer (polarizer segment) $50'W_3$ and a 4-4th wire grid polarizer (polarizer segment) $50'W_4$ which are arranged in a 2×2 pattern (namely, two polarizer segments are arrayed in the $x_0$ direction, and two polarizer segments are arrayed in the $y_0$ direction), the polarization orientation in which light is to be transmitted by the 4-1th wire grid polarizer (polarizer segment) $50'W_1$ is α degrees, the polarization orientation in which light is to be transmitted by the 4-2th wire grid polarizer (polarizer segment) $50'W_2$ is (α+45) degrees, the polarization orientation in which light is to be transmitted by the 4-3th wire grid polarizer (polarizer segment) $50'W_3$ is (α+90) degrees, and the polarization orientation in which light is to be transmitted by the 4-4th wire grid polarizer (polarizer segment) $50'W_4$ is (α+135) degrees.

The upper-layer photoelectric conversion sections 21a may be similar to the structure of the imaging element described in Example 6.

The lower-layer photoelectric conversion section 21b includes an n-type semiconductor region 63 provided in the semiconductor substrate 60, as a photoelectric conversion layer. The gate section 26 of the transfer transistor $TR2_{trs}$ is connected to a transfer gate line $TG_2$. In addition, a second floating diffusion layer $FD_2$ is provided in a region 26C of the semiconductor substrate 60 in the vicinity of the gate section 26 of the transfer transistor $TR2_{trs}$. An electric charge accumulated in the n-type semiconductor region 63 is read out into the second floating diffusion layer $FD_2$ by way of a transfer channel 26A formed along the gate section 26.

In the lower photoelectric conversion section 21b, further, a reset transistor $TR2_{rst}$, an amplifying transistor $TR2_{amp}$ and a selection transistor $TR2_{sel}$ for constituting a control section for the lower photoelectric conversion section 21b are provided on the first surface side of the semiconductor substrate 60.

The reset transistor $TR2_{rst}$ includes a gate section, a channel forming region, and source/drain regions. The gate section of the reset transistor $TR2_{rst}$ is connected to a reset line $RST_2$, the source/drain region on one side of the reset transistor $TR2_{rst}$ is connected to a power source $V_{DD}$, and the source/drain region on the other side functions also as the second floating diffusion layer $FD_2$.

The amplifying transistor $TR2_{amp}$ includes a gate section, a channel forming region, and source/drain regions. The gate section is connected to the source/drain region (second floating diffusion layer $FD_2$) on the other side of the reset transistor $TR2_{rst}$. The source/drain region on one side is connected to the power source $V_{DD}$.

The selection transistor $TR2_{sel}$ includes a gate section, a channel forming region, and source/drain regions. The gate section is connected to a selection line $SEL_2$. In addition, the source/drain region on one side shares a region with the source/drain region on the other side constituting the amplifying transistor $TR2_{amp}$, whereas the source/drain region on the other side is connected to a signal line (data output line) $VSL_2$.

The reset lines $RST_1$, $RST_2$, the selection lines $SEL_1$, $SEL_2$ and transfer gate lines $TG_1$, $TG_2$ are connected to a vertical drive circuit 112 constituting a drive circuit, and signal lines (data output lines) $VSL_1$, $VSL_2$ are connected to a column signal processing circuit 113 constituting the drive circuit.

A series of operations such as charge accumulation, resetting operation and charge transfer of the upper-layer photoelectric conversion sections 21a and the lower-layer photoelectric conversion sections 21b are similar to a series of operations such as charge accumulation, resetting operation and charge transfer in the conventional art, and, therefore, detailed descriptions thereof are omitted.

A p⁺ layer 64 is provided between the n-type semiconductor region 63 and the front surface 60A of the semiconductor substrate 60, to restrain generation of a dark current. A p⁺ layer 62 is formed between the n-type semiconductor region 61 and the n-type semiconductor region 63, and, further, part of side surfaces of the n-type semiconductor region 63 is surrounded by the p⁺ layer 62. A p⁺ layer 63 is formed on the side of the back surface 60B of the semiconductor substrate 60. Besides, the n-type semiconductor region 61 is surrounded by a p-type semiconductor region 66.

A ground insulating layer 31, a wire grid polarizer 50 including a first light shielding section 41B (frame section 59), a first planarization film, a sub on-chip microlens (OPA), a second planarization film, wavelength selecting means (specifically, for example, a known color filter layer), a third planarization film, and a main on-chip microlens 14 are disposed over the p⁺ layer 63.

The imaging element, the imaging element of Example 7 can be produced by the following method. First, an SOI substrate is prepared. Then, a first silicon layer is formed on a surface of the SOI substrate based on an epitaxial growth method. Here, the p⁺ layer 63 and the n-type semiconductor region 61 are formed in the first silicon layer. Next, a second silicon layer is formed on the first silicon layer based on an epitaxial growth method, and an element separation region 25, an oxide film 65, a p⁺ layer 62, an n-type semiconductor region 63, and a p⁺ layer 64 are formed over the second silicon layer. Besides, the second silicon layer is formed with various transistors and the like for constituting a control section of the imaging element, and, further, a wiring layer (not illustrated), an interlayer insulating layer 67 and various wirings are formed thereover, after which the interlayer insulating layer 67 and a support substrate (not illustrated) are adhered to each other. Thereafter, the SOI substrate is removed, to expose the first silicon layer. The surface of the second silicon layer corresponds to the front surface 60A of the semiconductor substrate 60, and the surface of the first silicon layer corresponds to the back surface 60B of the semiconductor substrate 60. Besides, the first silicon layer and the second silicon layer are collectively expressed as the semiconductor substrate 60. Next, the ground insulating layer 31, the wire grid polarizer 50 including the first light shielding section 41B (frame section 59), the first planarization film, the sub on-chip microlens (OPA), the second planarization film, the wavelength selecting means (specifically, for example, a known color filter layer), the third planarization film and the main on-chip microlens 14 are formed over the p⁺ layer 63. By these operations, the imaging element of Example 7 can be obtained.

In Example 7, the wire grid polarizer 50 has the same size as the photoelectric conversion section 21W sensitive to white light and the photoelectric conversion section 21iR sensitive to near infrared light, but this is not limitative, and the wire grid polarizer 50 may be greater in size than the photoelectric conversion section 21W and the photoelectric conversion section 21iR.

In the imaging element of Example 7, the wire grid polarizer is stacked in a state of being disposed on the light incidence side as compared to the plurality of photoelectric conversion sections, so that the wavelength band of light can be utilized by enlarging it for enhancing luminance, while acquiring polarization information concerning the whole wavelength region. Therefore, an enhanced sensitivity and improved spectroscopy can be achieved. As a result, both high-accuracy acquisition of polarization information and good imaging characteristics can be realized.

Moreover, since the wire grid polarizer is formed integrally on an upper side of the upper-layer photoelectric conversion section 21a in an on-chip manner, the thickness of the imaging element can be reduced. As a result, mixing-in of polarized light into the adjacent imaging elements (polarization crosstalk) can be minimized. In addition, since the wire grid polarizer is an absorption type wire grid polarizer having a light absorbing layer, it has a low reflectance, and influences of stray light, flare and the like on images can be mitigated.

In the imaging element of Example 7, while the near infrared light photoelectric conversion sections are disposed on a lower side of the red light imaging element, the green light imaging element and the blue light imaging element, no wire grid polarizer is disposed on an upper side of the red light imaging element, the green light imaging element and the blue light imaging element, but the color filter layers (wavelength selecting means) are formed there. On the other hand, the near infrared light photoelectric conversion section is disposed on a lower side of the white light imaging element, and the wire grid polarizer is disposed on an upper side of the white light imaging element, but the color filter layer (wavelength selecting means) is not formed there. With such a structure adopted, luminance output can be prevented from being lowered due to wavelength separation of red light, green light and blue light, polarization information in the wavelength bands of red light, green light and blue light can be completely acquired, and color and luminance and polarization information can be utilized to a maximal degree. In addition, since there is no loss of light in the color filter layers, an advantage that an output having polarization information is enhanced can be obtained.

Figure 12:
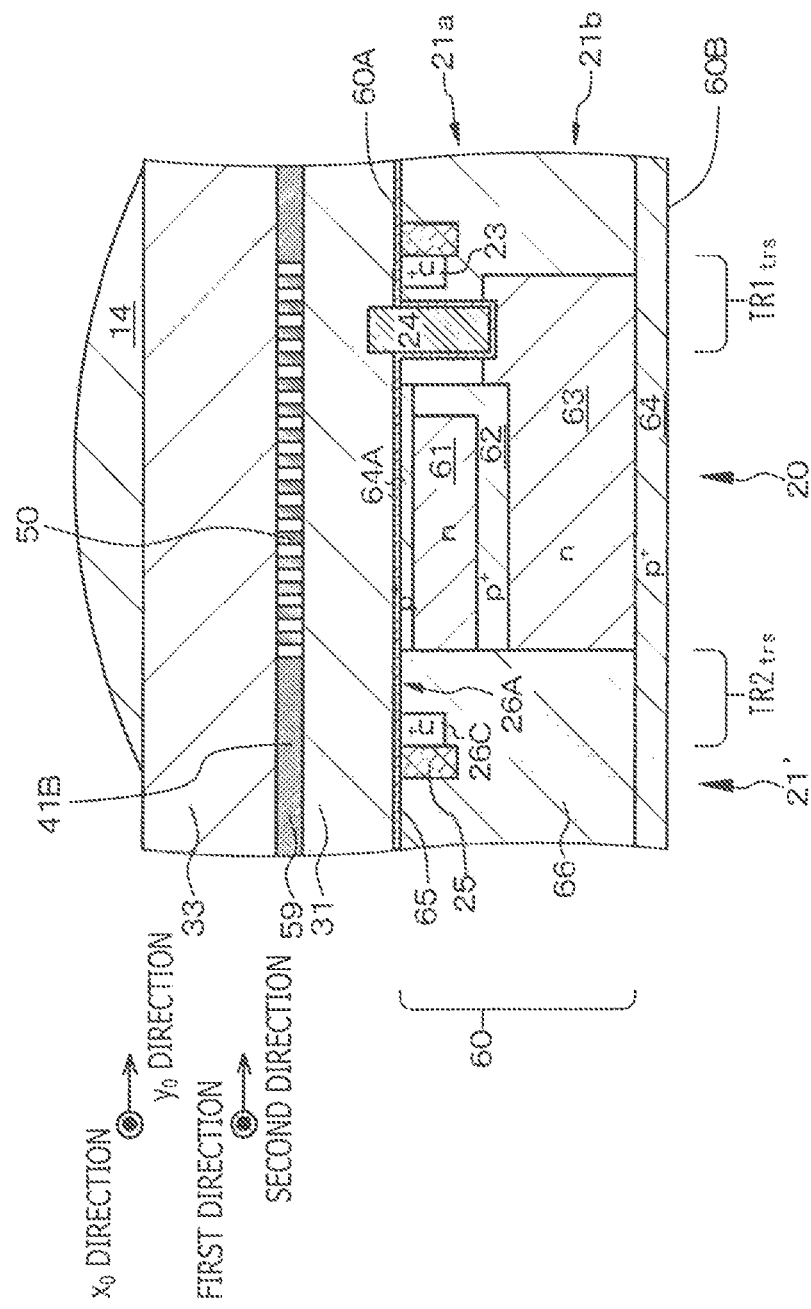
FIG. 12 is a schematic partial sectional view of a modification of the imaging element and the solid-state imaging device of Example 7, which is a modification of Example 2.

A modification of the imaging element of Example 7 illustrated in FIG. 12 is a front illumination type imaging element. Specifically, various transistors constituting a control section are provided on a front surface 60A side of a semiconductor substrate 60. These transistors may be similar in configuration and structure to the aforementioned transistors. In addition, while the semiconductor substrate 60 is provided with upper-layer photoelectric conversion sections 21a and lower-layer photoelectric conversion sections 21b, these photoelectric conversion sections may also be substantially similar in configuration and structure to the aforementioned. A ground insulating layer 31 is formed over the front surface 60A of the semiconductor substrate 60, and a wire grid polarizer 50 including a first light shielding section 41B (frame section 59), a first planarization film, a sub on-chip microlens (OPA), a second planarization film, wavelength selecting means (specifically, for example, a known color filter layer), a third planarization film, and a main on-chip microlens 14 are formed over an inter-ground-layer insulating layer 31. By these operations, the modification of the imaging element of Example 7 can be obtained. Thus, the configuration and structure of the modification of the imaging element of Example 7 may be similar to the configuration and structure of the imaging element, the imaging element of Example 7 aforementioned, and, therefore, detailed descriptions thereof are omitted.

In the stacked type imaging element of Example 7 or the modification thereof as described above, the upper-layer photoelectric conversion sections include photoelectric conversion sections sensitive to red light, green light, blue light, and white light, while the lower-layer photoelectric conversion sections include photoelectric conversion sections sensitive to near infrared light. However, alternatively, the upper-layer photoelectric conversion sections may include photoelectric conversion sections sensitive to near infrared light, while the lower-layer photoelectric conversion sections may include photoelectric conversion sections sensitive to red light, green light, blue light and white light. In addition, the photoelectric conversion section sensitive to red light or green light or blue light may alternatively include a stack of at least two kinds of photoelectric conversion sections selected from the group including a red light photoelectric conversion section sensitive to red light, a green light photoelectric conversion section sensitive to green light and a blue light photoelectric conversion section sensitive to blue light. Besides, the stacked type imaging element may alternatively include a stack of at least two kinds of photoelectric conversion sections selected from the group including a red light photoelectric conversion section sensitive to red light, a green light photoelectric conversion section sensitive to green light and a blue light photoelectric conversion section sensitive to blue light.

In Example 7, also, a first light shielding section may be the first light shielding section 41A, 41C, 41D described in Example 1 or Example 3. In addition, the second light shielding section 42 and the third light shielding section 43 described in Examples 4 and 5 are also applicable. The number of layers of photoelectric conversion sections constituting a stacked type imaging element is not limited to two and can be three or more.

Example 8

The technology according to the present disclosure (present technology) is applicable to various products. For example, the technology according to the present disclosure may be realized as a device to be mounted on any type of moving body such as an automobile, electric vehicle, hybrid electric vehicle, motorcycle, bicycle, personal mobility, airplane, drone, ship, and robot.

Figure 56:
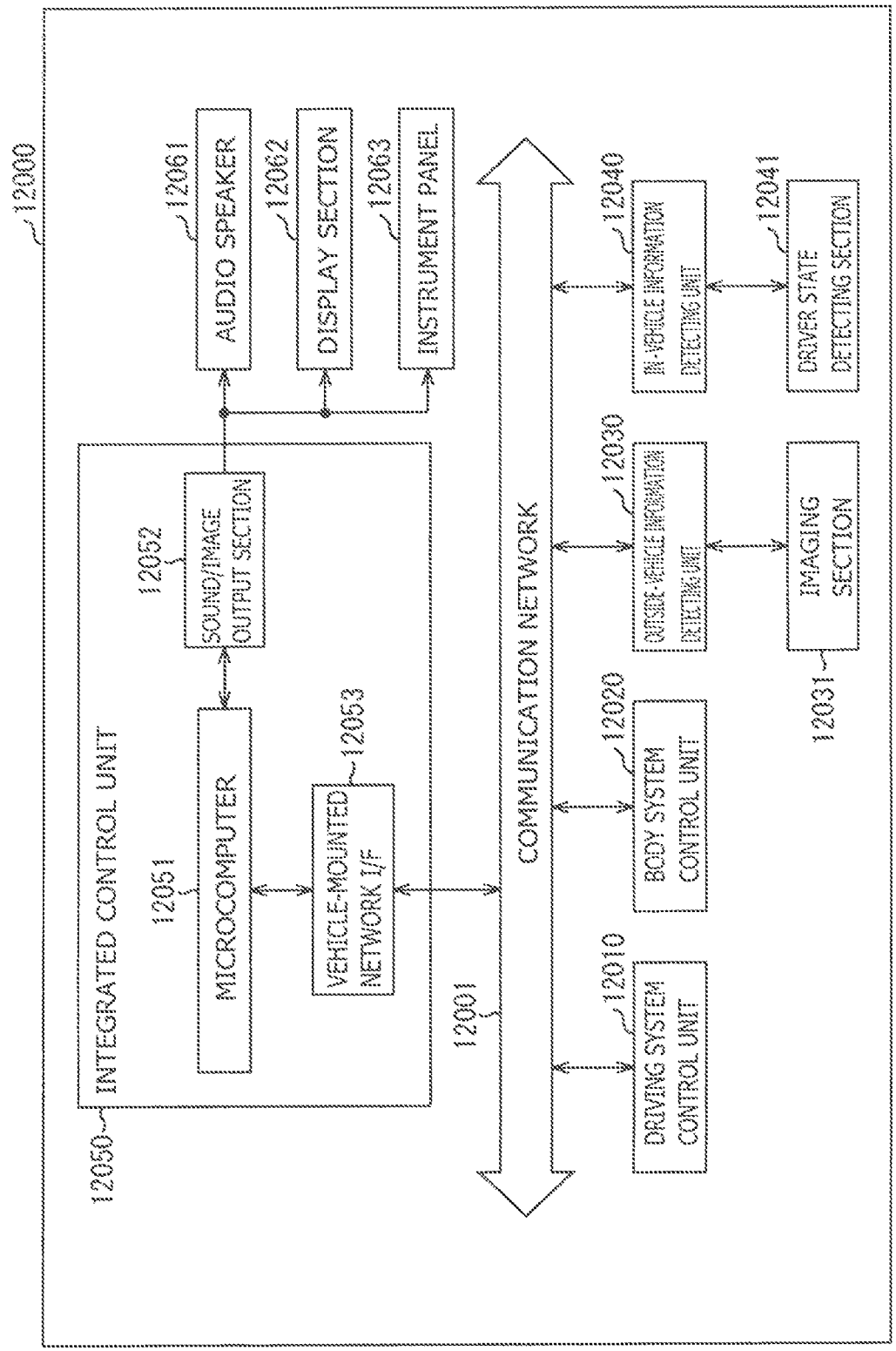
FIG. 56 is a block diagram depicting an example of schematic configuration of a vehicle control system.

FIG. 56 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 56, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 56, an audio speaker 12061, a display section 12062, and an instrument panel 12063 are illustrated as the output device. The display section 12062 may, for example, include at least one of an on-board display and a head-up display.

Figure 57:
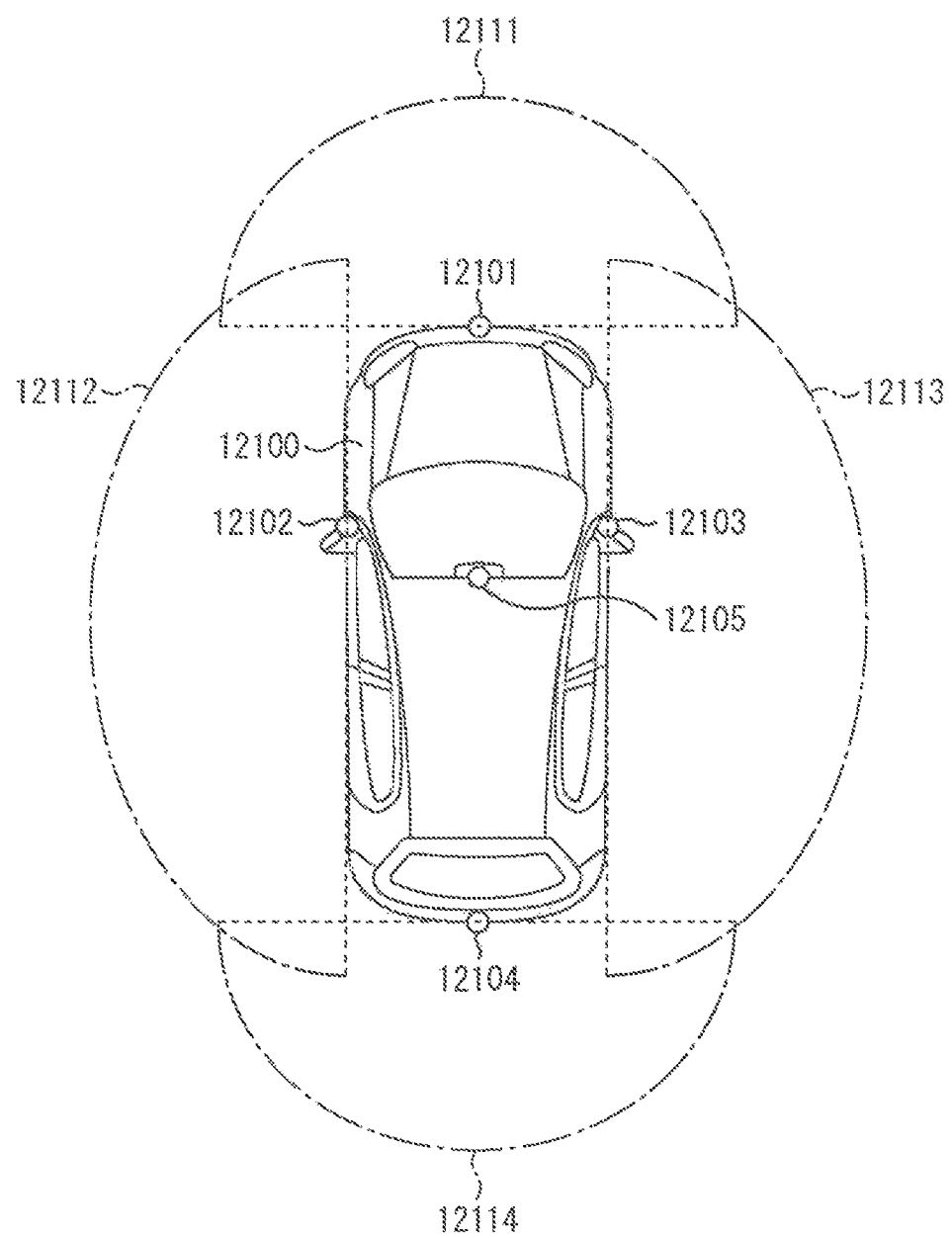
FIG. 57 is a diagram of assistance in explaining an example of installation positions of an outside-vehicle information detecting section and an imaging section.

FIG. 57 is a diagram depicting an example of the installation position of the imaging section 12031.

In FIG. 57, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 57 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Example 9

The technology according to the present disclosure (present technology) is applicable to various products. For example, the technology according to the present disclosure may be applied to an endoscopic surgery system.

Figure 58:
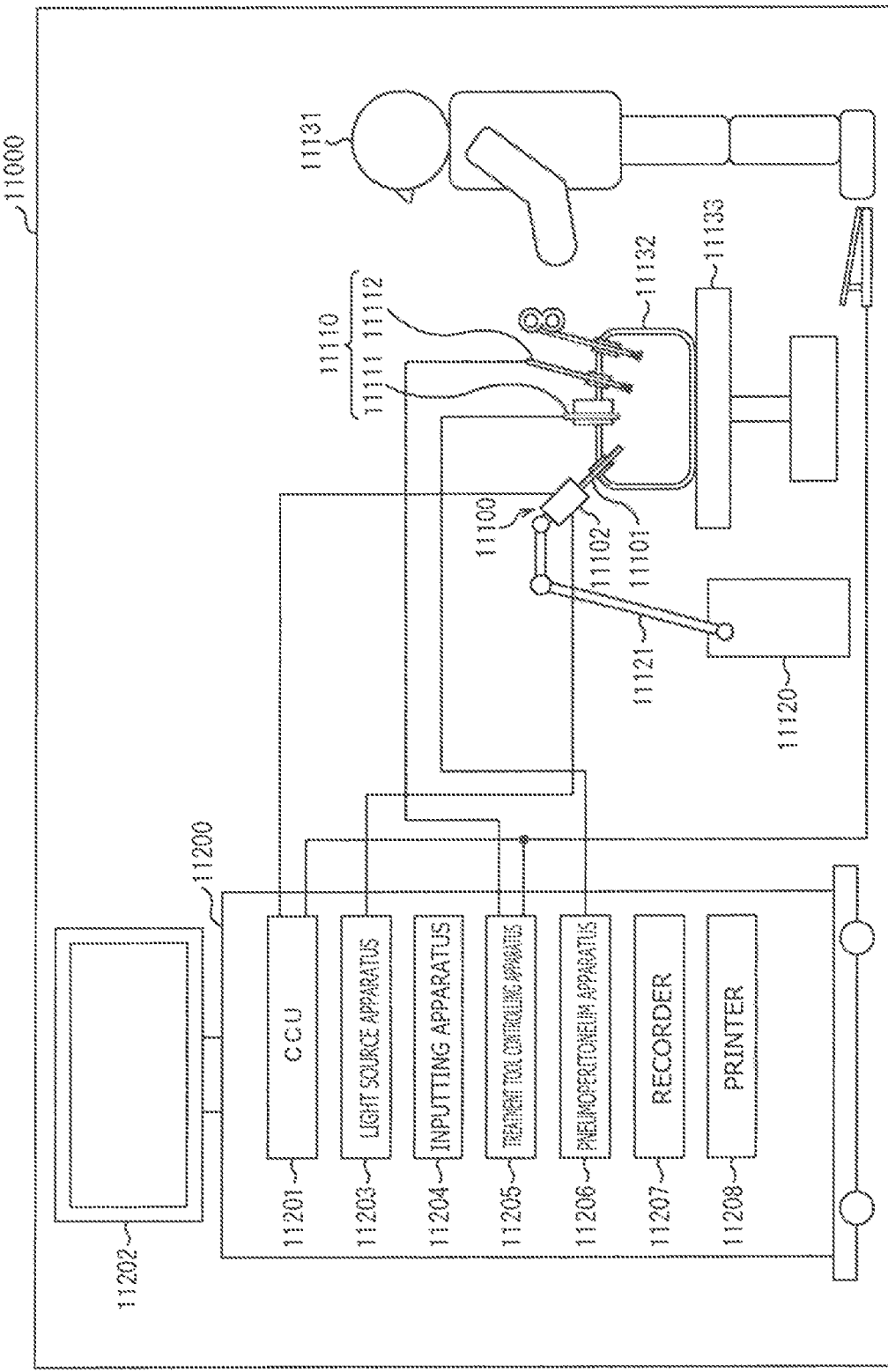
FIG. 58 is a view depicting an example of a schematic configuration of an endoscopic surgery system.

FIG. 58 is a view depicting an example of a schematic configuration of an endoscopic surgery system to which the technology according to an embodiment of the present disclosure (present technology) can be applied.

In FIG. 58, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 59:
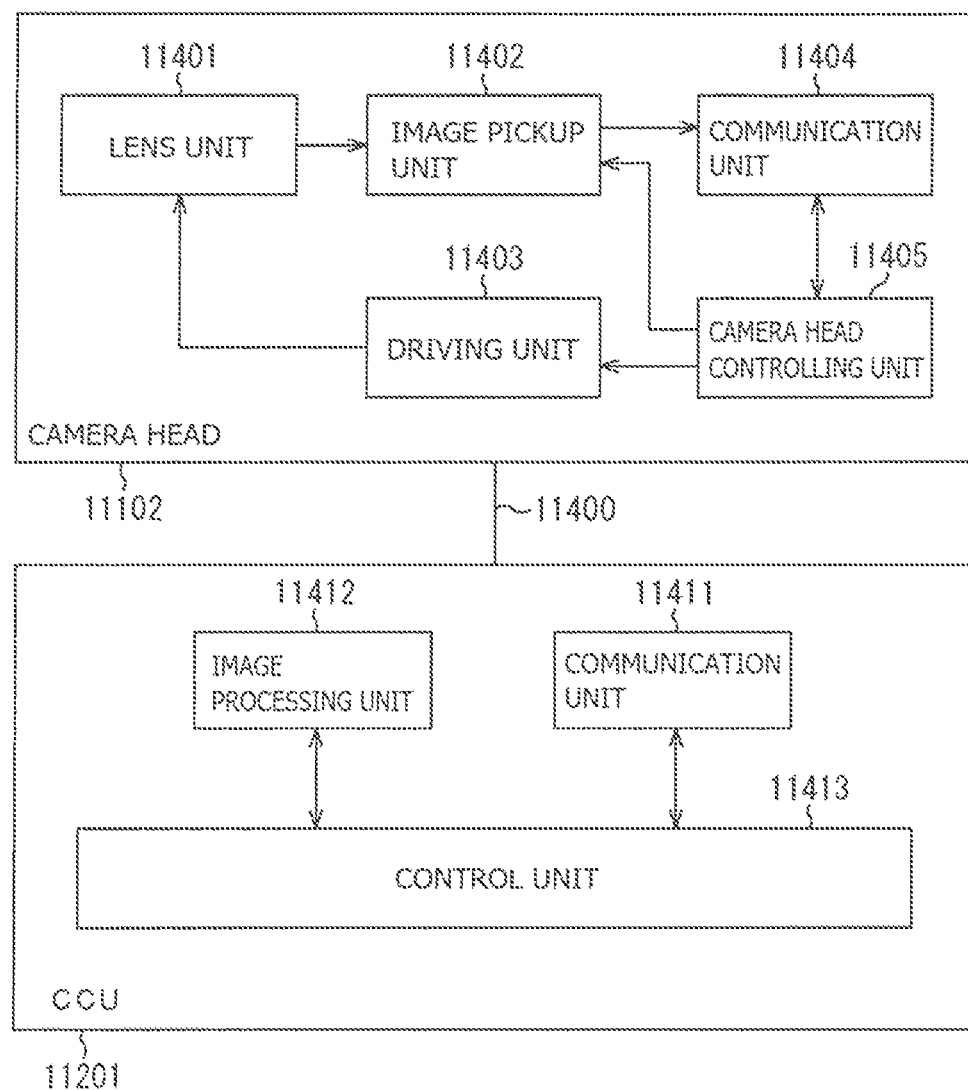
FIG. 59 is a block diagram depicting an example of a functional configuration of a camera head and a camera control unit (CCU).

FIG. 59 is a block diagram depicting an example of a functional configuration of the camera head 11102 and the CCU 11201 depicted in FIG. 58.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type) Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Example 10

Further, the technology according to the present disclosure (present technology) is applicable to various products. For example, the technology according to the present disclosure may be applied to an endoscopic surgery system.

Figure 60:
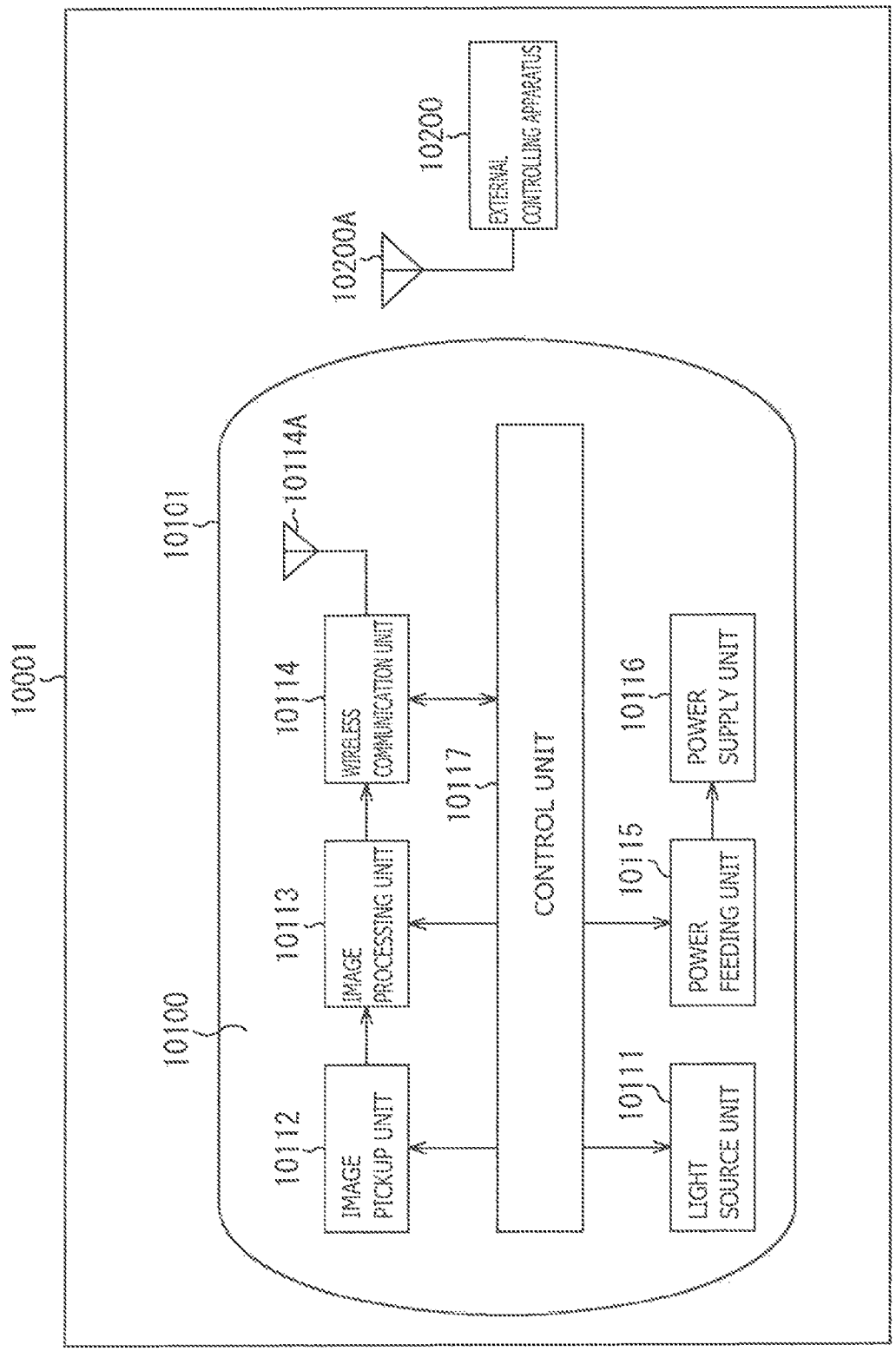
FIG. 60 is a block diagram depicting an example of a schematic configuration of an in-vivo information acquisition system.

FIG. 60 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 60, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

While the present disclosure has been described above based on preferred Examples, the present disclosure is not limited to these Examples. The structures and configurations of the imaging element, the stacked type imaging element and the solid-state imaging device, the production methods therefore, and the materials used therefore described in Examples are merely illustrative, and can be modified as required. The imaging elements and the solid-state imaging devices of Examples may be combined together as required.

The combinations of the imaging element, the wavelength selecting means, the polarizer, the wire grid polarizer, the first light shielding section, the second light shielding section and the third light shielding section described in Examples may be modified as required. In addition, as aforementioned, a near infrared light imaging element (or infrared light imaging element) may be provided.

Modifications of the solid-state imaging device of Examples 1 to 6 will be described below.

Figure 23A:
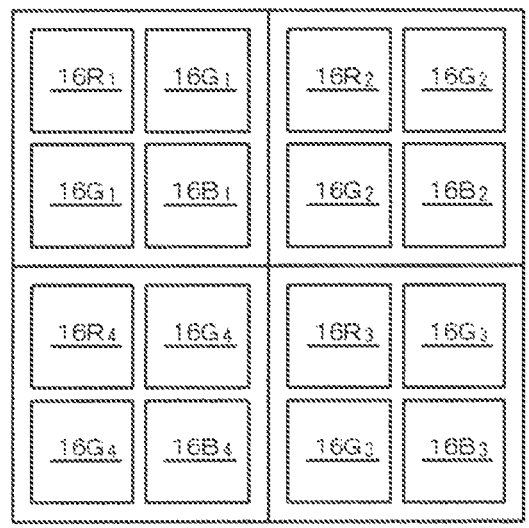
FIGS. 23A and 23B are schematic partial plan views of wavelength selecting means (color filter layer) and a wire grid polarizer in a first modification of the solid-state imaging device of Example 1.
Figure 23B:
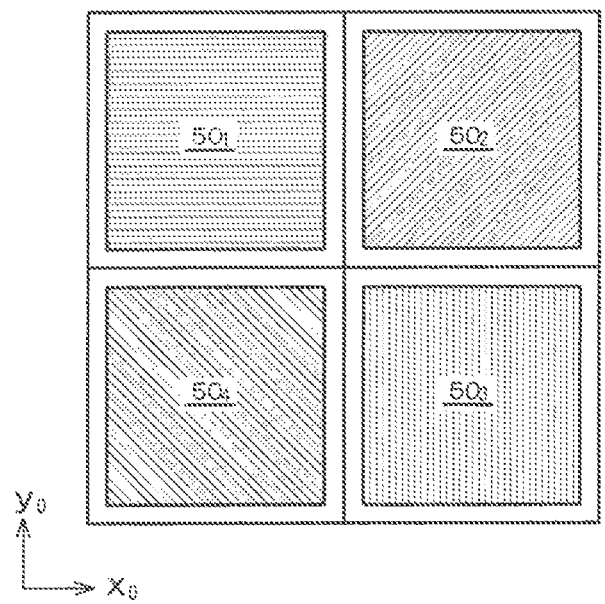
Figure 24:
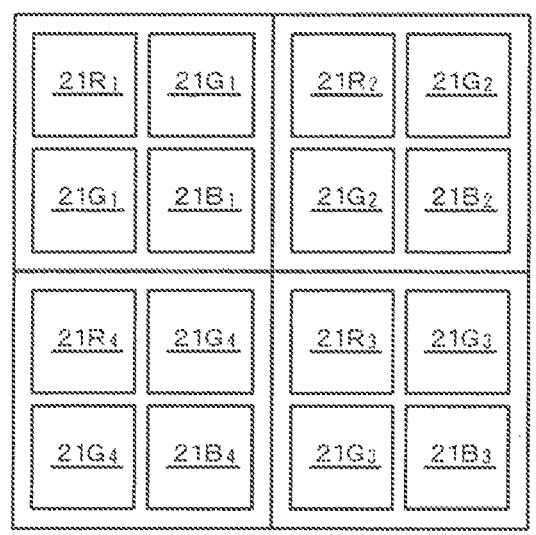
FIG. 24 is a schematic partial plan view of a photoelectric conversion section in the first modification of the solid-state imaging device of Example 1.

As schematic partial plan views of a first modification of the wavelength selecting means (color filter layer) and the wire grid polarizer in the solid-state imaging device of Examples 1 to 6 are illustrated in FIGS. 23A and 23B and as a schematic partial plan view of the imaging device is depicted in FIG. 24, of four imaging element units, a first imaging element unit includes a red light photoelectric conversion section $21R_1$ that absorbs red light, green light photoelectric conversion sections $21G_1$, $21G_1$ that absorb green light and a blue light photoelectric conversion section $21B_1$ that absorbs blue light, and wavelength selecting means (color filter layers) 16 ($16R_1$, $16G_1$, $16G_1$, $16B_1$) for these imaging elements; a second imaging element unit includes a red light photoelectric conversion section $21R_2$ that absorbs red light, green light photoelectric conversion sections $21G_2$, $21G_2$ that absorb green light and a blue light photoelectric conversion section $21B_2$ that absorbs blue light, and wavelength selecting means (color filter layers) 16 ($16R_2$, $16G_2$, $16G_2$, $16B_2$) for these imaging elements; a third imaging element unit includes a red light photoelectric conversion section $21R_3$ that absorbs red light, green light photoelectric conversion sections $21G_3$, $21G_3$ that absorb green light and a blue light photoelectric conversion section $21B_3$ that absorbs blue light, and wavelength selecting means (color filter layers) 16 ($16R_3$, $16G_3$, $16G_3$, $16B_3$) for these imaging elements; and a fourth imaging element unit includes a red light photoelectric conversion section $21R_4$ that absorbs red light, green light photoelectric conversion sections $21G_4$, $21G_4$ that absorb green light and a blue light photoelectric conversion section $21B_4$ that absorbs blue light, and wavelength selecting means (color filter layers) 16 ($16R_4$, $16G_4$, $16G_4$, $16B_4$) for these imaging elements. One wire grid polarizer 50 is disposed for each imaging element unit. Here, the polarization orientation in which light is to be transmitted by a wire grid polarizer $50_1$ is $\alpha$ degrees, the polarization orientation in which light is to be transmitted by a wire grid polarizer $50_2$ is ($\alpha$+45) degrees, the polarization orientation in which light is to be transmitted by a wire grid polarizer $50_3$ is ($\alpha$+90) degrees, and the polarization orientation in which light is to be transmitted by a wire grid polarizer $50_4$ is ($\alpha$+135) degrees.

Figure 25A:
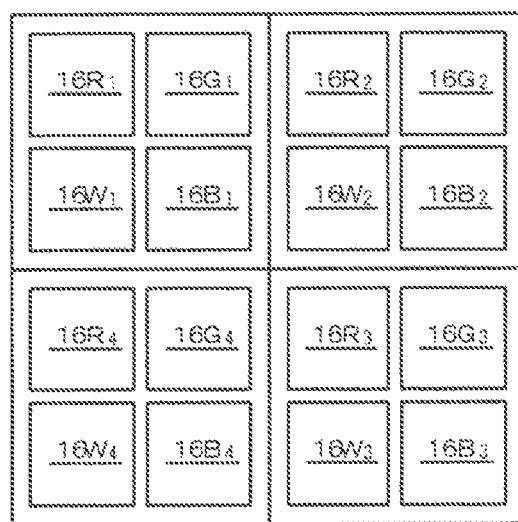
FIGS. 25A and 25B are schematic partial plan views of wavelength selecting means (color filter layer) and a wire grid polarizer in a second modification of the solid-state imaging device of Example 1.
Figure 25B:
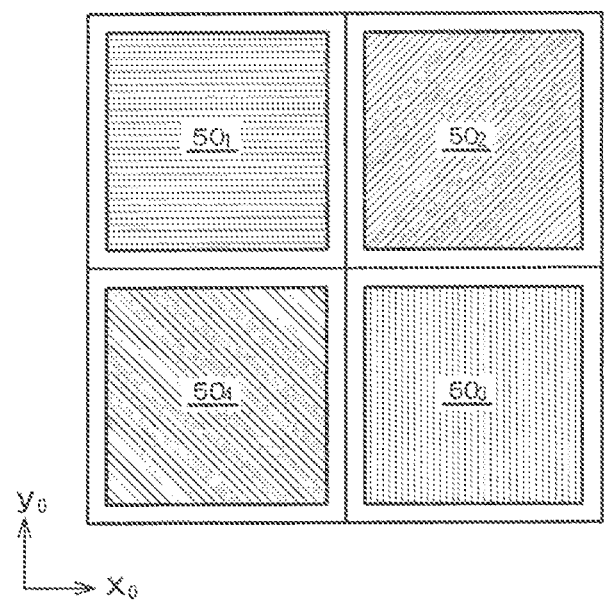
Figure 26A:
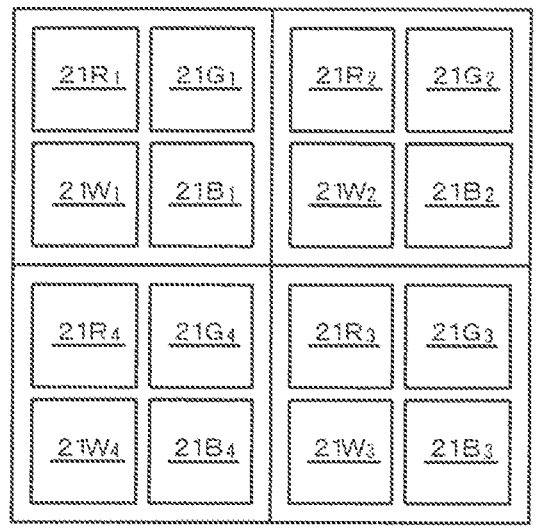
FIGS. 26A and 26B are a schematic partial plan view of a photoelectric conversion section in the second modification of the solid-state imaging device of Example 1, and a schematic partial plan view of a wire grid polarizer in a modification of the second modification of the solid-state imaging device of Example 1.
Figure 26B:
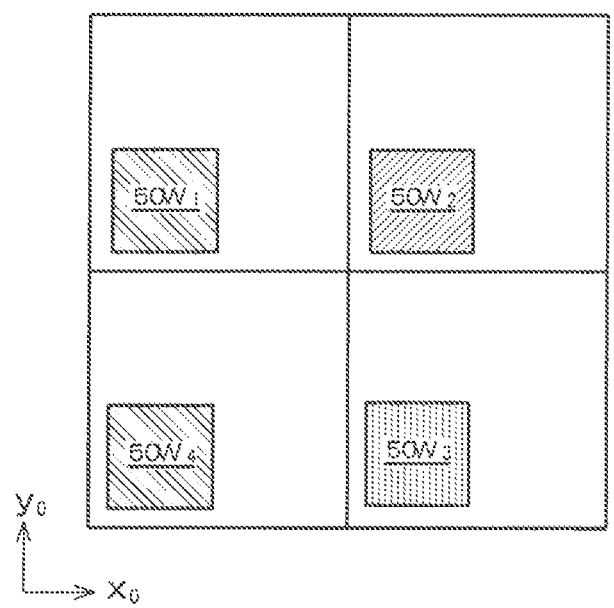

As schematic partial plan views of a second modification of the wavelength selecting means (color filter layer) and the wire grid polarizer in the solid-state imaging device of Examples 1 to 6 are illustrated in FIGS. 25A and 25B and as a schematic partial plan view of the imaging devices is depicted in FIG. 26A, of four imaging element units, a first imaging element unit includes a red light photoelectric conversion section $21R_1$ that absorbs red light, a green light photoelectric conversion section $21G_1$ that absorbs green light, a blue light photoelectric conversion section $21B_1$ that absorbs blue light and a white light photoelectric conversion section $21W_1$ that absorbs white light, and wavelength selecting means (color filter layers) 16 ($16R_1$, $16G_1$, $16B_1$) and a transparent resin layer $16W_1$ for these imaging elements; a second imaging element unit includes a red light photoelectric conversion section $21R_2$ that absorbs red light, a green light photoelectric conversion section $21G_2$ that absorbs green light, a blue light photoelectric conversion section $21B_2$ that absorbs blue light and a white light photoelectric conversion section $21W_2$ that absorbs white light, and wavelength selecting means (color filter layers) 16 ($16R_2$, $16G_2$, $16B_2$) and a transparent resin layer $16W_2$ for these imaging elements; a third imaging element unit includes a red light photoelectric conversion section $21R_3$ that absorbs red light, a green light photoelectric conversion section $21G_3$ that absorbs green light, a blue light photoelectric conversion section $21B_3$ that absorbs blue light and a white light photoelectric conversion section $21W_3$ that absorbs white light, and wavelength selecting means (color filter layers) 16 ($16R_3$, $16G_3$, $16B_3$) and a transparent resin layer $16W_3$ for these imaging elements; and a fourth imaging element unit includes a red light photoelectric conversion section $21R_4$ that absorbs red light, a green light photoelectric conversion section $21G_4$ that absorbs green light, a blue light photoelectric conversion section $21B_4$ that absorbs blue light and a white light photoelectric conversion section $21W_4$ that absorbs white light, and wavelength selecting means (color filter layers) 16 ($16R_4$, $16G_4$, $16B_4$) and a transparent resin layer $16W_4$ for these imaging elements. Note that the imaging element sensitive to white light is sensitive, for example, to light of 425 nm to 750 nm. One wire grid polarizer 50 is disposed for each imaging element unit. Here, the polarization orientation in which light is to be transmitted by a wire grid polarizer $50_1$ is α degrees, the polarization orientation in which light is to be transmitted by a wire grid polarizer $50_2$ is (α+45) degrees, the polarization orientation in which light is to be transmitted by a wire grid polarizer $50_3$ is (α+90) degrees, and the polarization orientation in which light is to be transmitted by a wire grid polarizer $50_4$ is (α+135) degrees. Alternatively, as a schematic partial plan view of the imaging element is illustrated in FIG. 26B, wire grid polarizers $50W_1$, $50W_2$, $50W_3$, $50W_4$ are disposed only on an upper side of white light photoelectric conversion sections 21W ($21W_1$, $21W_2$, $21W_3$, $21W_4$)

Figure 27A:
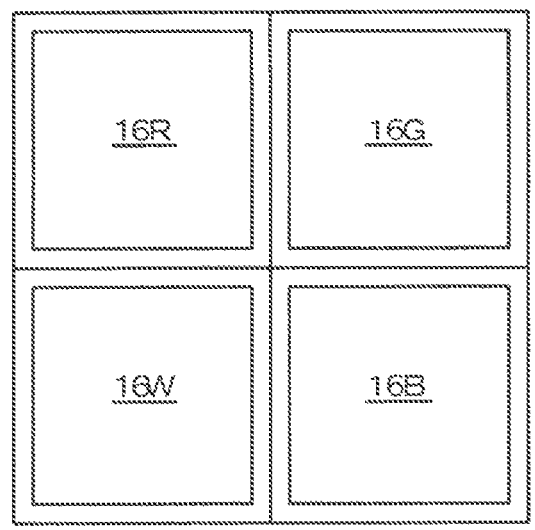
FIGS. 27A and 27B are schematic partial plan views of wavelength selecting means (color filter layer) and a wire grid polarizer in a third modification of the solid-state imaging device of Example 1.
Figure 27B:
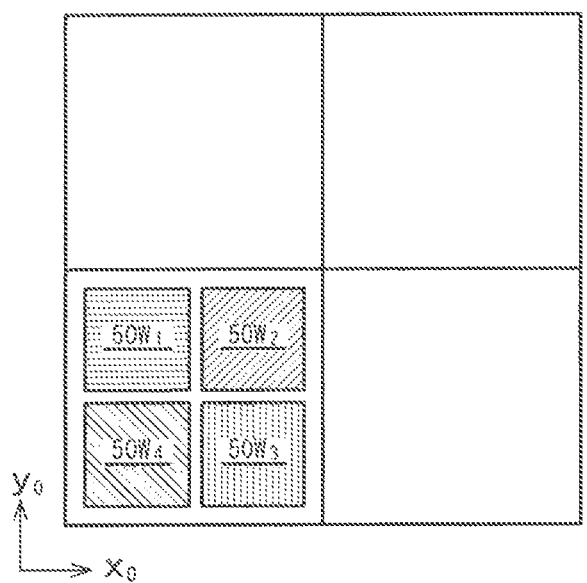
Figure 28A:
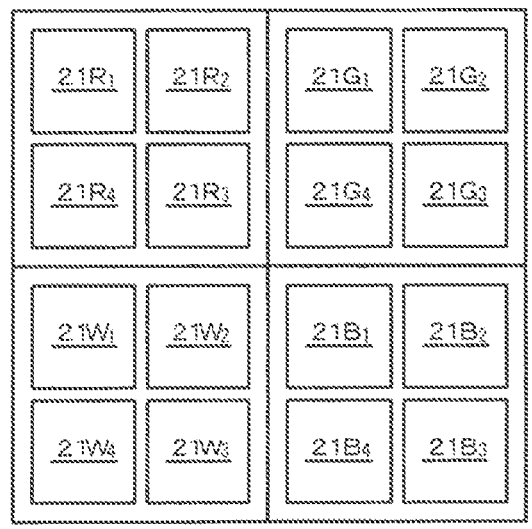
FIGS. 28A and 28B are a schematic partial plan view of a photoelectric conversion section in the third modification of the solid-state imaging device of Example 1, and a schematic partial plan view of a wire grid polarizer in a modification of the third modification of the solid-state imaging device of Example 1.

As schematic partial plan views of a third modification of the wavelength selecting means (color filter layer) and the wire grid polarizer in the solid-state imaging device of Examples 1 to 6 are illustrated in FIGS. 27A and 27B and as a schematic partial plan view of the imaging elements is depicted in FIG. 28A, of four imaging element units, a first imaging element unit includes four photoelectric conversion sections 21R ($21R_1$, $21R_2$, $21R_3$, $21R_4$), a second imaging element unit includes four photoelectric conversion sections 21G ($21G_1$, $21G_2$, $21G_3$, $21G_4$), a third imaging element unit includes four photoelectric conversion sections 21B ($21B_1$, $21B_2$, $21B_3$, $21B_4$), and a fourth imaging element unit includes four photoelectric conversion sections 21W ($21W_1$, $21W_2$, $21W_3$, $21W_4$). Besides, wavelength selecting means (color filter layers) 16 (16R, 16G, 16B) and a transparent resin layer 16W for the red light photoelectric conversion sections 21R, the green light photoelectric conversion sections 21G, the blue light photoelectric conversion sections 21B and the white light photoelectric conversion sections 21W are disposed. In addition, four wire grid polarizers $50W_1$, $50W_2$, $50W_3$, $50W_4$ are disposed for the white light photoelectric conversion sections 21W ($21W_1$, $21W_2$, $21W_3$, $21W_4$). Here, the polarization orientation in which light is to be transmitted by a wire grid polarizer $50W_1$ is α degrees, the polarization orientation in which light is to be transmitted by a wire grid polarizer $50W_2$ is (α+45) degrees, the polarization orientation in which light is to be transmitted by a wire grid polarizer $50W_3$ is (α+90) degrees, and the polarization orientation in which light is to be transmitted by a wire grid polarizer $50W_4$ is (α+135) degrees.

Figure 28B:
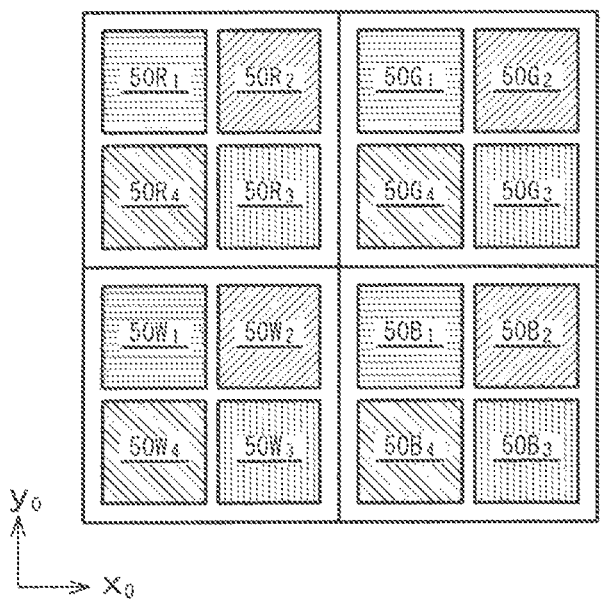

Note that as a schematic partial plan view of the third modification of the wire grid polarizer is illustrated in FIG. 28B, four wire grid polarizers 50 ($50R_1$, $50R_2$, $50R_3$, $50R_4$/$50G_1$, $50G_2$, $50G_3$, $50G_4$/$50B_1$, $50B_2$, $50B_3$, $50B_4$/$50W_1$, $50W_2$, $50W_3$, $50W_4$) may be disposed for each imaging element unit (one pixel).

Figure 29A:
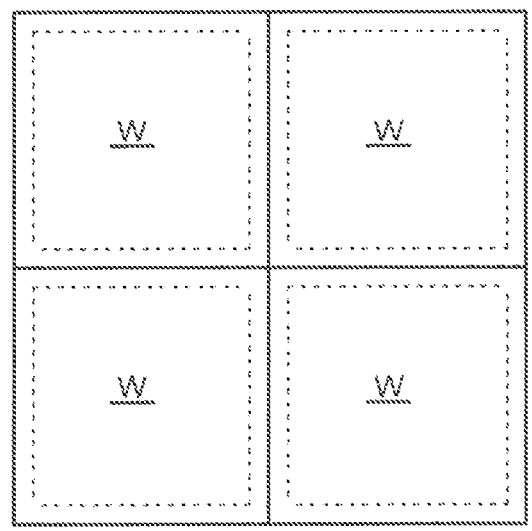
FIGS. 29A and 29B are schematic partial plan views of wavelength selecting means (color filter layer) and a wire grid polarizer in a fourth modification of the solid-state imaging device of Example 1.
Figure 29B:
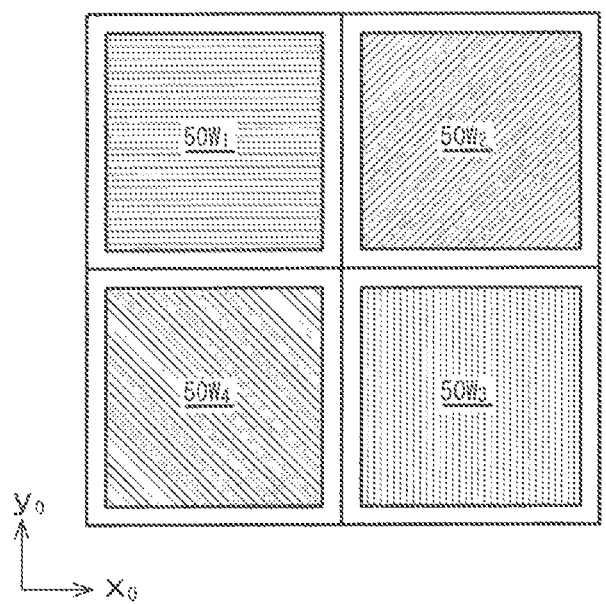
Figure 30:
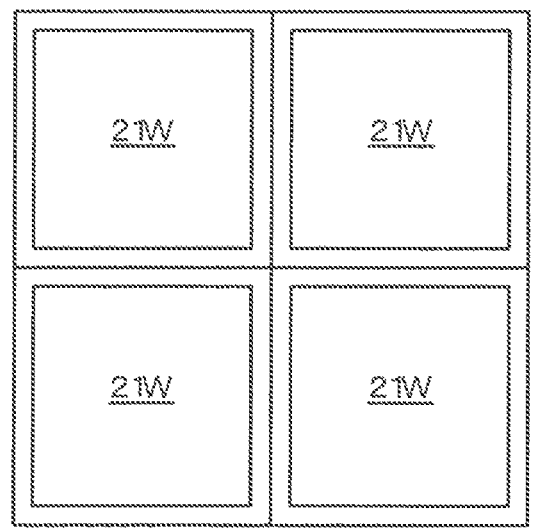
FIG. 30 is a schematic partial plan view of a photoelectric conversion section in the fourth modification of the solid-state imaging device of Example 1.

As schematic partial plan views of a fourth modification of the wavelength selecting means (color filter layer) and the wire grid polarizer in the solid-state imaging device of Examples 1 to 6 are illustrated in FIGS. 29A and 29B, and as a schematic partial plan view of the imaging element is depicted in FIG. 30, the solid-state imaging device may include only a white light photoelectric conversion section 21W, though depending on the specifications required of the solid-state imaging device.

Figure 31:
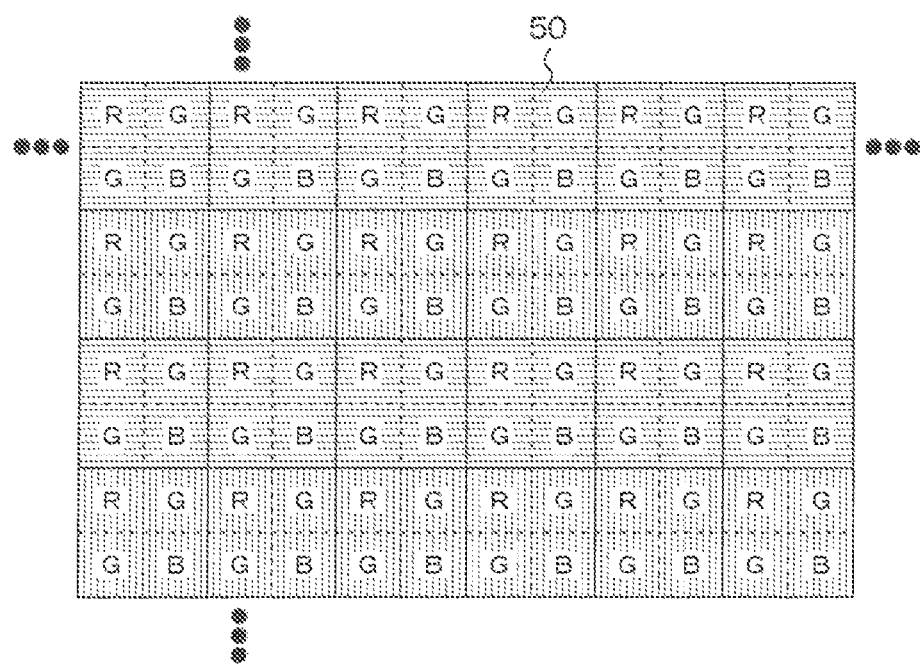
FIG. 31 is a plan layout drawing of a modification of photoelectric conversion elements having a Bayer array.
Figure 32:
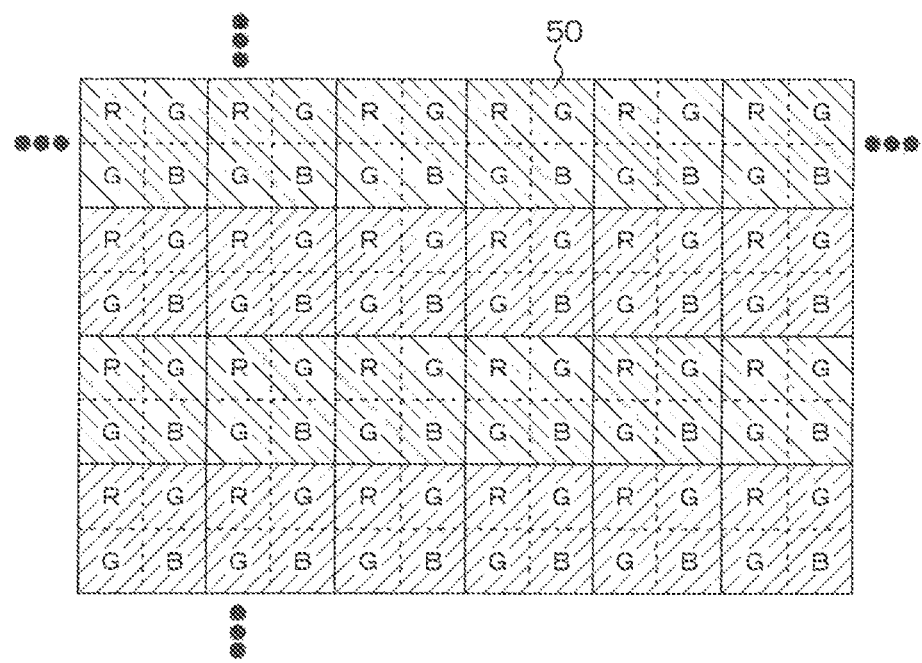
FIG. 32 is a plan layout drawing of a modification of photoelectric conversion elements having a Bayer array.

As depicted in FIG. 31, in regard of the angle formed between the arranging direction of a plurality of imaging elements and the first direction, for example, a combination of the imaging elements having an angle of 0 degrees and the imaging elements having an angle of 180 degrees may be adopted. In addition, as illustrated in FIG. 32, in regard of the angle formed between the arranging direction of a plurality of imaging elements and the first direction, for example, a combination of the imaging elements having an angle of 45 degrees and the imaging elements having an angle of 135 degrees may be adopted. Note that in plan layout drawings of the imaging element units depicted in FIGS. 31 to 43, "R" represents a red light imaging element having a red color filter layer, "G" represents a green light imaging element having a green color filter layer, "B" represents a blue light imaging element having a blue color filter layer, and "W" represents a white light imaging element having no color filter layer.

Figure 33:
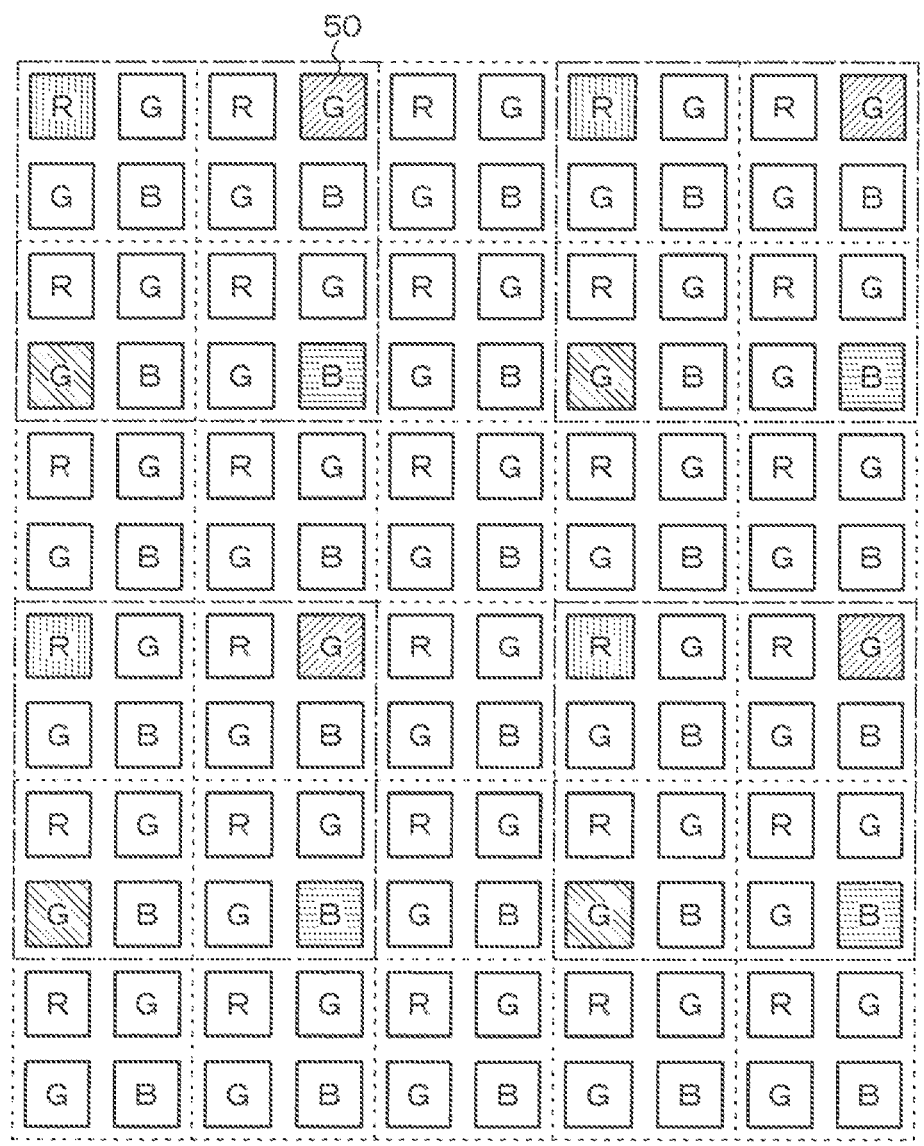
FIG. 33 is a plan layout drawing of a modification of photoelectric conversion elements having a Bayer array.

In the example illustrated in FIG. 26B, the white light imaging elements W having the wire grid polarizers 50 are arrayed with one imaging element skipped in the $x_0$ direction and in the $y_0$ direction, they may be arrayed with two imaging elements skipped, or with three imaging elements skipped, and the imaging elements having the wire grid polarizers 50 may be arranged zigzag. A plan layout drawing of FIG. 33 is a modification of the example depicted in FIG. 26B.

Figure 34:
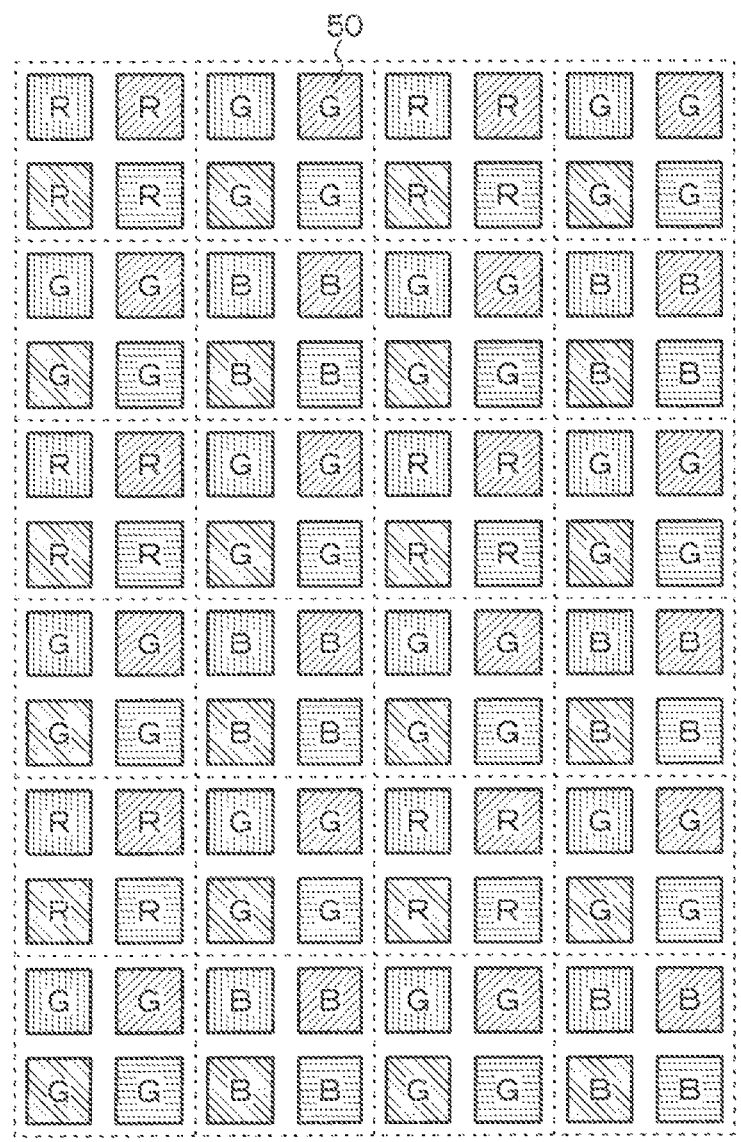
FIG. 34 is a plan layout drawing of a modification of photoelectric conversion elements having a Bayer array.
Figure 35:
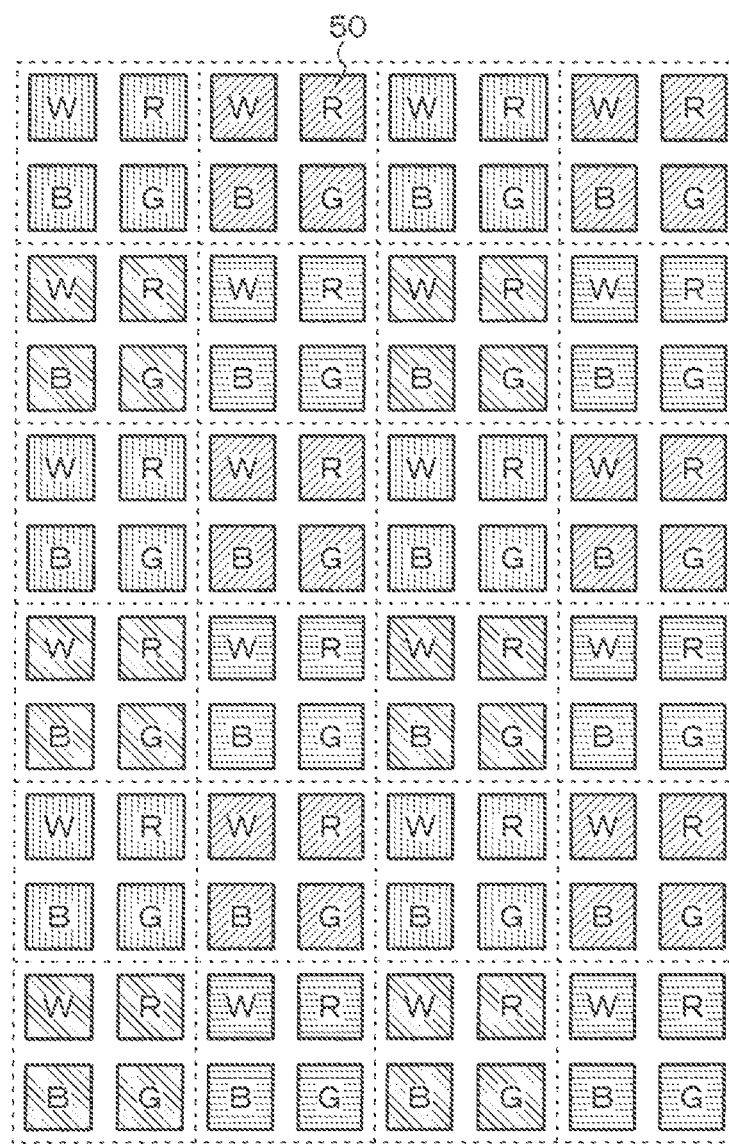
FIG. 35 is a plan layout drawing of a modification of photoelectric conversion elements having a Bayer array.
Figure 37:
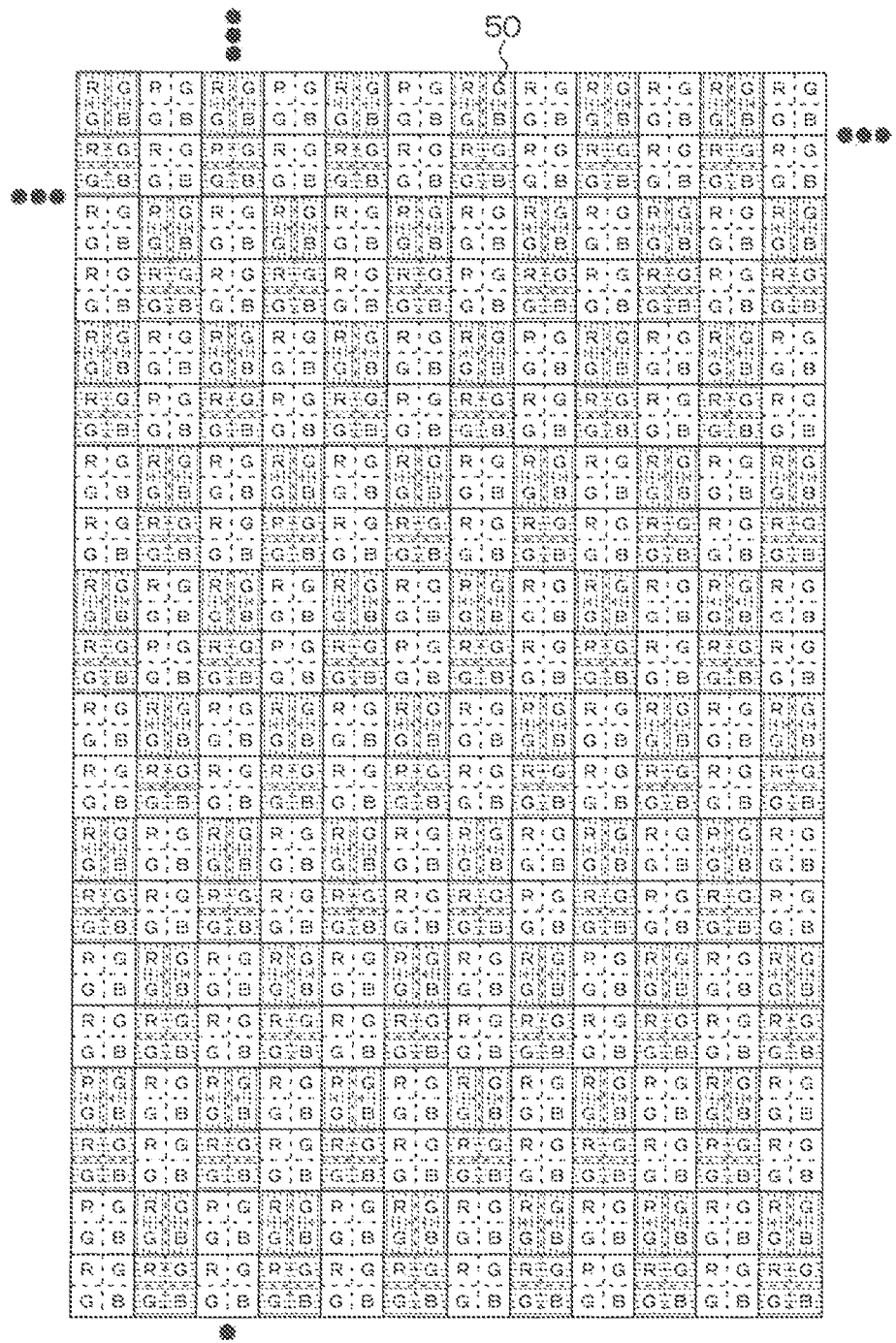
FIG. 37 is a plan layout drawing of a modification of photoelectric conversion elements having a Bayer array.
Figure 38:
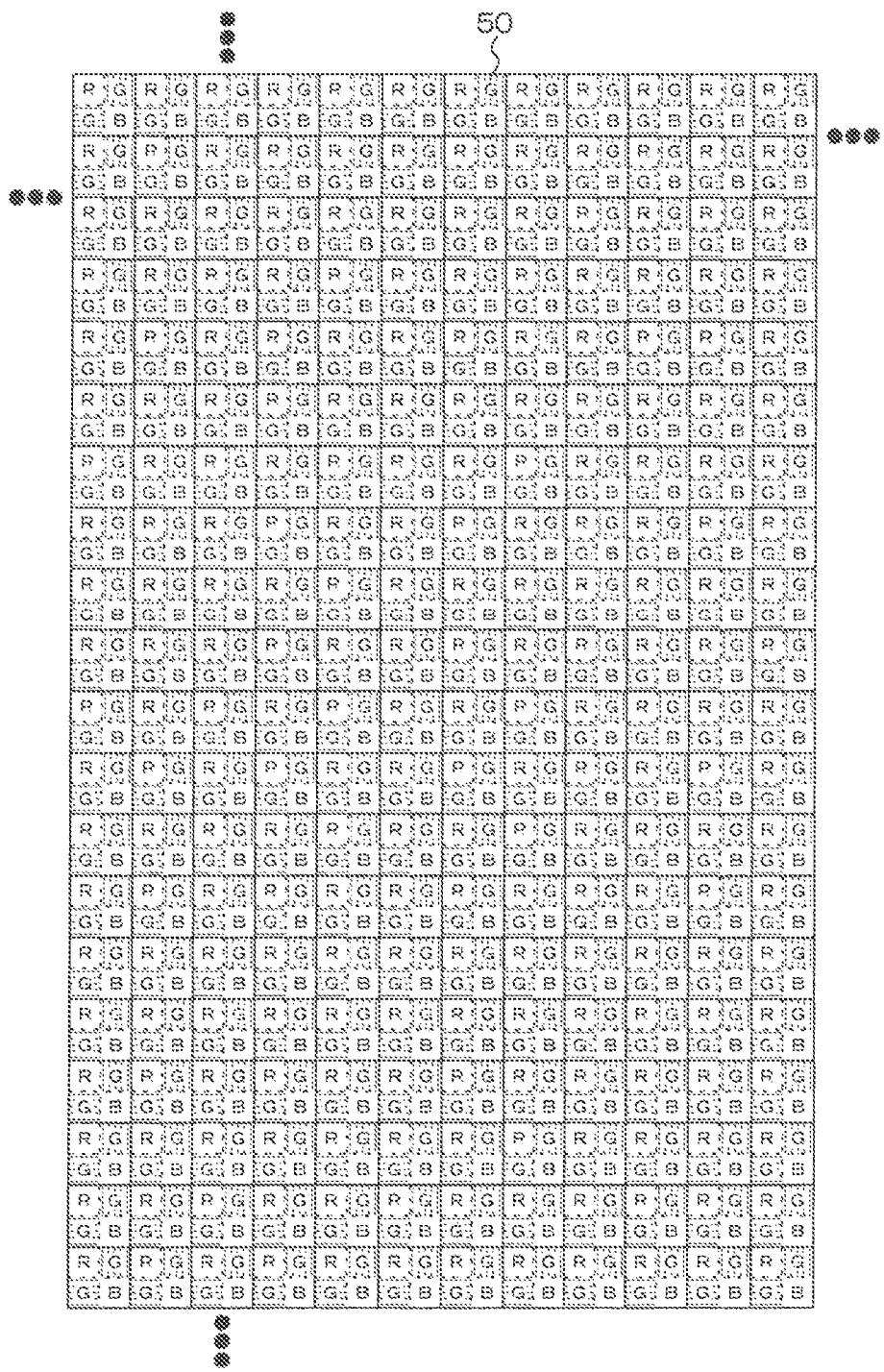
FIG. 38 is a plan layout drawing of a modification of photoelectric conversion elements having a Bayer array.
Figure 39:
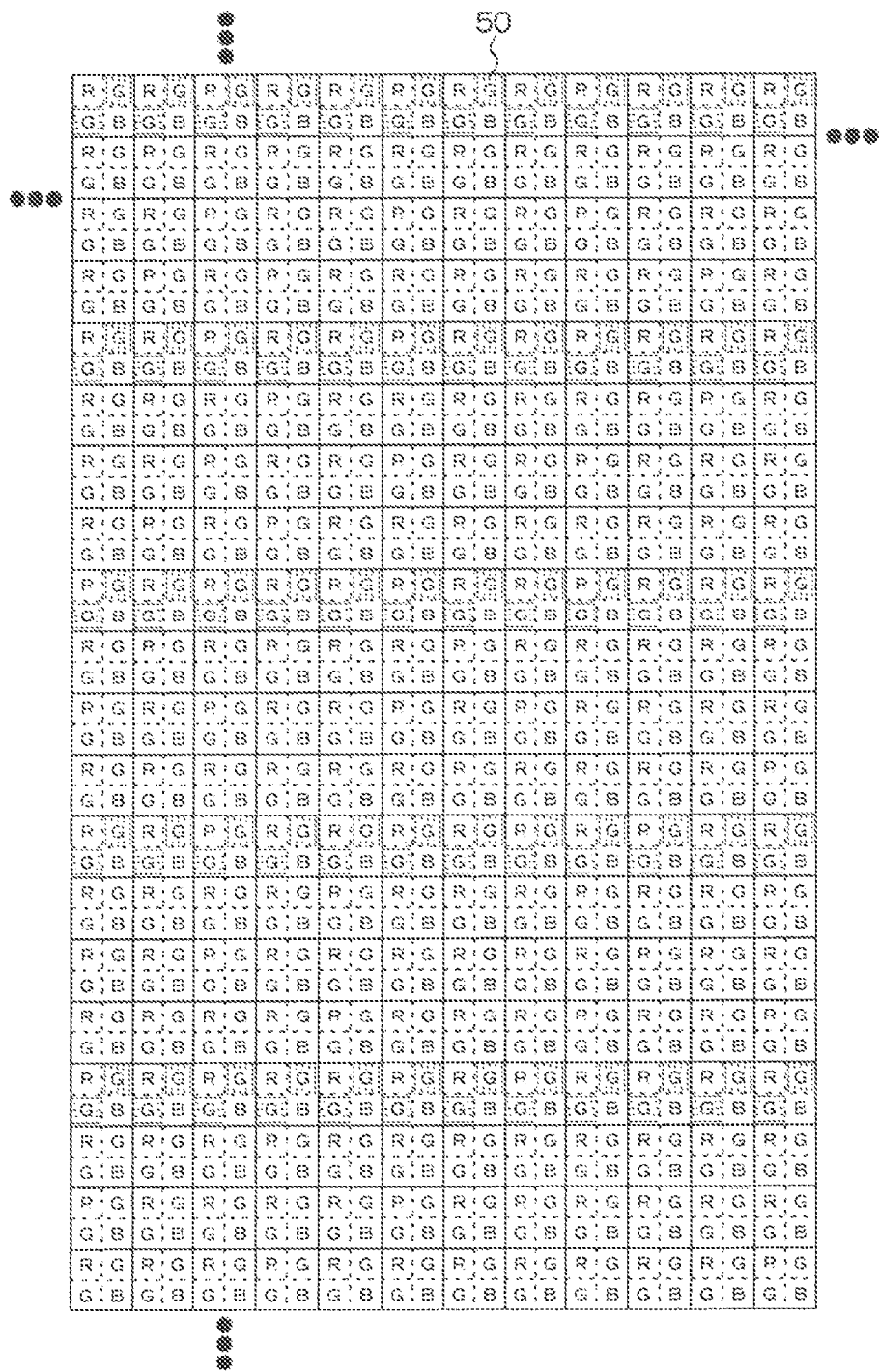
FIG. 39 is a plan layout drawing of a modification of photoelectric conversion elements having a Bayer array.
Figure 40:
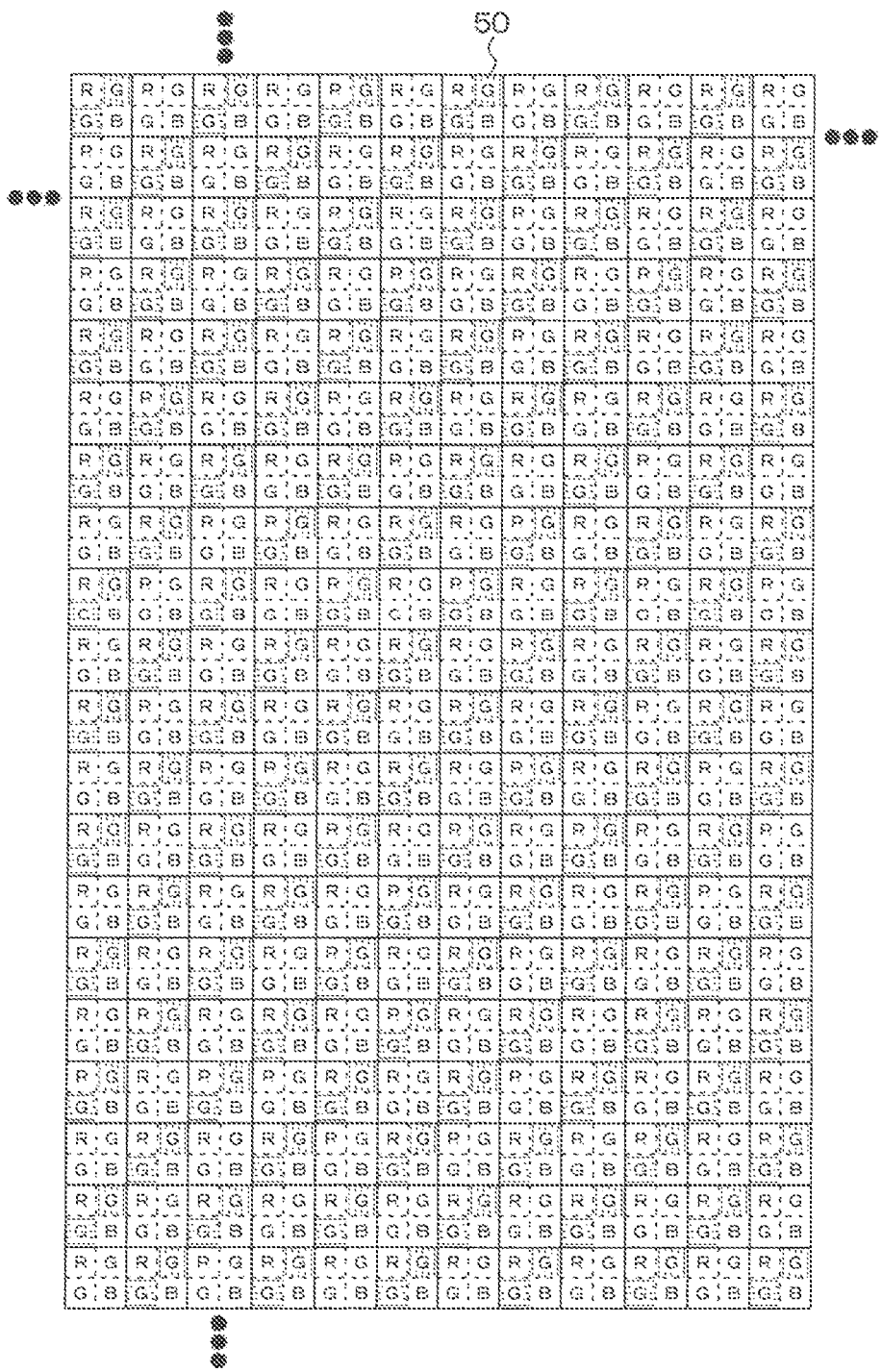
FIG. 40 is a plan layout drawing of a modification of photoelectric conversion elements having a Bayer array.
Figure 41:
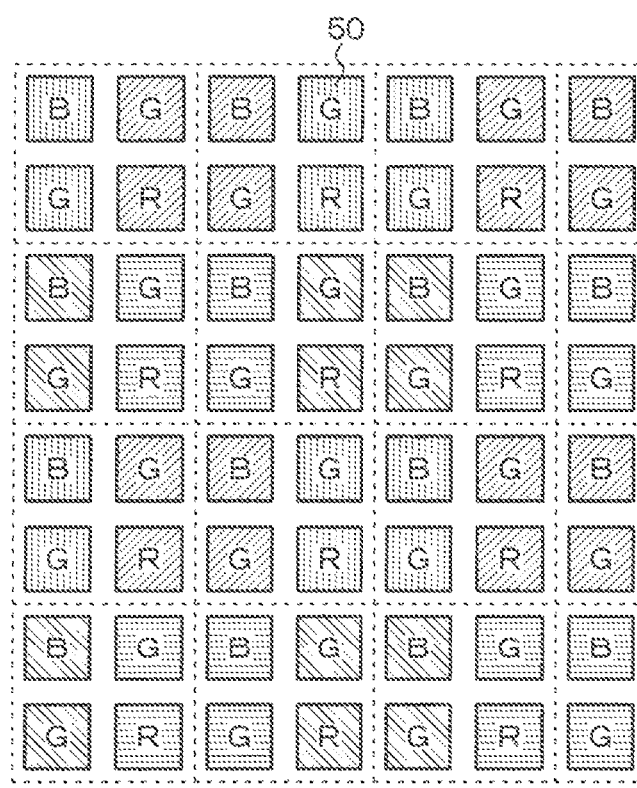
FIG. 41 is a plan layout drawing of a modification of photoelectric conversion elements having a Bayer array.
Figure 42:
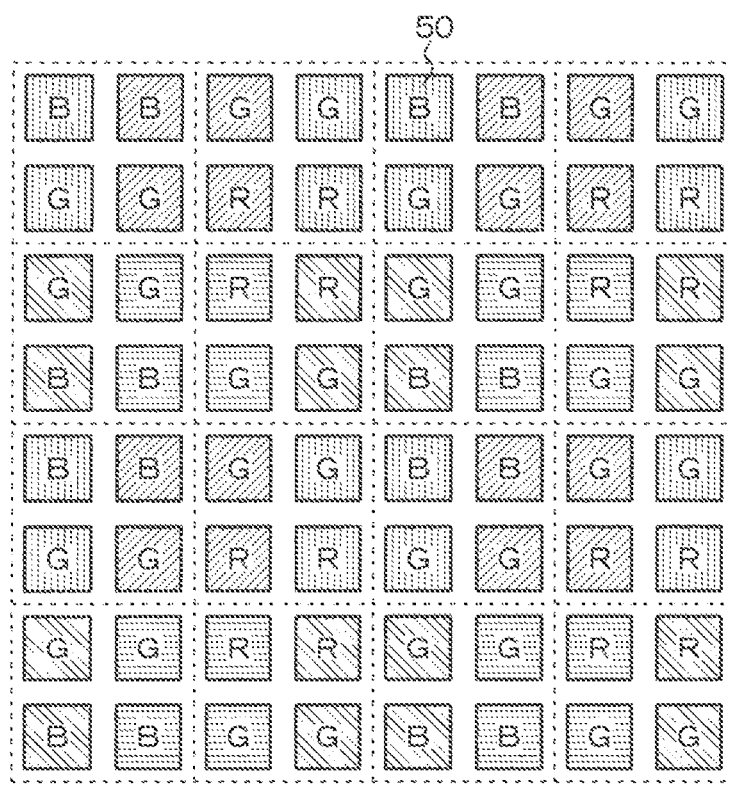
FIG. 42 is a plan layout drawing of a modification of photoelectric conversion elements having a Bayer array.
Figure 43:
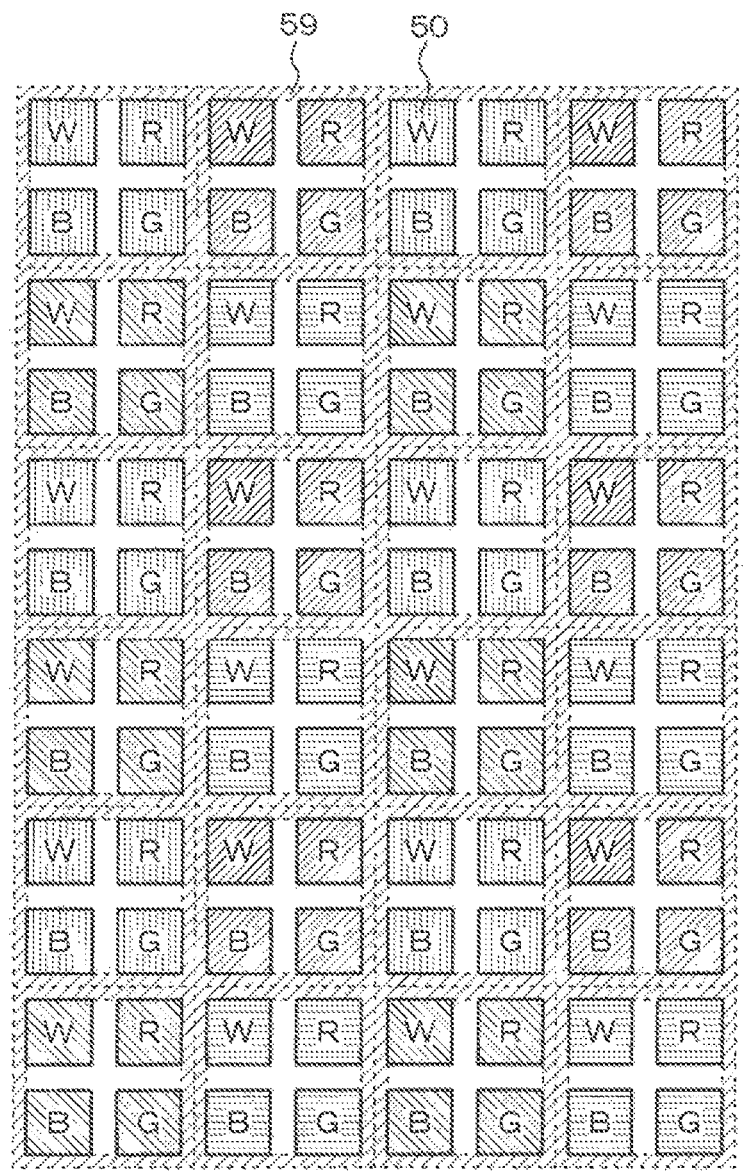
FIG. 43 is a plan layout drawing of a modification of photoelectric conversion elements having a Bayer array.

Configurations whose plan layouts are illustrated in FIGS. 34 and 35 may also be adopted. Here, in the case of a CMOS image sensor having a plan layout depicted in FIG. 34, a 2×2 pixel sharing system can be adopted in which a selection transistor, a reset transistor and an amplifying transistor are shared by 2×2 imaging elements. Specifically, in an imaging mode in which pixel addition is not conducted, imaging inclusive of polarization information is performed, and in a mode in which accumulated charges in 2×2 sub-pixel regions are subjected to FD addition, a normal picked-up image is provided through integration of all polarized light components. In addition, in the case of a plan layout illustrated in FIG. 35, the wire grid polarizers are arranged in one direction for 2×2 imaging elements, and, therefore, discontinuity of stacked structure is hardly generated between the imaging element units, and high-quality polarization imaging can be realized.

Further, configurations whose plan layouts are illustrated in FIGS. 36, 37, 38, 39, 40, 41, 42 and 43 may also be adopted.

Various modifications of the stacked type imaging element of Example 7 will be described below.

Figure 44A:
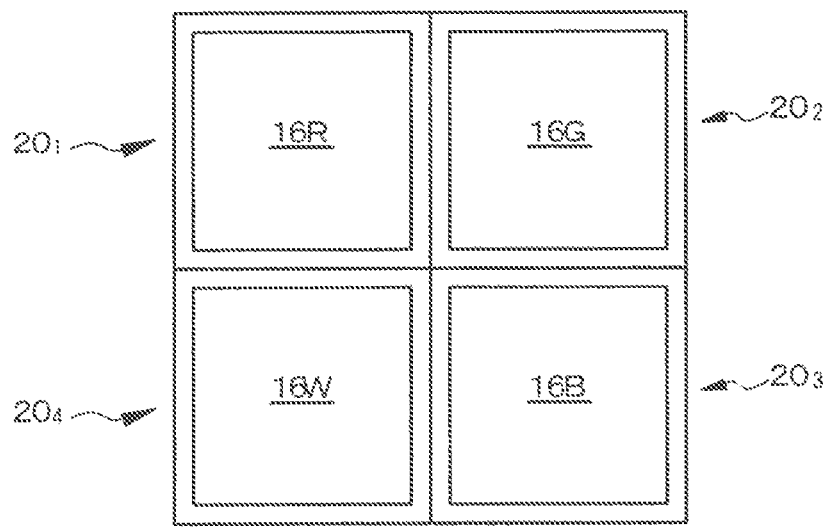
FIGS. 44A and 44B are respectively a schematic layout drawing of color filter layers and the like constituting a red light stacked type imaging element, a green light stacked type imaging element, a blue light stacked type imaging element and a white light stacked type imaging element in a first modification of Example 7, and a schematic layout drawing of wire grid polarizers.
Figure 44B:
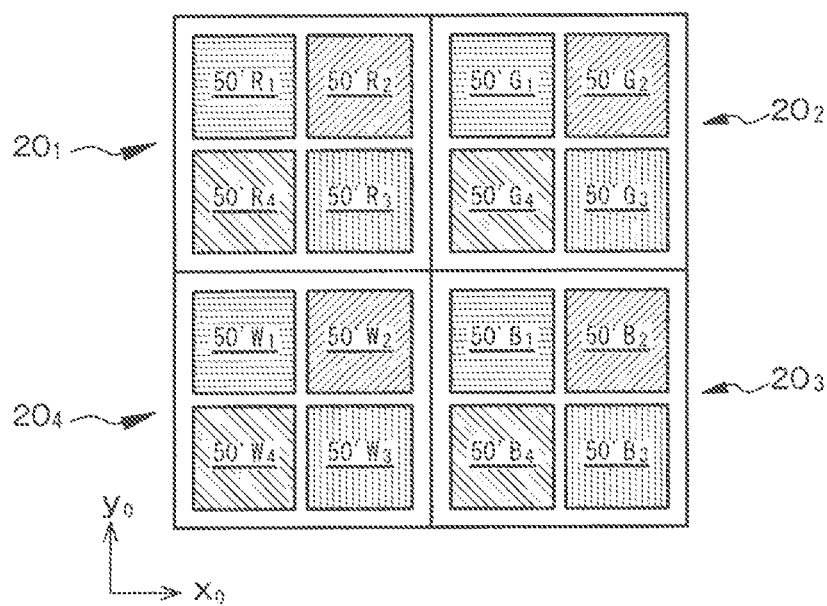

In a first modification of the stacked type imaging element of Example 7 illustrated in FIGS. 44A and 44B, a first stacked type imaging element $20_1$ includes a red color filter layer 16R [see FIG. 44A], four polarizer segments $50'R_1$, $50'R_2$, $50'R_3$, $50'R_4$ [see FIG. 44B] disposed on a lower side of the red color filter layer 16R, upper-layer photoelectric conversion sections 21a (red light photoelectric conversion sections $21R_1$, $21R_2$, $21R_3$, $21R_4$) [see FIG. 22A] disposed respectively on a lower side of the four polarizer segments, and lower-layer photoelectric conversion sections (near infrared light photoelectric conversion sections $21iR_{11}$, $21iR_{12}$, $21iR_{13}$, $21iR_{14}$) [see FIG. 22B] disposed respectively on a lower side of the upper-layer photoelectric conversion sections 21a.

In addition, a second stacked type imaging element $20_2$ includes a green color filter layer 16G [see FIG. 44A], four polarizer segments $50'G_1$, $50'G_2$, $50'G_3$, $50'G_4$ [see FIG. 44B] disposed on a lower side of the green color filter layer 16G, upper-layer photoelectric conversion sections (green light photoelectric conversion sections $21G_1$, $21G_2$, $21G_3$, $21G_4$) [see FIG. 22A] disposed respectively on a lower side of the four polarizer segments, and lower-layer photoelectric conversion sections (near infrared light photoelectric conversion sections $21iR_{21}$, $21iR_{22}$, $21iR_{23}$, $21iR_{24}$) [see FIG. 22B] disposed respectively on a lower side of the upper-layer photoelectric conversion sections.

Further, a third stacked type imaging element $20_3$ includes a blue color filter layer 16B [see FIG. 44A], four polarizer segments $50'B_1$, $50'B_2$, $50'B_3$, $50'B_4$ [see FIG. 44B] disposed on a lower side of the blue color filter layer 16B, upper-layer photoelectric conversion sections (blue light photoelectric conversion sections $21B_1$, $21B_2$, $21B_3$, $21B_4$) [see FIG. 22A] disposed respectively on a lower side of the four polarizer segments, and lower-layer photoelectric conversion sections (near infrared light photoelectric conversion sections $21iR_{31}$, $21iR_{32}$, $21iR_{33}$, $21iR_{34}$) [see FIG. 22B] disposed respectively on a lower side of the upper-layer photoelectric conversion sections.

Besides, a fourth stacked type imaging element $20_4$ includes a transparent resin layer 16W [see FIG. 44A], four polarizer segments $50'W_1$, $50'W_2$, $50'W_3$, $50'W_4$ [see FIG. 44B] disposed on a lower side of the transparent resin layer 16W, upper-layer photoelectric conversion sections (white light photoelectric conversion sections $21W_1$, $21W_2$, $21W_3$, $21W_4$) [see FIG. 22A] disposed respectively on a lower side of the four polarizer segments, and lower-layer photoelectric conversion sections (near infrared light photoelectric conversion sections $21iR_{41}$, $21iR_{44}$, $21iR_{43}$, $21iR_{44}$) [see FIG. 22B] disposed respectively on a lower side of the upper-layer photoelectric conversion sections.

In other words, further, polarizers are provided respectively on the light incidence side of the first stacked type imaging element $20_1$, the second stacked type imaging element $20_2$ and the third stacked type imaging element $20_3$, the polarizer provided on the light incidence side of the first stacked type imaging element $20_1$ includes four polarizer segments of a 1-1th polarizer (polarizer segment) $50'R_1$, a 1-2th polarizer (polarizer segment) $50'R_2$, a 1-3th polarizer (polarizer segment) $50'R_3$, and a 1-4th polarizer (polarizer segment) $50'R_4$ which are arranged in a 2×2 pattern (namely, two polarizer segments are arrayed in the $x_0$ direction, and two polarizer segments are arrayed in the $y_0$ direction), the polarization orientation in which light is to be transmitted by the 1-1th polarizer (polarizer segment) $50'R_1$ is β degrees, the polarization orientation in which light is to be transmitted by the 1-2th polarizer (polarizer segment) $50'R_2$ is (β+45) degrees, the polarization orientation in which light is to be transmitted by the 1-3th polarizer (polarizer segment) $50'R_3$ is (β+90) degrees, and the polarization orientation in which light is to be transmitted by the 1-4th polarizer (polarizer segment) $50'R_4$ is (β+135) degrees.

In addition, the polarizer provided on the light incidence side of the second stacked type imaging element $20_2$ includes four polarizer segments of a 2-1th polarizer (polarizer segment) $50'G_1$, a 2-2th polarizer (polarizer segment) $50'G_2$, a 2-3th polarizer (polarizer segment) $50'G_3$ and a 2-4th polarizer (polarizer segment) $50'G_4$ which are arranged in a 2×2 pattern (namely, two polarizer segments are arrayed in the $x_0$ direction, and two polarizer segments are arrayed in the $y_0$ direction), the polarization orientation in which light is to be transmitted by the 2-1th polarizer (polarizer segment) $50'G_1$ is γ degrees, the polarization orientation in which light is to be transmitted by the 2-2th polarizer (polarizer segment) $50'G_2$ is (γ+45) degrees, the polarization orientation in which light is to be transmitted by the 2-3th polarizer (polarizer segment) $50'G_3$ is (γ+90) degrees, and the polarization orientation in which light is to be transmitted by the 2-4th polarizer (polarizer segment) $50'G_4$ is (γ+135) degrees.

Besides, the polarizer provided on the light incidence side of the third stacked type imaging element $20_3$ includes four polarizer segments of a 3-1th polarizer (polarizer segment) $50'B_1$, a 3-2th polarizer (polarizer segment) $50'B_2$, a 3-3th polarizer (polarizer segment) $50'B_3$ and a 3-4th polarizer (polarizer segment) $50'B_4$ which are arranged in a 2×2 pattern (namely, two polarizer segments are arrayed in the $x_0$ direction, and two polarizer segments are arrayed in the $y_0$ direction), the polarization orientation in which light is to be transmitted by the 3-1th polarizer (polarizer segment) $50'B_1$ is δ degrees, the polarization orientation in which light is to be transmitted by the 3-2th polarizer (polarizer segment) $50'B_2$ is (δ+45) degrees, the polarization orientation in which light is to be transmitted by the 3-3th polarizer (polarizer segment) $50'B_3$ is (δ+90) degrees, and the polarization orientation in which light is to be transmitted by the 3-4th polarizer (polarizer segment) $50'B_4$ is (δ+135) degrees.

Here, β=γ=δ, and as the value of β, γ and δ, an angle formed with the $y_0$ direction was set to "0 degrees."

Figure 45A:
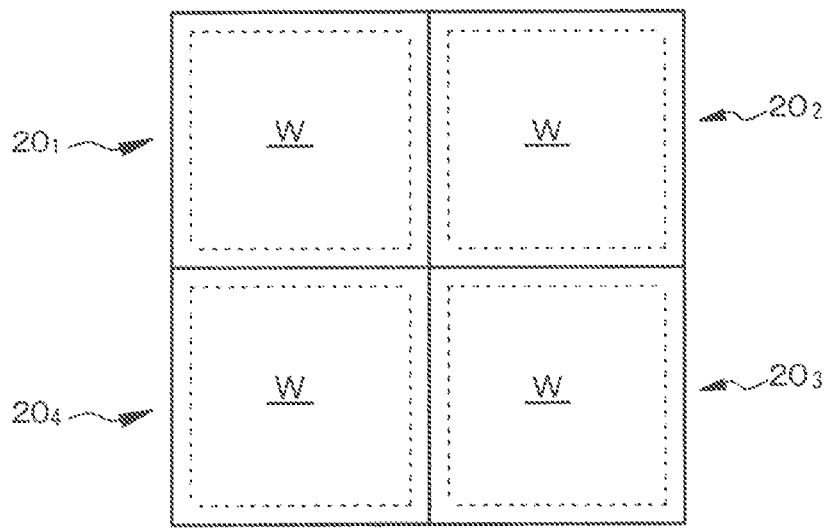
FIGS. 45A and 45B are respectively a schematic layout drawing of regions constituting white light stacked type imaging elements and the like in a second modification of Example 7, and a schematic layout drawing of wire grid polarizers.
Figure 45B:
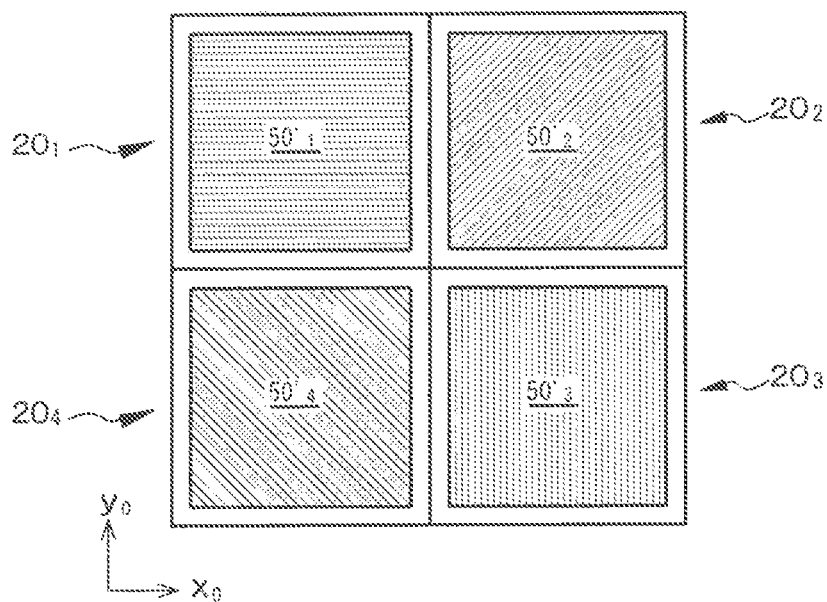
Figure 46A:
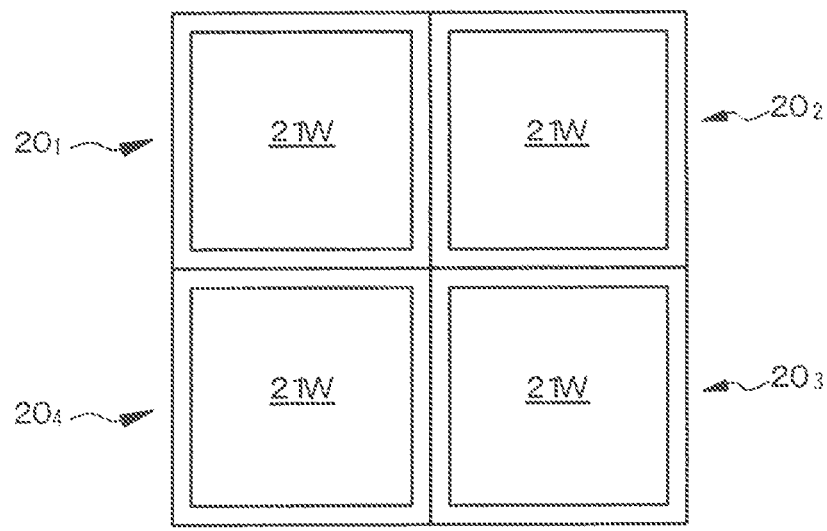
FIGS. 46A and 46B are respectively a schematic layout drawing of upper-layer photoelectric conversion sections of white light stacked type imaging elements in the second modification of Example 7, and a schematic layout drawing of lower-layer photoelectric conversion sections.
Figure 46B:
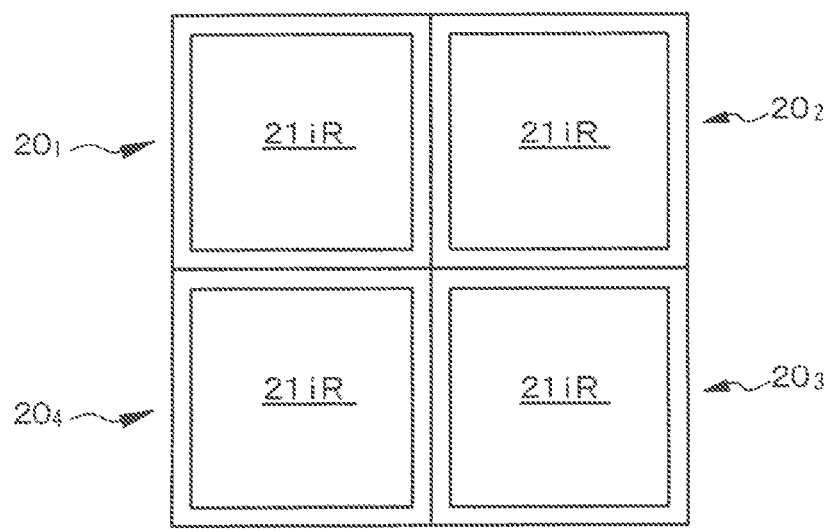

Alternatively, as a second modification of the stacked type imaging element of Example 7, there may be mentioned a stacked type imaging element which constitutes a monochromic solid-state imaging device. A schematic layout drawing of regions W constituting 2×2 white light stacked type imaging elements is illustrated in FIG. 45A, a schematic layout drawing of polarizers $50_1$, $50_2$, $50_3$, $50_4$ is depicted in FIG. 45B, a schematic layout drawing of upper-layer photoelectric conversion sections 21W constituting white light stacked type imaging elements is illustrated in FIG. 46A, and a schematic layout drawing of lower-layer photoelectric conversion sections 21iR is depicted in FIG. 46B. Specifically, the stacked type imaging element includes regions W (transparent resin layers 16W may be formed) [see FIG. 45A] constituting white light stacked type imaging elements, four polarizer segments $50'W_1$, $50'W_2$, $50'W_3$, $50'W_4$ [see FIG. 45B] disposed respectively on a lower side of these regions W, upper-layer photoelectric conversion sections (white light photoelectric conversion sections 21W) [see FIG. 46A] disposed respectively on a lower side of the four polarizer segments, and lower-layer photoelectric conversion sections (near infrared light photoelectric conversion sections 21iR) [see FIG. 46B] disposed respectively on the upper-layer photoelectric conversion sections.

Alternatively, as a third modification of the stacked type imaging element of Example 7, there may be mentioned a stacked type imaging element that constitutes a solid-state imaging device having a Bayer array. As a schematic layout drawing of color filter layers and the like constituting a red light stacked type imaging element, a green light stacked type imaging element and a blue light stacked type imaging element is illustrated in FIG. 47A, a schematic layout drawing of polarizers is depicted in FIG. 47B, a schematic layout drawing of upper-layer photoelectric conversion sections constituting a red light stacked type imaging element, a green light stacked type imaging element and a blue light stacked type imaging element is illustrated in FIG. 48A, and a schematic layout drawing of lower-layer photoelectric conversion sections is depicted in FIG. 48B, a plurality of photoelectric conversion sections may include photoelectric conversion sections sensitive to red light or green light or blue light and photoelectric conversion sections sensitive to near infrared light.

Figure 47A:
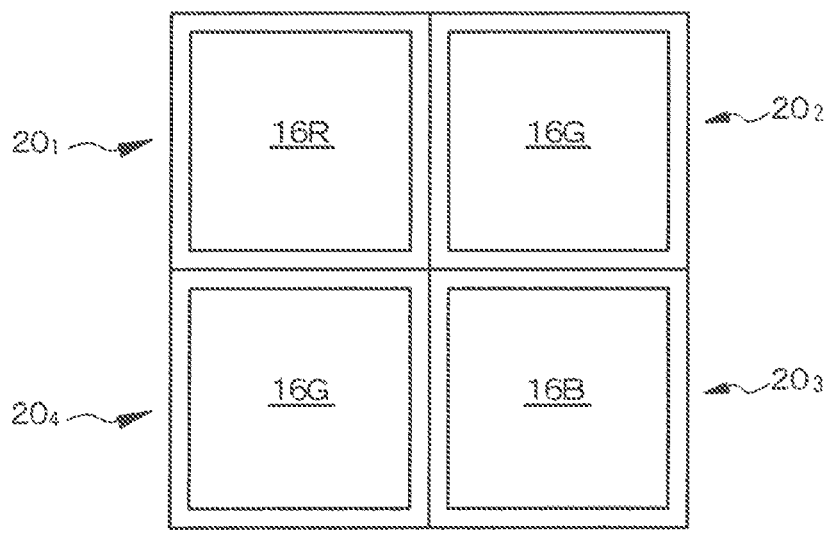
FIGS. 47A and 47B are respectively a schematic layout drawing of regions constituting white light stacked type imaging elements and the like in a third modification of Example 7, and a schematic layout drawing of wire grid polarizers.
Figure 47B:
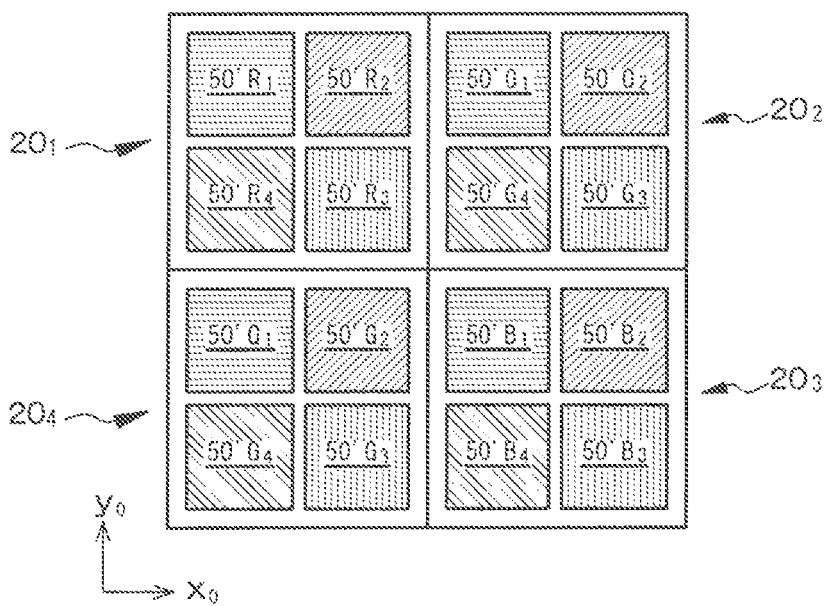
Figure 48A:
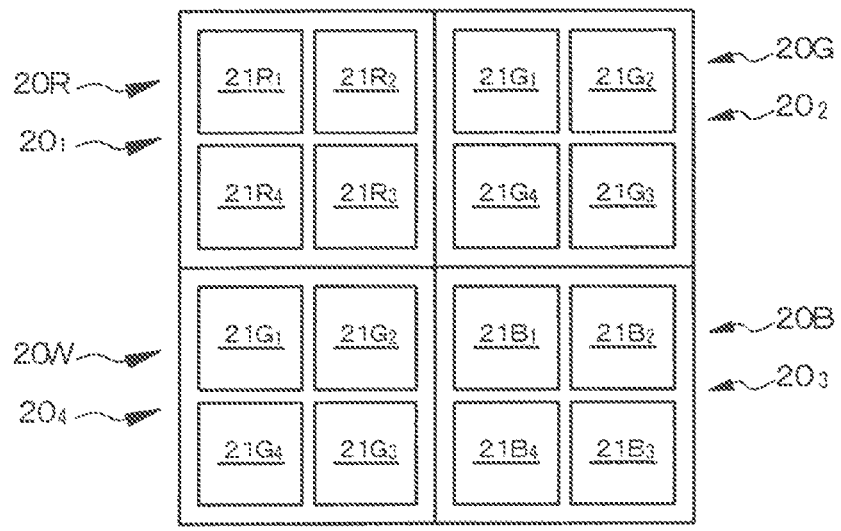
FIGS. 48A and 48B are respectively a schematic layout drawing of upper-layer photoelectric conversion sections constituting white light stacked type imaging elements in the third modification of Example 7, and a schematic layout drawing of lower-layer photoelectric conversion sections.
Figure 48B:
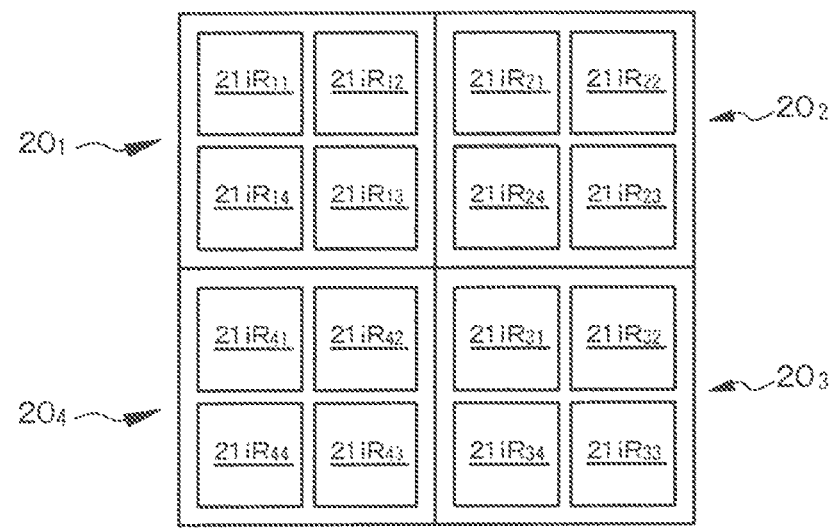

Specifically, a first stacked type imaging element $20_1$ includes a red color filter layer 16R [see FIG. 47A], four polarizer segments $50'R_1$, $50'R_2$, $50'R_3$, $50'R_4$ [see FIG. 47B] disposed on a lower side of the red color filter layers 16R, upper-layer photoelectric conversion sections (red light photoelectric conversion sections $21R_1$, $21R_2$, $21R_3$, $21R_4$) [see FIG. 48A] disposed respectively on a lower side of the four polarizer segments, and lower-layer photoelectric conversion sections (near infrared light photoelectric conversion sections $21iR_{11}$, $21iR_{12}$, $21iR_{13}$, $21iR_{14}$) [see FIG. 48B] disposed respectively on a lower side of the upper-layer photoelectric conversion sections.

In addition, a second stacked type imaging element $20_2$ and a fourth stacked type imaging element $20_4$ include a green color filter layer 16G [see FIG. 47A], four polarizer segments $50'G_1$, $50'G_2$, $50'G_3$, $50'G_4$ [see FIG. 47B] disposed respectively on a lower side of the green color filter layers 16G, upper-layer photoelectric conversion sections (green light photoelectric conversion sections $21G_1$, $21G_2$, $21G_3$, $21G_4$) [see FIG. 48A] disposed respectively on a lower side of the four polarizer segments, and lower-layer photoelectric conversion sections (near infrared light photoelectric conversion sections $21iR_{21}$, $21iR_{22}$, $21iR_{23}$, $21iR_{24}$, $21iR_{41}$, $21iR_{42}$, $21iR_{43}$, $21iR_{44}$) [see FIG. 48B] disposed respectively on a lower side of the upper-layer photoelectric conversion sections.

Further, a third stacked type imaging element $20_3$ includes a blue color filter layer 16B [see FIG. 47A], four polarizer segments $50'B_1$, $50'B_2$, $50'B_3$, $50'B_4$ [see FIG. 47B] disposed on a lower side of the blue color filter layer 16B, upper-layer photoelectric conversion sections (blue light photoelectric conversion sections $21B_1$, $21B_2$, $21B_3$, $21B_4$) [see FIG. 48A] disposed respectively on a lower side of the four polarizer segments, and lower-layer photoelectric conversion sections (near infrared light photoelectric conversion sections $21iR_{31}$, $21iR_{32}$, $21iR_{33}$, $21iR_{34}$) [see FIG. 48B] disposed respectively on a lower side of the upper-layer photoelectric conversion sections.

Figure 49A:
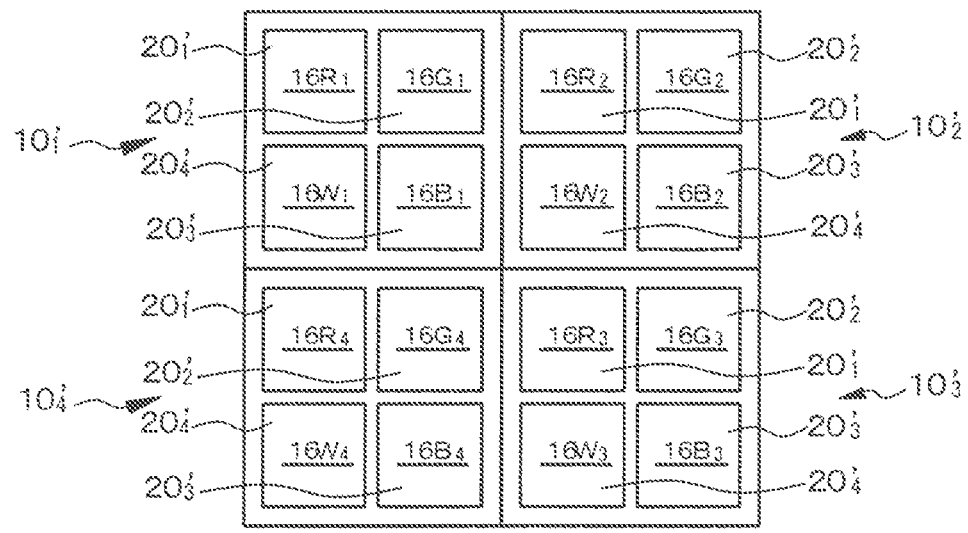
FIGS. 49A and 49B are respectively a schematic layout drawing of color filter layers and the like constituting a red light stacked type imaging element, a green light stacked type imaging element, a blue light stacked type imaging element and a white light stacked type imaging element in a fourth modification of Example 7, and a schematic layout drawing of wire grid polarizers.
Figure 49B:
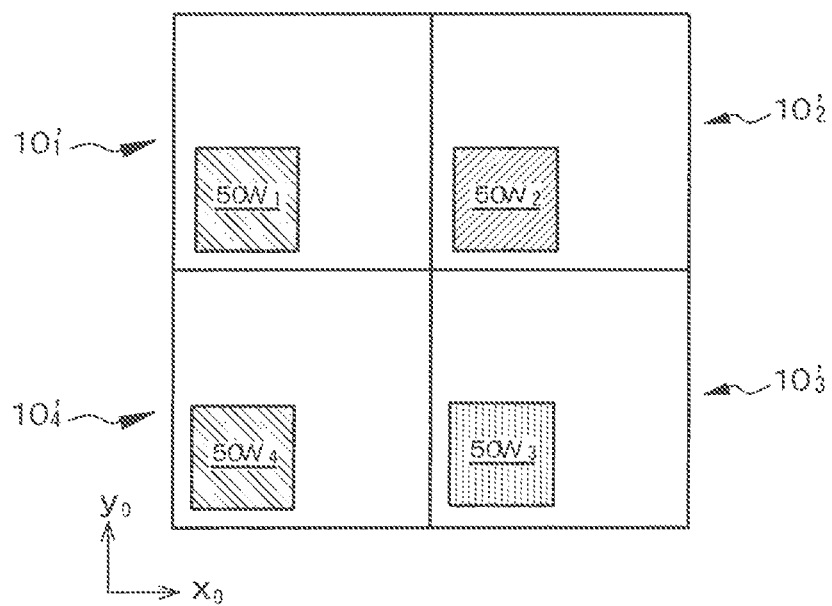
Figure 50A:
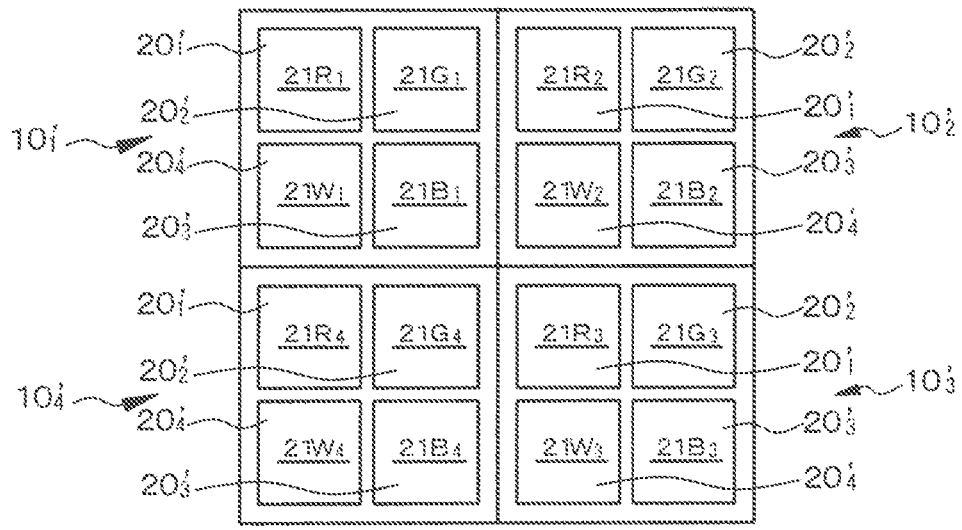
FIGS. 50A and 50B are respectively a schematic layout drawing of upper-layer photoelectric conversion sections constituting a red light stacked type imaging element, a green light stacked type imaging element, a blue light stacked type imaging element and a white light stacked type imaging element in the fourth modification of Example 7, and a schematic layout drawing of lower-layer photoelectric conversion sections.
Figure 50B:
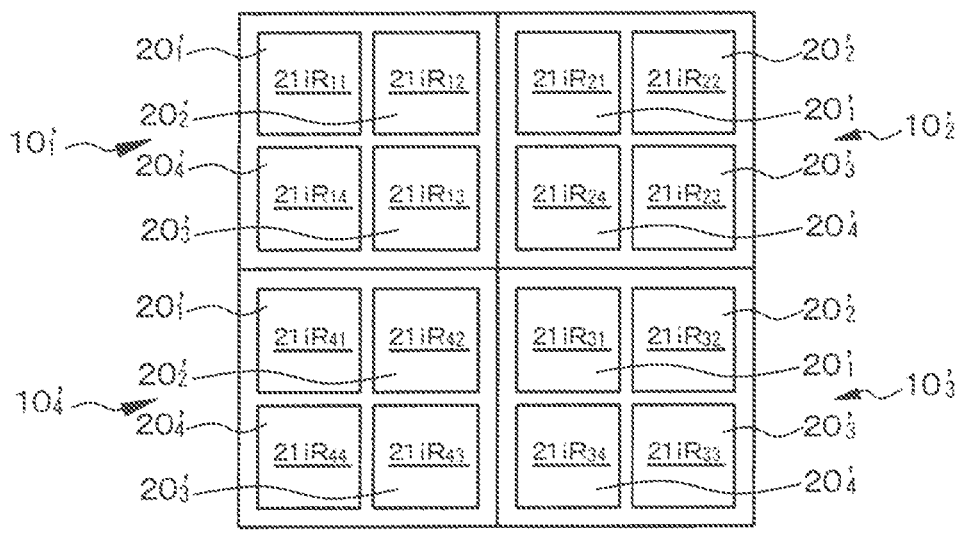

Alternatively, a schematic layout drawing of color filter layers and the like constituting a red light stacked type imaging element, a green light stacked type imaging element, a blue light stacked type imaging element and a white light stacked type imaging element in a fourth modification of the stacked type imaging element of Example 7 is illustrated in FIG. 49A, a schematic layout drawing of polarizers is depicted in FIG. 49B, a schematic layout drawing of upper-layer photoelectric conversion sections constituting the red light stacked type imaging element, the green light stacked type imaging element, the blue light stacked type imaging element and the white light stacked type imaging element is illustrated in FIG. 50A, and a schematic layout drawing of lower-layer photoelectric conversion sections is depicted in FIG. 50B.

In this fourth modification, in a first imaging element unit $10'_1$, a first stacked type imaging element $20'_1$ includes a photoelectric conversion section $21R_1$ sensitive to red light and a photoelectric conversion section $21iR_{11}$ sensitive to near infrared light, a second stacked type imaging element $20'_2$ includes a photoelectric conversion section $21G_1$ sensitive to green light and a photoelectric conversion section $21iR_{12}$ sensitive to near infrared light, a third stacked type imaging element $20'_3$ includes a photoelectric conversion section $21B_1$ sensitive to blue light and a photoelectric conversion section $21iR_{13}$ sensitive to near infrared light, and a fourth stacked type imaging element $20'_4$ includes a photoelectric conversion section $21W_1$ sensitive to white light and a photoelectric conversion section $21iR_{14}$ sensitive to near infrared light.

In addition, in a second imaging element unit $10'_2$, a first stacked type imaging element $20'_1$ includes a photoelectric conversion section $21R_2$ sensitive to red light and a photoelectric conversion section $21iR_{21}$ sensitive to near infrared light, a second stacked type imaging element $20'_2$ includes a photoelectric conversion section $21G_2$ sensitive to green light and a photoelectric conversion section $21iR_{22}$ sensitive to near infrared light, a third stacked type imaging element $20'_3$ includes a photoelectric conversion section $21B_2$ sensitive to blue light and a photoelectric conversion section $21iR_{23}$ sensitive to near infrared light, and a fourth stacked type imaging element $20'_4$ includes a photoelectric conversion section $21W_2$ sensitive to white light and a photoelectric conversion section $21iR_{24}$ sensitive to near infrared light.

Further, in a third imaging element unit $10'_3$, a first stacked type imaging element $20'_1$ includes a photoelectric conversion section $21R_3$ sensitive to red light and a photoelectric conversion section $21iR_{31}$ sensitive to near infrared light, a second stacked type imaging element $20'_2$ includes a photoelectric conversion section $21G_3$ sensitive to green light and a photoelectric conversion section $21iR_{32}$ sensitive to near infrared light, a third stacked type imaging element $20'_3$ includes a photoelectric conversion section $21B_3$ sensitive to blue light and a photoelectric conversion section $21iR_{33}$ sensitive to near infrared light, and a fourth stacked type imaging element $20'_4$ includes a photoelectric conversion section $21W_3$ sensitive to white light and a photoelectric conversion section $21iR_{34}$ sensitive to near infrared light.

Besides, in a fourth imaging element unit $10'_4$, a first stacked type imaging element $20'_1$ includes a photoelectric conversion section $21R_4$ sensitive to red light and a photoelectric conversion section $21iR_{41}$ sensitive to near infrared light, a second stacked type imaging element $20'_2$ includes a photoelectric conversion section $21G_4$ sensitive to green light and a photoelectric conversion section $21iR_{42}$ sensitive to near infrared light, a third stacked type imaging element $20'_3$ includes a photoelectric conversion section $21B_4$ sensitive to blue light and a photoelectric conversion section $21iR_{43}$ sensitive to near infrared light, and a fourth stacked type imaging element $20'_4$ includes a photoelectric conversion section $21W_4$ sensitive to white light and a photoelectric conversion section $21iR_{44}$ sensitive to near infrared light.

The first stacked type imaging element $20'_1$, the second stacked type imaging element $20'_2$ and the third stacked type imaging element $20'_3$ include no polarizer, whereas the fourth stacked type imaging element $20'_4$ includes polarizers $50W_1$, $50W_2$, $50W_3$, $50W_4$.

In the fourth modification, since the first stacked type imaging element $20'_1$, the second stacked type imaging element $20'_2$ and the third stacked type imaging element $20'_3$ include no polarizer, whereas the fourth stacked type imaging element $20'_4$ includes polarizers $50W_1$, $50W_2$, $50W_3$, $50W_4$, luminance output can be prevented from being lowered due to wavelength separation of red light, green light and blue light, polarization information in wavelength bands of red light, green light and blue light can be completely acquired, and color and luminance and polarization information can be utilized to a maximal degree. In addition, since there is no loss of light in the color filter layers, an advantage that an output having polarization information is enhanced can be obtained.

Figure 51A:
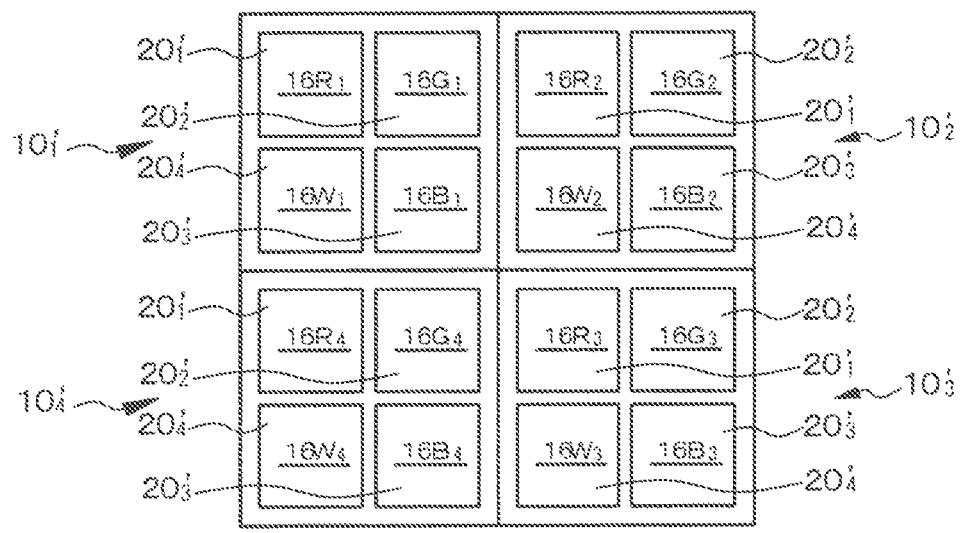
FIGS. 51A and 51B are respectively a schematic layout drawing of color filter layers and the like constituting a red light stacked type imaging element, a green light stacked type imaging element, a blue light stacked type imaging element and a white light stacked type imaging element in a 4-1th modification of Example 7, and a schematic layout drawing of wire grid polarizers.
Figure 51B:
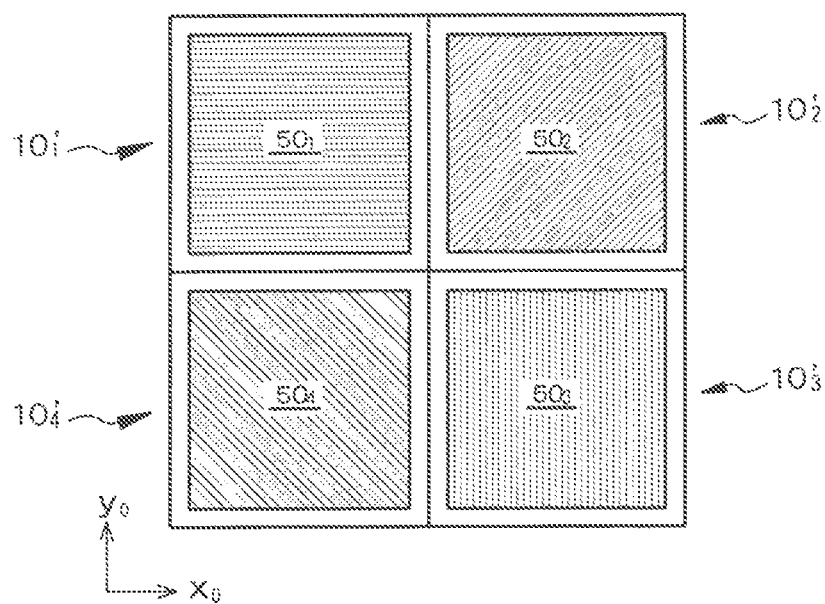
Figure 52A:
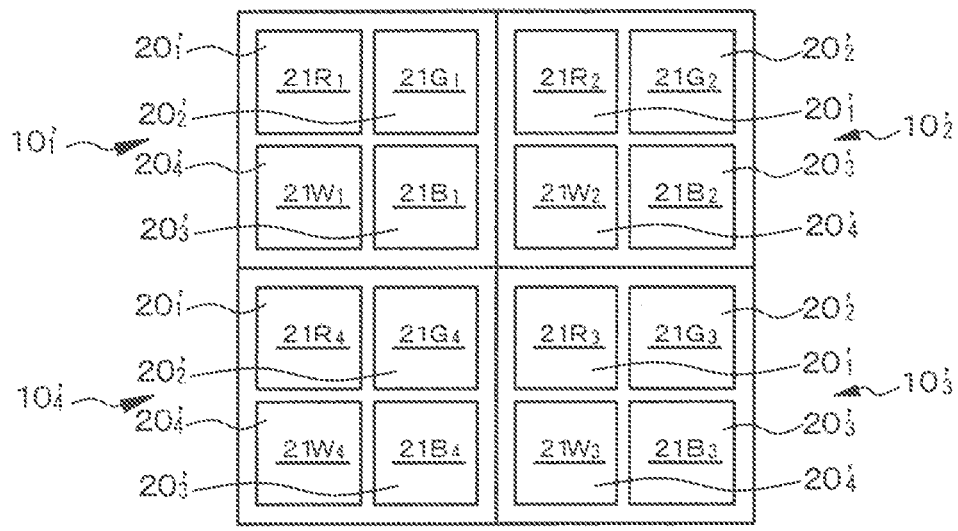
FIGS. 52A and 52B are respectively a schematic layout drawing of upper-layer photoelectric conversion sections constituting a red light stacked type imaging element, a green light stacked type imaging element, a blue light stacked type imaging element and a white light stacked type imaging element in the 4-1th modification of Example 7, and a schematic layout drawing of lower-layer photoelectric conversion sections.
Figure 52B:
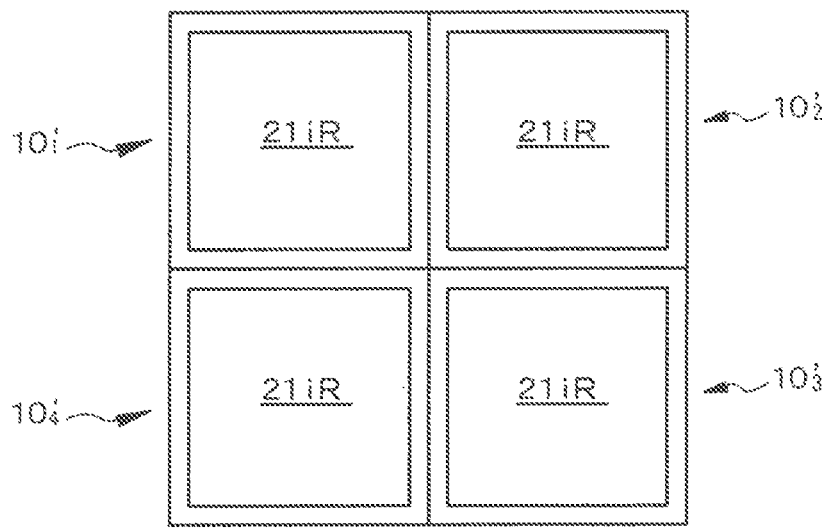

A schematic layout drawing of color filter layers and the like constituting a red light stacked type imaging element, a green light stacked type imaging element, a blue light stacked type imaging element and a white light stacked type imaging element in a modification (4-1th modification) of the fourth modification of the stacked type imaging element of Example 7 is illustrated in FIG. 51A, and a schematic layout drawing of polarizers is depicted in FIG. 51B. In addition, a schematic layout drawing of upper-layer photoelectric conversion sections constituting the red light stacked type imaging element, the green light stacked type imaging element, the blue light stacked type imaging element and the white light stacked type imaging element in the 4-1th modification is illustrated in FIG. 52A, and a schematic layout drawing of lower-layer photoelectric conversion sections is depicted in FIG. 52B.

In the 4-1th modification, each of imaging element units $10'_1$, $10'_2$, $10'_3$, $10'_4$ further includes polarizers $50_1$, $50_2$, $50_3$ on the light incidence side of the first stacked type imaging element $20'_1$, the second stacked type imaging element $20'_2$ and the third stacked type imaging element $20'_3$, and the polarizers $50_1$, $50_2$, $50_3$, $50_4$ provided in the first stacked type imaging element $20'_1$, the second stacked type imaging element $20'_2$, the third stacked type imaging element $20'_3$ and the fourth stacked type imaging element $20'_4$ have the same polarization orientation in one polarizer.

Specifically, in the first imaging element unit $10'_1$, one polarizer $50_1$ is disposed and one lower-layer photoelectric conversion section 21iR is disposed, for a photoelectric conversion section $21R_1$ constituting the first stacked type imaging element $20'_1$, a photoelectric conversion section $21G_1$ constituting the second stacked type imaging element $20'_1$, a photoelectric conversion section $21B_1$ constituting the third stacked type imaging element $20'_1$, and a photoelectric conversion section $21W_1$ constituting the fourth stacked type imaging element $20'_1$.

In addition, in the second imaging element unit $10'_2$, one polarizer $50_2$ is disposed and one lower-layer photoelectric conversion section 21iR is disposed, for a photoelectric conversion section $21R_2$ constituting the first stacked type imaging element $20'_2$, a photoelectric conversion section $21G_2$ constituting the second stacked type imaging element $20'_2$, a photoelectric conversion section $21B_2$ constituting the third stacked type imaging element $20'_2$, and a photoelectric conversion section $21W_2$ constituting the fourth stacked type imaging element $20'_2$.

Besides, in the third imaging element unit $10'_3$, one polarizer $50_3$ is disposed and one lower-layer photoelectric conversion section 21iR is disposed, for a photoelectric conversion section $21R_3$ constituting the first stacked type imaging element $20'_3$, a photoelectric conversion section $21G_3$ constituting the second stacked type imaging element $20'_3$, a photoelectric conversion section $21B_3$ constituting the third stacked type imaging element $20'_3$, and a photoelectric conversion section $21W_3$ constituting the fourth stacked type imaging element $20'_3$.

In addition, in the fourth imaging element unit $10'_4$, one polarizer $50_4$ is disposed and one lower-layer photoelectric conversion section 21iR is disposed, for a photoelectric conversion section $21R_4$ constituting the first stacked type imaging element $20'_4$, a photoelectric conversion section $21G_4$ constituting the second stacked type imaging element $20'_4$, a photoelectric conversion section $21B_4$ constituting the third stacked type imaging element $20'_4$, and a photoelectric conversion section $21W_4$ constituting the fourth stacked type imaging element $20'_4$.

Figure 53:
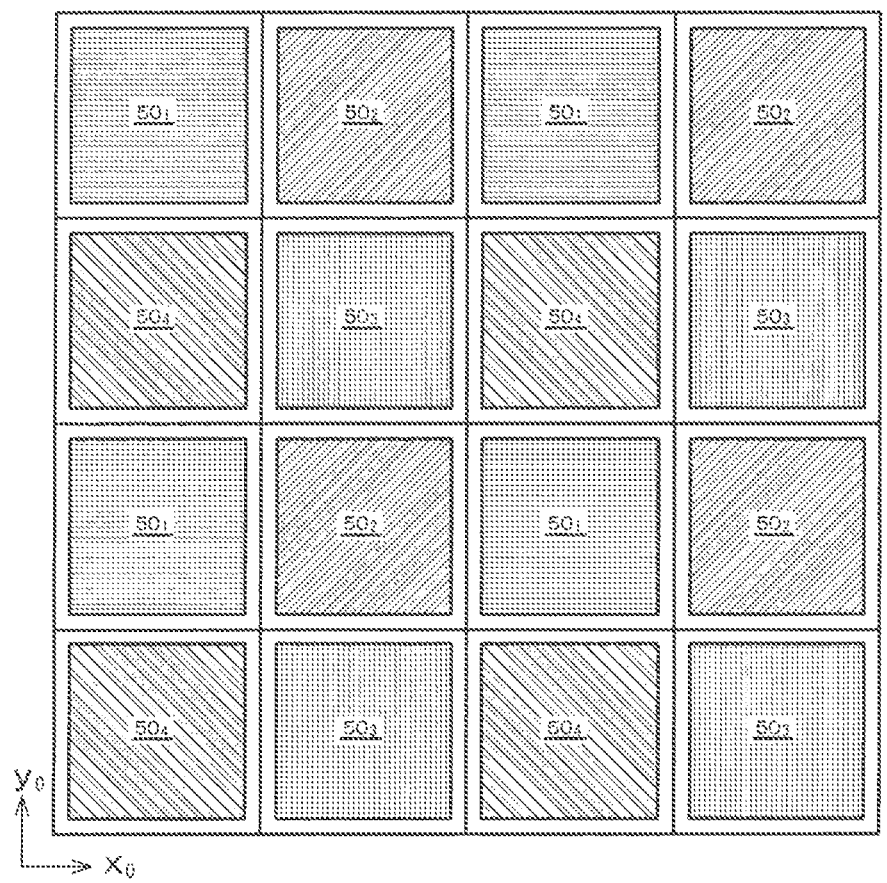
FIG. 53 is a schematic layout drawing of wire grid polarizers constituting a red light stacked type imaging element, a green light stacked type imaging element, a blue light stacked type imaging element and a white light stacked type imaging element in a 4-2th modification of Example 7, and is a diagram illustrating the relation of adjacent stacked type imaging elements with wire grid polarizers.

Further, the adjacent imaging element units are different from each other in polarization orientation of the polarizer (see the schematic layout drawing of polarizers of FIG. 53).

Figure 54A:
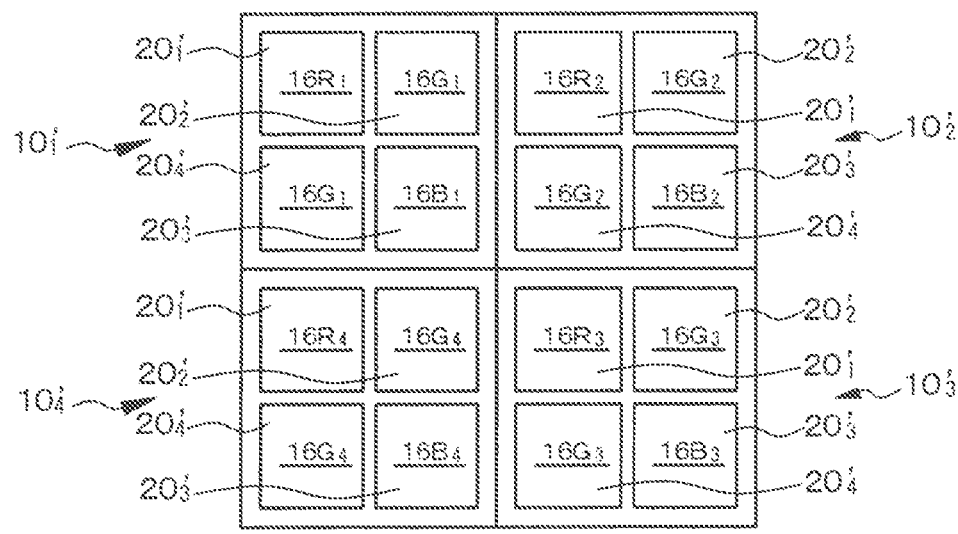
FIGS. 54A and 54B are respectively a schematic layout drawing of color filter layers and the like constituting a red light stacked type imaging element, a green light stacked type imaging element and a blue light stacked type imaging element in a 4-3th modification of Example 7, and a schematic layout drawing of wire grid polarizers.
Figure 54B:
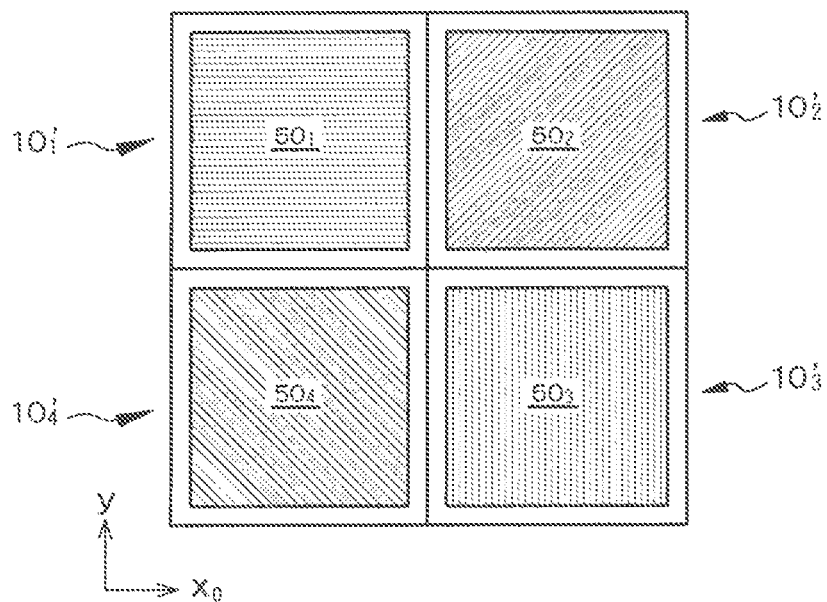

Alternatively, as a modification (4-2th modification) of the fourth modification of the stacked type imaging element of Example 7, there may be mentioned a stacked type imaging element that constitutes a solid-state imaging device having a Bayer array. A schematic layout drawing of color filter layers and the like constituting a red light stacked type imaging element, a green light stacked type imaging element and a blue light stacked type imaging element in the 4-2th modification is illustrated in FIG. 54A, and a schematic layout drawing of polarizers is depicted in FIG. 54B. In addition, a schematic layout drawing of upper-layer photoelectric conversion sections constituting the red light stacked type imaging element, the green light stacked type imaging element and the blue light stacked type imaging element in the 4-2th modification is illustrated in FIG. 55A, and a schematic layout drawing of lower-layer photoelectric conversion sections is depicted in FIG. 55B.

In the 4-2th modification, the plurality of photoelectric conversion sections may include photoelectric conversion sections that are sensitive to red light or green light or blue light, and photoelectric conversion sections that are sensitive to near infrared light.

Figure 55A:
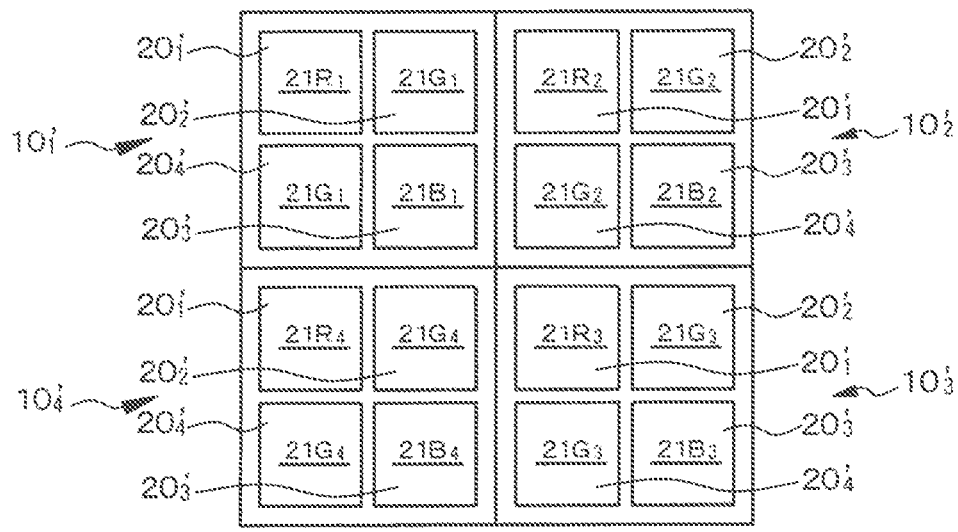
FIGS. 55A and 55B are respectively a schematic layout drawing of upper-layer photoelectric conversion sections constituting a red light stacked type imaging element, a green light stacked type imaging element and a blue light stacked type imaging element in the 4-3th modification of Example 7, and a schematic layout drawing of lower-layer photoelectric conversion sections.
Figure 55B:
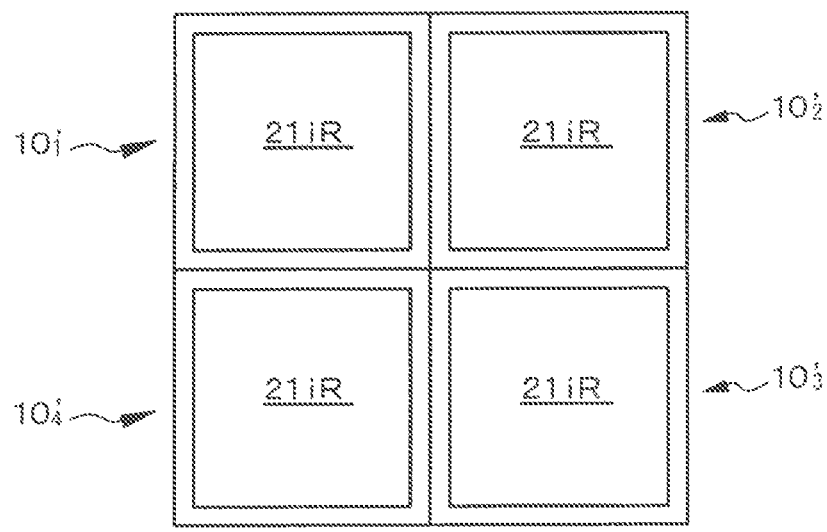

Specifically, the first stacked type imaging element $20'_1$ constituting the first imaging element unit $10'_1$ includes a red color filter layer $16R_1$, two green color filter layers $16G_1$, a blue color filter layer $16B_1$ [see FIG. 54A], one polarizer $50_1$ [see FIG. 54B] disposed on a lower side of these color filter layers $16R_1$, $16G_1$, $16B_1$, four upper-layer photoelectric conversion sections (red light photoelectric conversion section $21R_1$, green light photoelectric conversion section $21G_1$, blue light photoelectric conversion section $21B_1$, green light photoelectric conversion section $21G_1$) [see FIG. 55A] disposed on a lower side of the one polarizer $50_1$, and one lower-layer photoelectric conversion section (near infrared light photoelectric conversion section 21iR) [see FIG. 55B] disposed on a lower side of the upper-layer photoelectric conversion sections.

In addition, the first stacked type imaging element $20'_2$ constituting the second imaging element unit $10'_2$ includes a red color filter layer $16R_2$, two green color filter layers $16G_2$, a blue color filter layer $16B_2$ [see FIG. 54A], one polarizer $50_2$ [see FIG. 54B] disposed on a lower side of these color filter layers $16R_2$, $16G_2$, $16B_2$, four upper-layer photoelectric conversion sections (red light photoelectric conversion section $21R_2$, green light photoelectric conversion section $21G_2$, blue light photoelectric conversion section $21B_2$, green light photoelectric conversion section $21G_2$) [see FIG. 55A] disposed on a lower side of the one polarizer $50_2$, and one lower-layer photoelectric conversion section (near infrared light photoelectric conversion section 21iR) [see FIG. 55B] disposed on a lower side of the upper-layer photoelectric conversion sections.

Besides, the third stacked type imaging element $20'_3$ constituting the first imaging element unit $10'_3$ includes a red color filter layer $16R_3$, two green color filter layers $16G_3$, a blue color filter layer $16B_3$ [see FIG. 54A], one polarizer $50_3$ [see FIG. 54B] disposed on a lower side of these color filter layers $16R_3$, $16G_3$, $16B_3$, four upper-layer photoelectric conversion sections (red light photoelectric conversion section $21R_3$, green light photoelectric conversion section $21G_3$, blue light photoelectric conversion section $21B_3$, green light photoelectric conversion section $21G_3$) [see FIG. 55A] disposed on a lower side of the one polarizer $50_3$, and one lower-layer photoelectric conversion section (near infrared light photoelectric conversion section 21iR) [see FIG. 55B] disposed on a lower side of the upper-layer photoelectric conversion sections.

In addition, the fourth stacked type imaging element $20'_4$ constituting the first imaging element unit $10'_4$ includes a red color filter layer $16R_4$, two green color filter layers $16G_4$, a blue color filter layer $16B_4$ [see FIG. 54A], one polarizer $50_4$ [see FIG. 54B] disposed on a lower side of these color filter layers $16R_4$, $16G_4$, $16B_4$, four upper-layer photoelectric conversion sections (red light photoelectric conversion section $21R_4$, green light photoelectric conversion section $21G_4$, blue light photoelectric conversion section $21B_4$, green light photoelectric conversion section $21G_4$) [see FIG. 55A] disposed on a lower side of the one polarizer $50_4$, and one lower-layer photoelectric conversion section (near infrared light photoelectric conversion section 21iR) [see FIG. 55B] disposed on a lower side of the upper-layer photoelectric conversion sections.

In other words, in the 4-1th modification and the 4-2th modification, as depicted in FIGS. 51A, 51B, 52A, 52B, 53, 54A, 54B, 55A and 55B, the first stacked type imaging element $20'_1$ includes a photoelectric conversion section sensitive to red light and a photoelectric conversion section sensitive to near infrared light, the second stacked type imaging element $20'_2$ includes a photoelectric conversion section sensitive to green light and a photoelectric conversion section sensitive to near infrared light, the third stacked type imaging element $20'_3$ includes a photoelectric conversion section sensitive to blue light and a photoelectric conversion section sensitive to near infrared light, four imaging element units of a first imaging element unit $10'_1$, a second imaging element unit $10'_2$, a third imaging element unit $10'_3$ and a fourth imaging element unit $10'_4$ arranged in a 2×2 pattern (namely, two imaging element units arrayed in the $x_0$ direction, and two imaging element units arrayed in the $y_0$ direction) constitute an imaging element unit group, the polarization orientation in which light is to be transmitted by the first polarizer $50_1$ provided in the first imaging element unit $10'_1$ is $\alpha$ degrees, the polarization orientation in which light is to be transmitted by the second polarizer $50_2$ provided in the second imaging element unit $10'_2$ is $(\alpha+45)$ degrees, the polarization orientation in which light is to be transmitted by the third polarizer $50_3$ provided in the third imaging element unit $10'_3$ is $(\alpha+90)$ degrees, and the polarization orientation in which light is to be transmitted by the fourth polarizer $50_4$ provided in the fourth imaging element unit $10'_4$ is $(\alpha+135)$ degrees.

Figure 63:
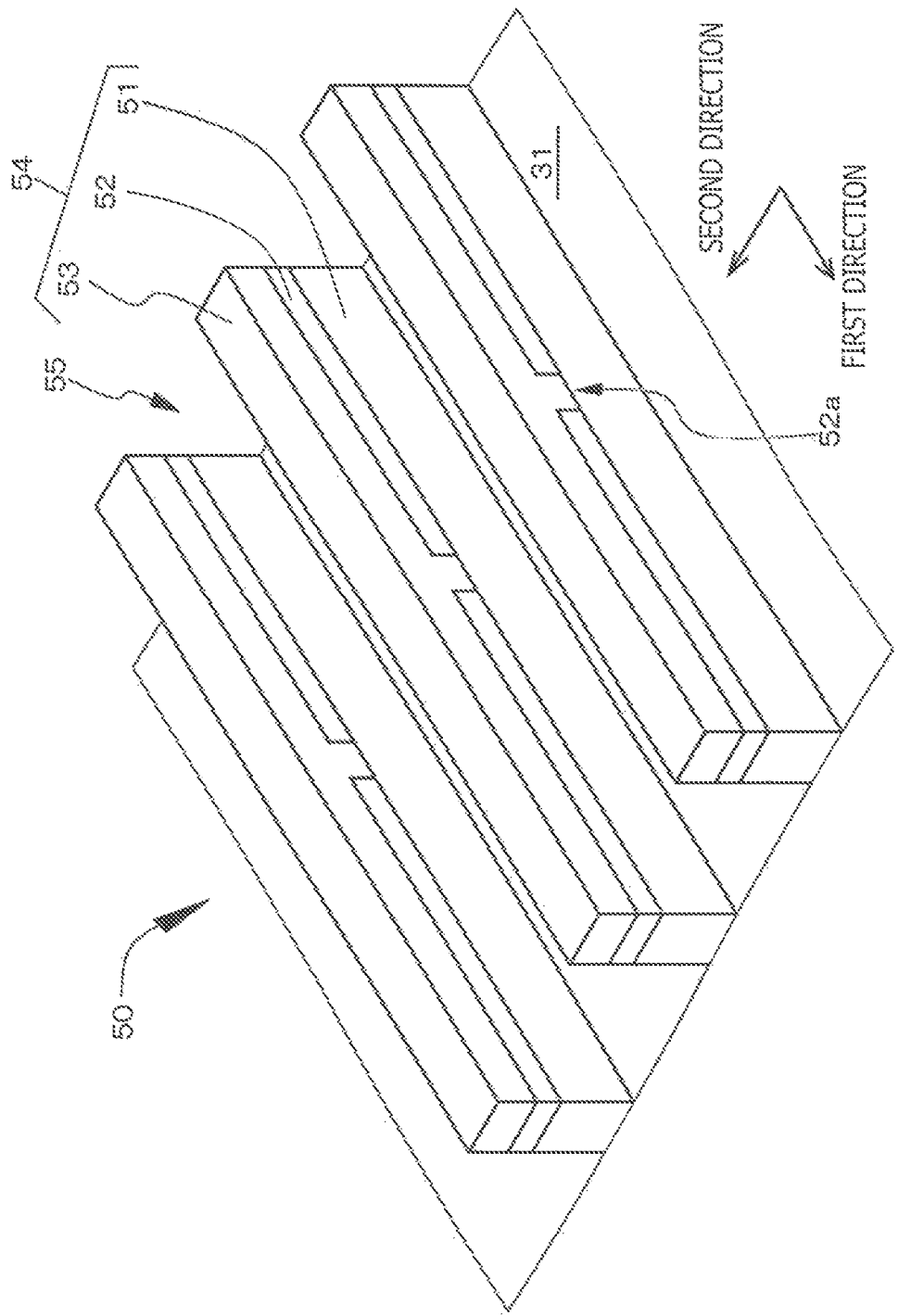
Figure 64:
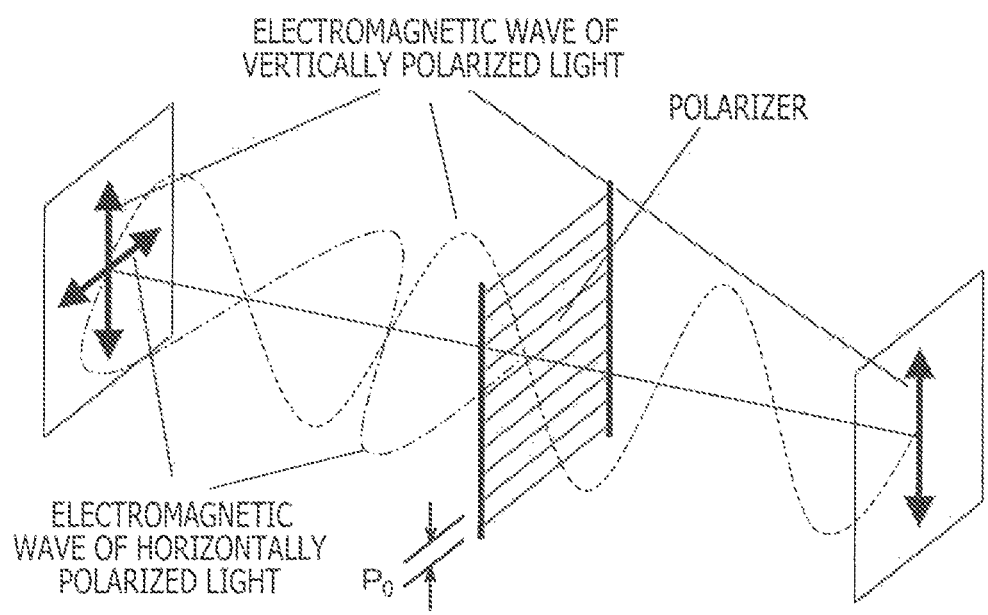

In addition, in Examples, the wire grid polarizer has been used exclusively for acquiring polarization information concerning the imaging element sensitive to visible light wavelength band; however, in the case where the imaging element is sensitive to infrared rays or ultraviolet rays, by enlarging or reducing the formation pitch $P_0$ of the line parts according to it, the wire grid polarizer can be mounted as a wire grid polarizer that functions in an arbitrary wavelength band. Further, in Examples, the wire grid polarizer has had a configuration in which the light reflection layer and the light absorbing layer in the stacked structure are spaced from each other by the insulating film (namely, a configuration in which the insulating film is formed over the whole part of a top surface of the light reflection layer and the light absorbing layer is formed over the whole part of a top surface of the insulating film); alternatively, however, a configuration may be adopted in which the insulating film is partly cut out, and the light reflection layer and the light absorbing layer are in contact with each other at the cutout of the insulating film. Specifically, as a schematic partial perspective view of a modification of the wire grid polarizer is illustrated in FIG. 63, the insulating film 52 is partly cut out, and the light reflection layer 51 and the light absorbing layer 53 are in contact with each other at the cutout 52a of the insulating film 52.

In addition, while the case in which the present disclosure is applied to a CMOS type solid-state imaging device in which unit pixels detecting an electric charge according to the quantity of incident light as a physical quantity are arranged in a matrix pattern has been taken as an example in describing Examples, the application of the present disclosure is not limited to the application to a CMOS type solid-state imaging device, but the present disclosure is may be applied also to a CCD type solid-state imaging device. In the latter case, the signal charge is transferred in the vertical direction by a vertical transfer register, is transferred in the horizontal direction by a horizontal transfer register, and is amplified, whereby a pixel signal (image signal) is outputted. In addition, the application is not limited generally to a column-type solid-state imaging device in which pixels are formed in a two-dimensional matrix and column signal processing circuits are arranged on a pixel column basis. Further, in some cases, the selection transistor can be omitted.

Further, the imaging element of the present disclosure is applicable not only to a solid-state imaging device that picks up an image by detecting the distribution of the quantity of visible light being incident but also to solid-state imaging devices that pick up as an image the distribution of the quantity of infrared rays, X-rays or particles or the like being incident. Broadly speaking, the imaging element of the present disclosure is applicable generally to solid-state imaging devices (physical quantity distribution detection devices), such as a fingerprint sensor, that pick up an image by detecting the distribution of a physical quantity such as pressure or capacitance.

Further, the application of the imaging device of the present disclosure is not limited to a solid-state imaging device that sequentially scans each unit pixel in an imaging region and reads out a pixel signal from each unit pixel. The imaging device of the present disclosure is applicable also to an X-Y address type solid-state imaging device that selects arbitrary pixels on a pixel basis and reads out a pixel signal on a pixel basis from the selected pixels. The solid-state imaging device may be in a form of being formed as one chip, or in a modular form having an imaging function in which an imaging region is packaged collectively with a drive circuit or an optical system.

In addition, the imaging element of the present disclosure is not limited in application to a solid-state imaging device, but is applicable also to an imaging device. Here, the imaging device refers to camera systems such as digital still camera or video camera, and electronic apparatuses having an imaging function, such as mobile phones. The imaging device may be in a modular form that is mounted on an electronic apparatus, namely, the imaging device may be a camera module.

Figure 61:
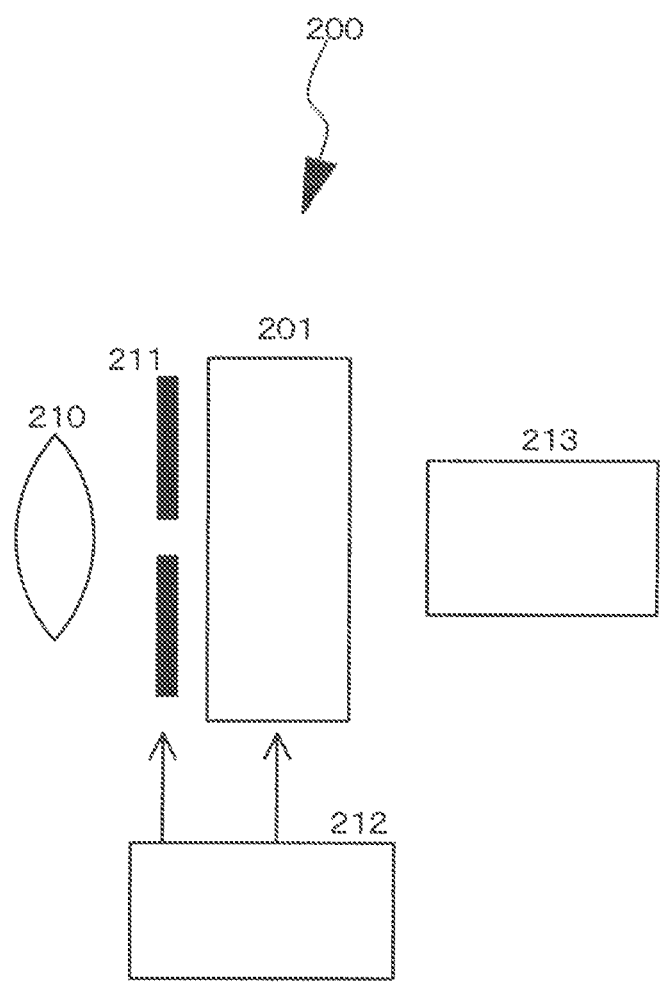
FIG. 61 is a conceptual diagram of an example in which the solid-state imaging device of the present disclosure is used for an electronic apparatus (camera).

An example in which a solid-state imaging device 201 of the present disclosure is used in an electronic apparatus (camera) 200 is illustrated as a conceptual diagram in FIG. 61. The electronic apparatus 200 includes a solid-state imaging device 201, an optical lens 210, a shutter device 211, a drive circuit 212, and a signal processing circuit 213. The optical lens 210 focuses image light (incident light) from a subject onto an imaging surface of the solid-state imaging device 201. By this, a signal charge is accumulated in the solid-state imaging device 201 for a predetermined period. The shutter device 211 controls light illumination period and light shielding period for the solid-state imaging device 201. The drive circuit 212 supplies drive signals for controlling a transfer operation and the like of the solid-state imaging device 201 and a shutter operation of the shutter device 211. Signal transfer in the solid-state imaging device 201 is conducted according to a drive signal (timing signal) supplied from the drive circuit 212. The signal processing circuit 213 performs various signal processing. A video signal having undergone the signal processing is stored in a storage medium such as a memory, or is outputted to a monitor. In such an electronic apparatus 200, refinement of pixel size in the solid-state imaging device 201 and enhancement of transfer efficiency can be achieved, and, therefore, an electronic apparatus 200 enhanced in pixel characteristics can be obtained. The electronic apparatus 200 to which the solid-state imaging device 201 is applicable is not limited to a camera, but the solid-state imaging device 201 is applicable to digital still cameras and an imaging device such as a camera module for mobile apparatuses such as mobile phones.

Note that the present disclosure can take the following configurations.

[A01] «Imaging Element»

An imaging element including:
a photoelectric conversion section provided in a substrate;
a polarizer formed over the photoelectric conversion section, with a single ground insulating layer interposed therebetween; and
a light shielding section formed on an upper side of a peripheral region around the photoelectric conversion section.

[A02]
The imaging element as described in the above paragraph [A01], further including:
a second light shielding section extending inside the substrate along a thickness direction of the substrate from a front surface of the substrate in the peripheral region around the photoelectric conversion section.

[A03]
The imaging element as described in the above paragraph [A02], further including:
a third light shielding section formed in the substrate in parallel to the front surface of the substrate from a tip portion of the second light shielding section extending inside the substrate.

[A04]
The imaging element as described in any one of the above paragraphs [A01] to [A03], in which the polarizer includes a wire grid polarizer.

[A05]
The imaging element as described in the above paragraph [A04],
in which a second protective film is formed between the wire grid polarizer and a protective film, and
let a refractive index of a material constituting the protective film be $n_1$ and let a refractive index of a material constituting the second protective film be $n_2$, then $$n_1 > n_2$$

is satisfied.

[A06]
The imaging element as described in the above paragraph [A05], in which the protective film includes SiN, and the second protective film includes $SiO_2$ or SiON.

[A07]
The imaging element as described in the above paragraph [A06], in which a third protective film is formed at least on a side surface of a line part facing a space part of the wire grid polarizer.

[A08]
The imaging element as described in any one of the above paragraphs [A04] to [A07], further including:
a frame section surrounding the wire grid polarizer,
in which the frame section and the line part of the wire grid polarizer are connected to each other, and
the frame section has the same structure as that of the line part of the wire grid polarizer.

[A09]
The imaging element as described in any one of the above paragraphs [A04] to [A08], in which the line part of the wire grid polarizer includes a stacked structure in which a light reflection layer including a first conductive material, an insulating film, and a light absorbing layer including a second conductive material are stacked from the photoelectric conversion section side.

[A10]
The solid-state imaging device as described in the above paragraph [A09], in which a ground film is formed between the photoelectric conversion section and the light reflection layer.

[A11]
The imaging element as described in the above paragraph [A09] or [A10], in which an extension portion of the light reflection layer is electrically connected to the substrate or the photoelectric conversion section.

[A12]
The solid-state imaging device as described in any one of the above paragraphs [A09] to [A11], in which the insulating film is formed over whole part of a top surface of the light reflection layer, and the light absorbing layer is formed over whole part of a top surface of the insulating film.

[A13]
The imaging element as described in any one of the above paragraphs [A01] to [A12], in which the light shielding section formed on the upper side of the peripheral region around the photoelectric conversion section includes an extension portion of the polarizer.

[A14]
The imaging element as described in any one of the above paragraphs [A01] to [A13], in which the light shielding section formed on the upper side of the peripheral region around the photoelectric conversion section includes a metallic film formed on the ground insulating layer or on an upper side of the ground insulating layer.

[A15]

The imaging element as described in any one of the above paragraphs [A01] to [A14], in which the light shielding section formed on the upper side of the peripheral region around the photoelectric conversion section is formed in a region of the ground insulating layer over the peripheral region around the photoelectric conversion section, and includes an insulating material having a refractive index smaller than a refractive index of a material constituting the ground insulating layer.

[A16]

The imaging element as described in any one of the above paragraphs [A01] to [A15], in which a material constituting a second light shielding section includes a metal, an alloy, a metallic nitride, a metallic silicide or a non-light-transmitting resin.

[A17]

The imaging element as described in any one of the above paragraphs [A01] to [A16], in which a material constituting a third light shielding section includes a metal, an alloy, a metallic nitride, a metallic silicide or a non-light-transmitting resin.

[A18]

The imaging element as described in any one of the above paragraphs [A01] to [A15], in which a material constituting a second light shielding section and a material constituting a third light shielding section are the same material.

[A19]

The imaging element as described in any one of the above paragraphs [A01] to [A18], in which the polarizer includes four polarizer segments of a first polarizer segment, a second polarizer segment, a third polarizer segment and a fourth polarizer segment arranged in a 2×2 pattern, a polarization orientation in which light is to be transmitted by the first polarizer segment is α degrees, a polarization orientation in which light is to be transmitted by the second polarizer segment is (α+45) degrees, a polarization orientation in which light is to be transmitted by the third polarizer segment is (α+90) degrees, and a polarization orientation in which light is to be transmitted by the fourth polarizer segment is (α+135) degrees.

[A20]

The imaging element as described in any one of the above paragraphs [A01] to [A19], in which a plurality of the photoelectric conversion sections includes a photoelectric conversion section sensitive to white light and a photoelectric conversion section sensitive to near infrared light.

[A21]

The imaging element as described in any one of the above paragraphs [A01] to [A19], in which a plurality of the photoelectric conversion sections includes a photoelectric conversion section sensitive to red light or green light or blue light and a photoelectric conversion section sensitive to near infrared light.

[A22]

The imaging element as described in any one of the above paragraphs [A01] to [A21], in which a color filter layer is disposed on a light incidence side as compared to the polarizer.

[A23]

The imaging element as described in any one of the above paragraphs [A01] to [A22], in which a photoelectric conversion section sensitive to red light or green light or blue light includes a stack of at least two kinds of photoelectric conversion sections selected from a group including a red light photoelectric conversion section sensitive to red light, a green light photoelectric conversion section sensitive to green light and a blue light photoelectric conversion section sensitive to blue light.

[A24]

The imaging element as described in any one of the above paragraphs [A01] to [A23], in which the substrate is formed with a memory section that is connected to the imaging element and that temporarily stores an electric charge generated in the imaging element.

[B01] «Solid-State Imaging Device»

A solid-state imaging device including:

a plurality of imaging elements arranged in a two-dimensional matrix, in which each of the imaging elements includes a photoelectric conversion section provided in a substrate, a polarizer formed over the photoelectric conversion section, with a single ground insulating layer interposed therebetween, and a light shielding section formed on an upper side of a peripheral region around the photoelectric conversion section.

[B02] 140 Solid-State Imaging Device»

A solid-state imaging device including:

a plurality of imaging elements arranged in a two-dimensional matrix, in which each of the imaging elements includes the imaging element as described in any one of the above paragraphs [A01] to [A24].

REFERENCE SIGNS LIST

10 . . . Solid-state imaging device
10' . . . Imaging element unit
11 . . . Effective pixel region
12 . . . Optical black pixel region (OPB)
13 . . . Peripheral region
14 . . . On-chip microlens
15 . . . Sub on-chip microlens (OPA)
16, 16R, 16G, 16B . . . Wavelength selecting means (color filter layer)
16W . . . Transparent resin layer
17 . . . Pad section
20, $20_1$, $20_2$, $20_3$, $20_4$ . . . Imaging element (Photoelectric conversion element)
20' . . . Stacked type imaging element
21, 21R, 21G, 21B, 21W, 21iR . . . Photoelectric conversion section
21a . . . Upper-layer photoelectric conversion section
21b . . . Lower-layer photoelectric conversion section
21' . . . Peripheral region around photoelectric conversion section
$TR_{mem}$ . . . Memory section
22, 24 . . . Gate section constituting memory section
23 . . . High-concentration impurity region constituting memory section
25 . . . Element separation region
26 . . . Gate section of transfer transistor $TR2_{trs}$
26A . . . Transfer channel
26C . . . Region of semiconductor substrate in vicinity of gate section of transfer transistor $TR2_{trs}$
30 . . . Substrate (Silicon semiconductor substrate)
30A . . . Front surface of substrate (silicon semiconductor substrate)
30a . . . Semiconductor substrate
30a' . . . Top surface of semiconductor substrate
30b . . . Semiconductor layer
31 . . . Ground insulating layer 32 . . . Interlayer insulating layer
$32_1, 32_2, 32_3, 33_4$ . . . Interlayer insulating layer
33 . . . First planarization film, second planarization film and third planarization film
34 . . . Wiring section
35 . . . Wiring layer
36 . . . Contact hole
37 . . . Contact pad section
41A, 41B, 41C, 41D . . . Light shielding section (First light shielding section)
42 . . . Second light shielding section
43 . . . Third light shielding section
50, $50_1, 50_2, 50_3, 50_4$, 50R, 50G, 50B, $50W_1, 50W_2, 50W_3, 50W_4$ . . . Polarizer (Wire grid polarizer)
$50'W_1, 50'W_2, 50'W_3, 50'W_4$ . . . Polarizer segment
51 . . . Light reflection layer
51A . . . Light reflection layer forming layer
52 . . . Insulating film
52A . . . Insulating film forming layer
$52a$ . . . Cutout of insulating film
53 . . . Light absorbing layer
53A . . . Light absorbing layer forming layer
54 . . . Line part (Stacked structure)
55 . . . Space part (Gap between stacked structure and stacked structure)
56 . . . Protective film
57 . . . Second protective film
58 . . . Third protective film
59 . . . Frame section
59' . . . Light shielding region
59" . . . Contact hole
60 . . . Semiconductor substrate
60A . . . First surface (Front surface) of semiconductor substrate
60B . . . Second surface (Back surface) of semiconductor substrate
61 . . . Photoelectric conversion section
62 . . . p-type semiconductor region or $p^+$ layer
63, 64 . . . $p^+$ layer
65 . . . Oxide film
66 . . . p-type semiconductor region
67 . . . Interlayer insulating layer
100 . . . Solid-state imaging device
101 . . . Imaging element (Photoelectric conversion element)
111 . . . Imaging region (Effective pixel region)
112 . . . Vertical drive circuit
113 . . . Column signal processing circuit
114 . . . Horizontal drive circuit
115 . . . Output circuit
116 . . . Drive control circuit
117 . . . Signal line (Data output line)
118 . . . Horizontal signal line
200 . . . Electronic apparatus (Camera)
201 . . . Solid-state imaging device
210 . . . Optical lens
211 . . . Shutter device
212 . . . Drive circuit
213 . . . Signal processing circuit
FD . . . Floating diffusion layer
$TR_{mem}$ . . . Memory section
$TR_{trs}$ . . . Transfer transistor
$TR_{rst}$ . . . Reset transistor
$TR_{amp}$ . . . Amplifying transistor
$TR_{sel}$ . . . Selection transistor
$V_{DD}$ . . . Power source
MEM . . . Memory selection line
TG . . . Transfer gate line
RST . . . Reset line
SEL . . . Selection line
VSL . . . Signal line (Data output line)

The invention claimed is:

1. An imaging element comprising:
 a photoelectric conversion section provided in a substrate;
 a polarizer formed over the photoelectric conversion section, with a single ground insulating layer interposed therebetween; and
 a light shielding section formed on an upper side of a peripheral region around the photoelectric conversion section,
 wherein the light shielding section formed on the upper side of the peripheral region around the photoelectric conversion section:
  is formed in a region of the ground insulating layer over the peripheral region around the photoelectric conversion section, and
  includes an insulating material having a refractive index smaller than a refractive index of a material constituting the ground insulating layer.

2. The imaging element according to claim 1, further comprising:
 a second light shielding section extending inside the substrate along a thickness direction of the substrate from a front surface of the substrate in the peripheral region around the photoelectric conversion section.

3. The imaging element according to claim 2, further comprising:
 a third light shielding section formed in the substrate in parallel to the front surface of the substrate from a tip portion of the second light shielding section extending inside the substrate.

4. The imaging element according to claim 1, wherein the polarizer includes a wire grid polarizer.

5. The imaging element according to claim 1, wherein the light shielding section formed on the upper side of the peripheral region around the photoelectric conversion section includes an extension portion of the polarizer.

6. The imaging element according to claim 1, wherein the light shielding section formed on the upper side of the peripheral region around the photoelectric conversion section includes a metallic film formed on the ground insulating layer or on an upper side of the ground insulating layer.

7. The imaging element according to claim 1, wherein a material constituting a second light shielding section includes a metal, an alloy, a metallic nitride, a metallic silicide or a non-light-transmitting resin.

8. The imaging element according to claim 1, wherein a material constituting a third light shielding section includes a metal, an alloy, a metallic nitride, a metallic silicide or a non-light-transmitting resin.

9. The imaging element according to claim 1, wherein a material constituting a second light shielding section and a material constituting a third light shielding section are a same material.

10. A solid-state imaging device comprising:
 a plurality of imaging elements arranged in a two-dimensional matrix,
 wherein each of the imaging elements comprises the imaging element according to claim 1.

* * * * *